US012787217B2

(12) United States Patent
Yamaguchi et al.

(10) Patent No.: US 12,787,217 B2
(45) Date of Patent: Nov. 3, 2026

(54) ELECTRONIC DEVICE

(71) Applicant: DENSO CORPORATION, Kariya-city (JP)

(72) Inventors: Takuya Yamaguchi, Kariya-city (JP); Toshiaki Tanabe, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 266 days.

(21) Appl. No.: 18/793,174

(22) Filed: Aug. 2, 2024

(65) Prior Publication Data

US 2025/0081389 A1 Mar. 6, 2025

(30) Foreign Application Priority Data

Sep. 1, 2023 (JP) ................................ 2023-142446
Feb. 21, 2024 (JP) ................................ 2024-024796

(51) Int. Cl.
*H05K 7/20* (2006.01)
*H05K 1/02* (2006.01)
(Continued)

(52) U.S. Cl.
CPC ....... *H05K 7/20254* (2013.01); *H05K 1/0218* (2013.01); *H05K 1/14* (2013.01); *H05K 1/181* (2013.01); *H05K 9/0032* (2013.01)

(58) Field of Classification Search
CPC .... H05K 7/20254; H05K 1/0218; H05K 1/14; H05K 1/181; H05K 9/0032; H05K 9/0024
See application file for complete search history.

(56) References Cited

U.S. PATENT DOCUMENTS 4,551,787 A * 11/1985 Mittal ................ H05K 7/20254 257/E23.098
4,628,407 A * 12/1986 August ................ H05K 1/0206 257/E23.101

(Continued)

FOREIGN PATENT DOCUMENTS

| | | | | |
|---|---|---|---|---|
| JP | 202164670 A | | 4/2021 | |
| WO | WO-9727728 A2 | * | 7/1997 | ......... B60R 16/0239 |
| WO | 2022192031 A1 | | 9/2022 | |

OTHER PUBLICATIONS

Kerner, Nikolaus; Ott, Reinhold; Vogl, Guenter, "Control Device, Especially for a Motor Vehicle", Jul. 31, 1997, Siemens Aktiengesellschaft, Entire Document (Translation of WO9727728). (Year: 1997).*

*Primary Examiner* — Stephen S Sul
(74) *Attorney, Agent, or Firm* — Posz Law Group, PLC

(57) ABSTRACT

An electronic device includes: a cooling plate having a through-hole; a first circuit board disposed on one surface of the cooling plate; a second circuit board disposed on a back surface of the cooling plate; a connector that electrically connects the first circuit board to the second circuit board through the through-hole; a shield wall disposed on the one surface to surround a first electronic component; and a shield lid disposed adjacent to the one surface. The first circuit board includes a ground conductor electrically connected to the cooling plate through the shield wall. The first electronic component is disposed inside an electromagnetic shield body including the cooling plate, the shield wall, the ground conductor, and the shield lid.

19 Claims, 36 Drawing Sheets

(51) Int. Cl.

| | |
|---|---|
| ***H05K 1/14*** | (2006.01) |
| ***H05K 1/18*** | (2026.01) |
| ***H05K 1/181*** | (2026.01) |
| ***H05K 9/00*** | (2006.01) |

(56) References Cited

U.S. PATENT DOCUMENTS

| | | | | |
|---|---|---|---|---|
| 4,884,168 | A * | 11/1989 | August | H05K 7/20254 174/15.1 |
| 5,343,359 | A * | 8/1994 | Morton | H05K 1/141 361/784 |
| 2011/0232864 | A1* | 9/2011 | Zaffetti | F28F 9/0246 165/80.4 |
| 2012/0212175 | A1* | 8/2012 | Sharaf | H05K 7/20872 220/592.01 |
| 2021/0337650 | A1* | 10/2021 | Bubon | A61B 6/037 |
| 2023/0232589 | A1* | 7/2023 | Sugahara | H05K 7/20154 361/697 |
| 2023/0413486 | A1* | 12/2023 | Reinhold | H05K 7/2039 |
| 2024/0040741 | A1* | 2/2024 | Schlotterbeck | H05K 7/20254 |

* cited by examiner

ELECTRONIC DEVICE

CROSS REFERENCE TO RELATED APPLICATION

This application is based on Japanese Patent Application No. 2023-142446 filed on Sep. 1, 2023 and Japanese Patent Application No. 2024-024796 filed on Feb. 21, 2024, the disclosures of which are incorporated herein by reference.

TECHNICAL FIELD

The disclosure herein relates to an electronic device.

BACKGROUND

An electronic device includes a cooling plate interposed between two circuit boards, as described in WO 2022/192031 A1 which is incorporated by reference as description of technical elements herein.

SUMMARY

According to an aspect of the present disclosure, an electronic device includes: a cooling plate having one surface, a back surface opposite to the one surface in a predetermined direction, and a through-hole that is open in the one surface and the back surface; a first circuit board disposed on the one surface and includes at least one first electronic component to oppose the one surface; a second circuit board disposed on the back surface and includes at least one second electronic component to oppose the back surface; a connector that electrically connects the first circuit board to the second circuit board through the through-hole; a shield wall disposed adjacent to the one surface to surround the first electronic component in a plan view of the predetermined direction; and a shield lid disposed adjacent to the one surface. The first circuit board includes a ground conductor provided to surround the first electronic component in the plan view to provide a reference potential, and the ground conductor is electrically connected to the cooling plate through the shield wall. The through-hole is provided outside the shield wall in the plan view. The shield lid is provided to enclose the ground conductor in the plan view, and is electrically connected to the cooling plate through the ground conductor and the shield wall. The first electronic component is disposed inside an electromagnetic shield body including the cooling plate, the shield wall, the ground conductor, and the shield lid.

According to another aspect of an electronic device includes: a cooling plate having one surface, a back surface opposite to the one surface in a predetermined direction, and a through-hole that is open in the one surface and the back surface; a first circuit board disposed on the one surface and includes at least one first electronic component to oppose the one surface; a second circuit board disposed on the back surface and includes at least one second electronic component to oppose the back surface; a connector that electrically connects the first circuit board to the second circuit board through the through-hole; a shield base disposed adjacent to the one surface; and a shield cover mounted on the first circuit board and disposed covering the first electronic component. The first circuit board includes a ground conductor provided to surround the first electronic component in a plan view of the predetermined direction to provide a reference potential, and the ground conductor is electrically connected to the shield base. The shield base is provided to enclose the ground conductor in the plan view. The shield cover is electrically connected to the shield base through the ground conductor, and the first electronic component is disposed inside an electromagnetic shield body including the shield base, the ground conductor, and the shield cover.

DESCRIPTION OF EMBODIMENTS

Figure 1:
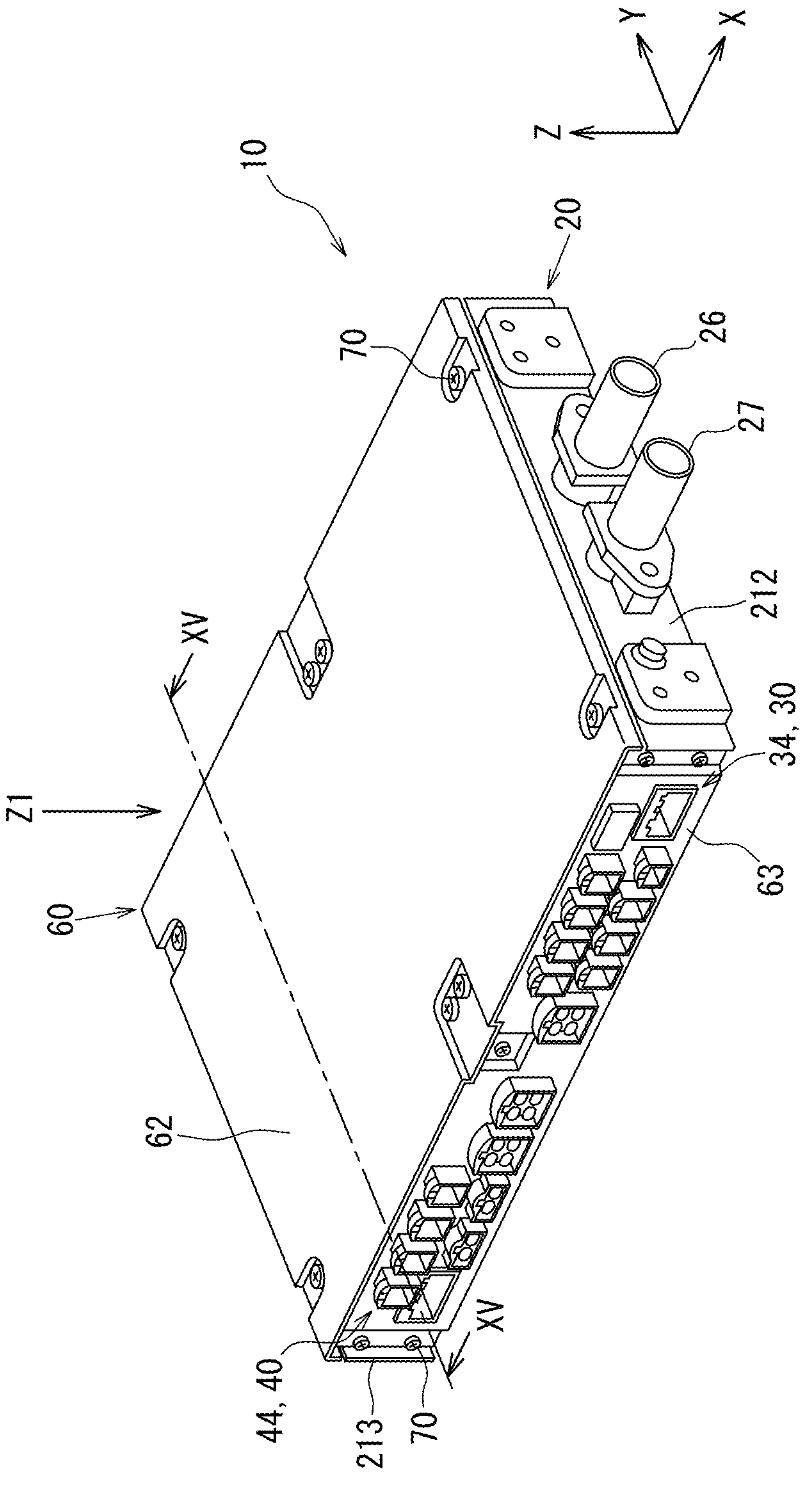
FIG. 1 is a perspective view illustrating an electronic device according to a first embodiment.

Structure of the two circuit boards is conceivable in which the two circuit boards are electrically connected through a through-hole provided in the cooling plate. In this case, noise of an electronic component provided in one of the circuit boards may affect an electronic component provided in the other of the circuit boards through the through-hole. In the viewpoint described above, or in another viewpoint not mentioned, the electronic device is required to be further improved.

The present disclosure provides an electronic device capable of suppressing an influence of noise between circuit boards.

According to an aspect of the present disclosure, an electronic device includes:

- a cooling plate having one surface, a back surface opposite to the one surface in a predetermined direction, and a through-hole that is open in the one surface and the back surface;
- a first circuit board disposed on the one surface and includes at least one first electronic component to oppose the one surface;
- a second circuit board disposed on the back surface and includes at least one second electronic component to oppose the back surface;
- a connector that electrically connects the first circuit board to the second circuit board through the through-hole;
- a shield wall disposed adjacent to the one surface to surround the first electronic component in a plan view of the predetermined direction; and
- a shield lid disposed adjacent to the one surface.

The first circuit board includes a ground conductor provided to surround the first electronic component in the plan view to provide a reference potential, and the ground conductor is electrically connected to the cooling plate through the shield wall. The through-hole is provided outside the shield wall in the plan view. The shield lid is provided to enclose the ground conductor in the plan view, and is electrically connected to the cooling plate through the ground conductor and the shield wall. The first electronic component is disposed inside an electromagnetic shield body including the cooling plate, the shield wall, the ground conductor, and the shield lid.

According to an electronic device disclosed, the shield wall is provided such that the first electronic component is located inside the shield wall and the through-hole is located outside the shield wall. The first electronic component is disposed inside the shield wall, i.e., inside the electromagnetic shield body. The electromagnetic shield body can restrict noise generated by the first electronic component from acting on a second electronic component through the through-hole. The electromagnetic shield body can restrict noise generated by the second electronic component from acting on the first electronic component through the through-hole. Thus, influence of noise between the circuit boards can be restricted.

According to another aspect of an electronic device includes:

- a cooling plate having one surface, a back surface opposite to the one surface in a predetermined direction, and a through-hole that is open in the one surface and the back surface;
- a first circuit board disposed on the one surface and includes at least one first electronic component to oppose the one surface;
- a second circuit board disposed on the back surface and includes at least one second electronic component to oppose the back surface;
- a connector that electrically connects the first circuit board to the second circuit board through the through-hole;
- a shield base disposed adjacent to the one surface; and
- a shield cover mounted on the first circuit board and disposed covering the first electronic component.

The first circuit board includes a ground conductor provided to surround the first electronic component in a plan view of the predetermined direction to provide a reference potential, and the ground conductor is electrically connected to the shield base. The shield base is provided to enclose the ground conductor in the plan view. The shield cover is electrically connected to the shield base through the ground conductor, and the first electronic component is disposed inside an electromagnetic shield body including the shield base, the ground conductor, and the shield cover.

According to the electronic device, the shield cover of the electromagnetic shield body is mounted on the first circuit board. Thus, the first electronic component is located inside of the shield cover, that is, inside of the electromagnetic shield body. Therefore, noise generated by the first electronic component can be restricted from affecting the second electronic component through the through-hole. Further, noise generated by the second electronic component can be restricted from affecting the first electronic component through the through-hole. Thus, influence of noise between the circuit boards can be restricted.

Hereinafter, embodiments will be described with reference to drawings. Corresponding components in each embodiment may be denoted by identical reference numerals to eliminate duplicated description. When only a part of a configuration is described in each embodiment, the configuration includes another part to which a configuration of another embodiment described ahead can be applied. Additionally, combinations of configurations are applicable, the combinations including not only a combination of configurations clarified in descriptions of respective embodiments, but also a combination of parts of configurations of a plurality of embodiments, the parts being not clarified and the combination causing no problem.

First Embodiment

First, a schematic configuration of an electronic device will be described. The electronic device may be referred to as an electronic control unit (ECU). The ECU is an abbreviation for Electronic Control Unit. The electronic device may be mounted on a moving body, for example. Examples of the moving object include a vehicle, a flying object, a ship, a construction machine, and an agricultural machine. The electronic device of the present embodiment is mounted on a vehicle, for example.

Electronic Device

Figure 2:
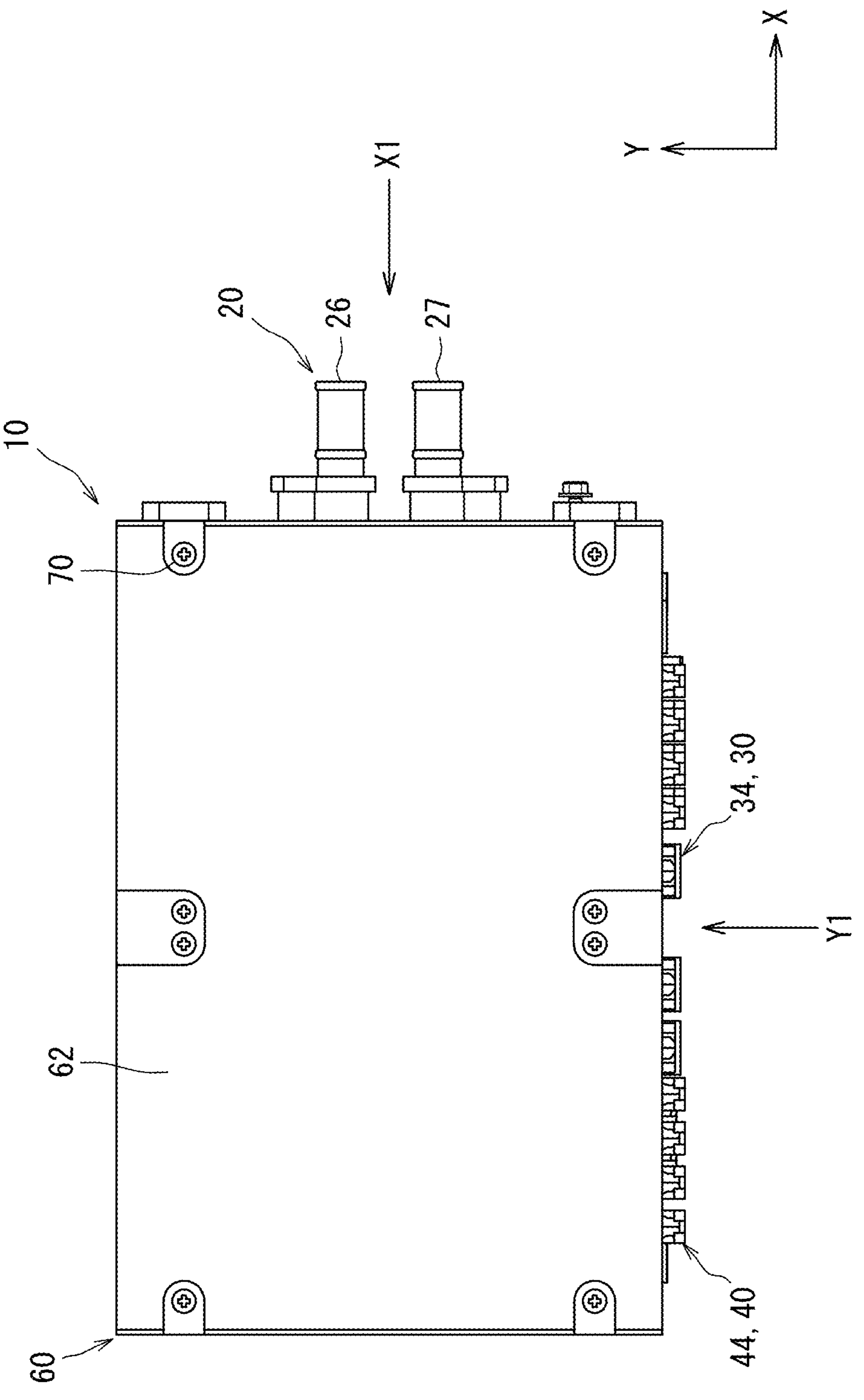
FIG. 2 is a plan view viewed from a Z1 direction illustrated in FIG. 1.
Figure 3:
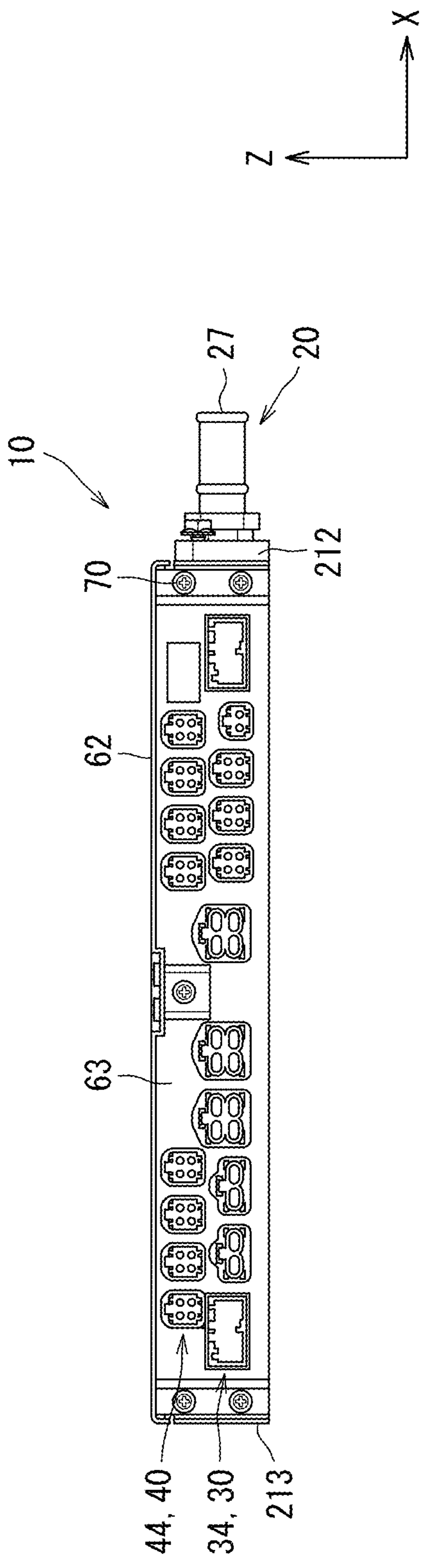
FIG. 3 is a plan view viewed from a Y1 direction illustrated in FIG. 2.
Figure 4:
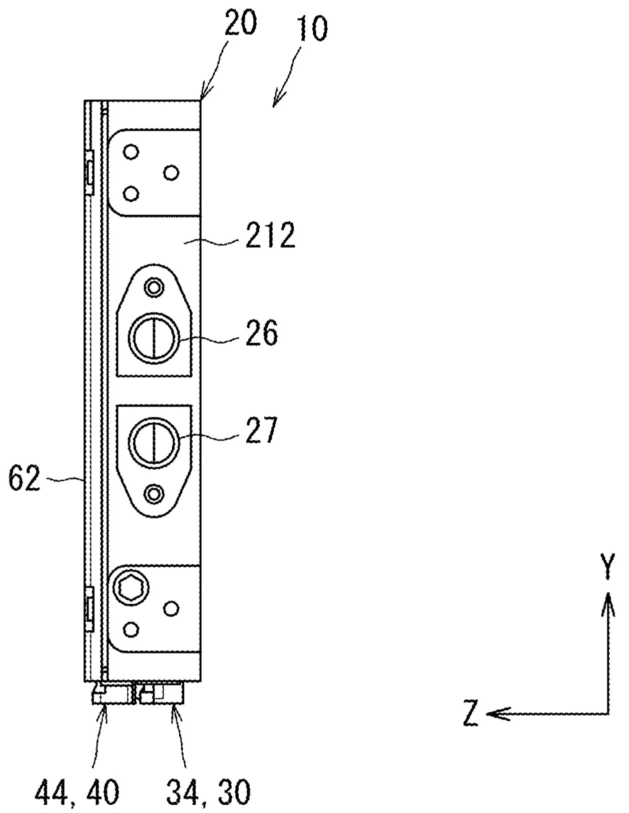
FIG. 4 is a plan view viewed from an X1 direction illustrated in FIG. 2.
Figure 5:
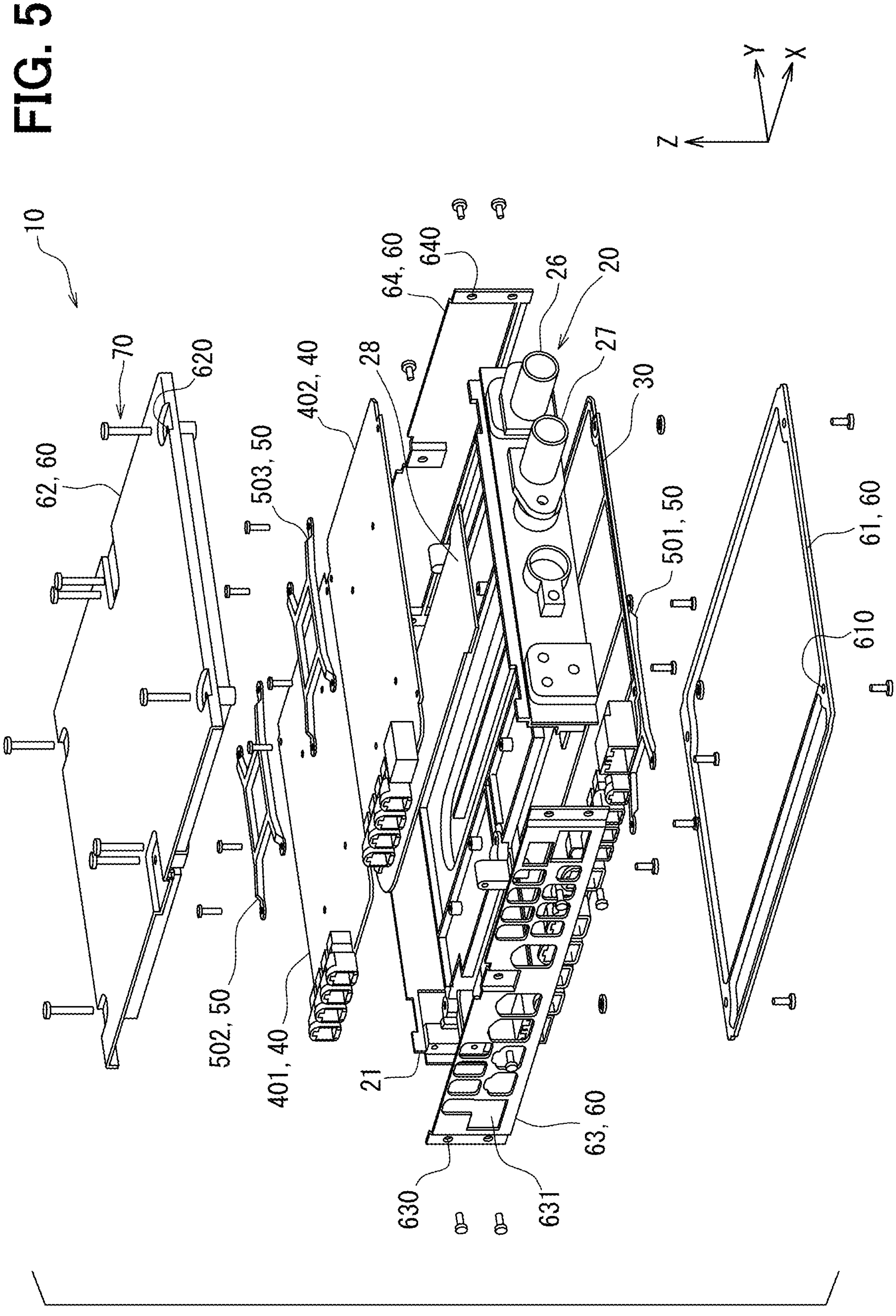
FIG. 5 is an exploded perspective view of an electronic device.

FIG. 1 is a perspective view illustrating an example of the electronic device. FIG. 2 is a plan view of the electronic device as viewed from a Z1 direction illustrated in FIG. 1. FIG. 3 is a plan view of the electronic device as viewed from a Y1 direction illustrated in FIG. 2. FIG. 4 is a plan view of the electronic device as viewed from an X1 direction illustrated in FIG. 2. FIG. 5 is an exploded perspective view of the electronic device. For convenience, FIG. 5 does not illustrate a gasket and a TIM. The TIM is an abbreviation for Thermal Interface Material.

Hereinafter, a plate thickness direction of a cooling plate (body part) is referred to as a Z direction. One direction orthogonal to the Z direction is referred to as an X direction, and a direction orthogonal to both the Z direction and the X direction is referred to as a Y direction. Unless otherwise specified, a shape in a plan view from the Z direction, in other words, a shape along an XY plane defined by the X direction and the Y direction is referred to as a planar shape. The plan view from the Z direction may be simply referred to as plan view. The Z direction corresponds to a predetermined direction.

As illustrated in FIGS. 1 to 5, an electronic device 10 includes a cooler 20, circuit boards 30, 40, a back plate 50, and a housing 60. The cooler 20 includes a cooling plate 21. The circuit board 30 is disposed on one surface of the cooling plate 21 in the Z direction. The circuit board 40 is disposed on a back surface of the cooling plate 21. The back plate 50 is disposed on a surface of each of the circuit boards 30, 40, the surface being opposite to a surface facing the cooling plate 21. The housing 60 constitutes at least a part of an outer shell (outer surface) of the electronic device 10.

As illustrated, the electronic device 10 has a substantially rectangular shape in the plan view seen in the Z direction. The electronic device 10 has a length in the Z direction, the length being shorter than a length in the X direction and a length in the Y direction. The electronic device 10 has a low height structure that is thin in the Z direction.

Cooler

Figure 6:
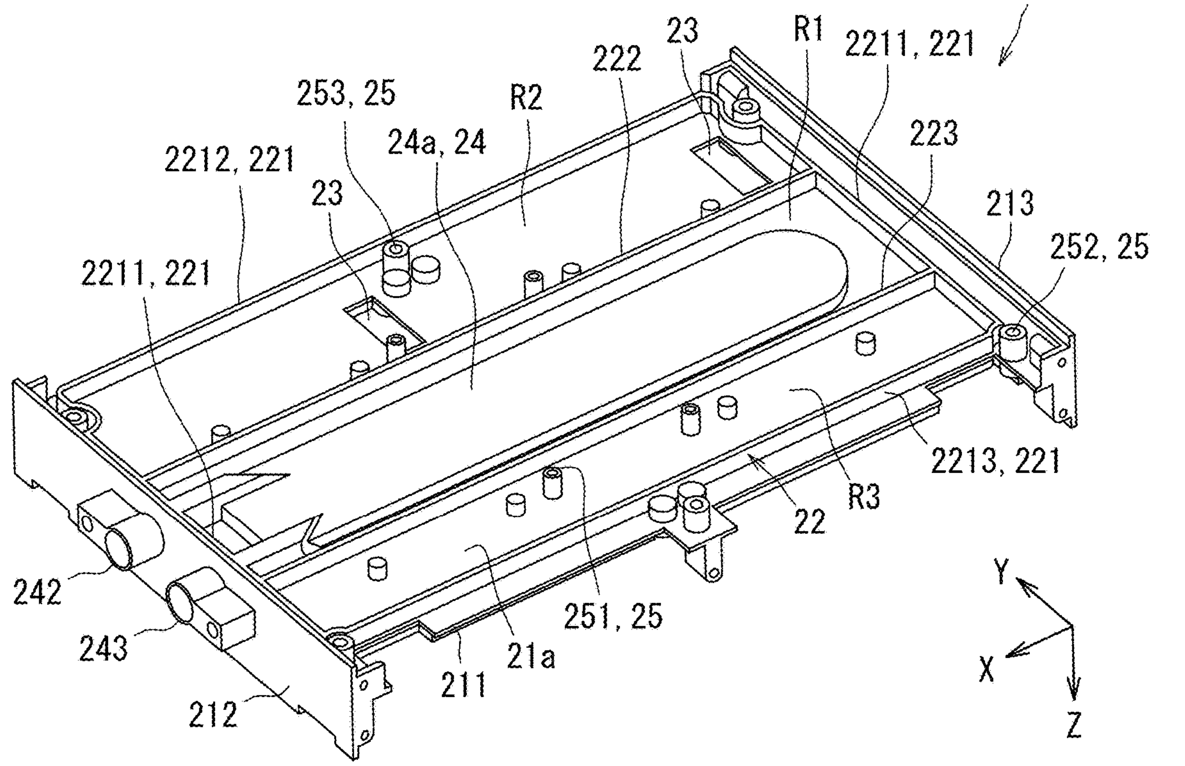
FIG. 6 is a perspective view illustrating one surface side of a cooling plate.
Figure 7:
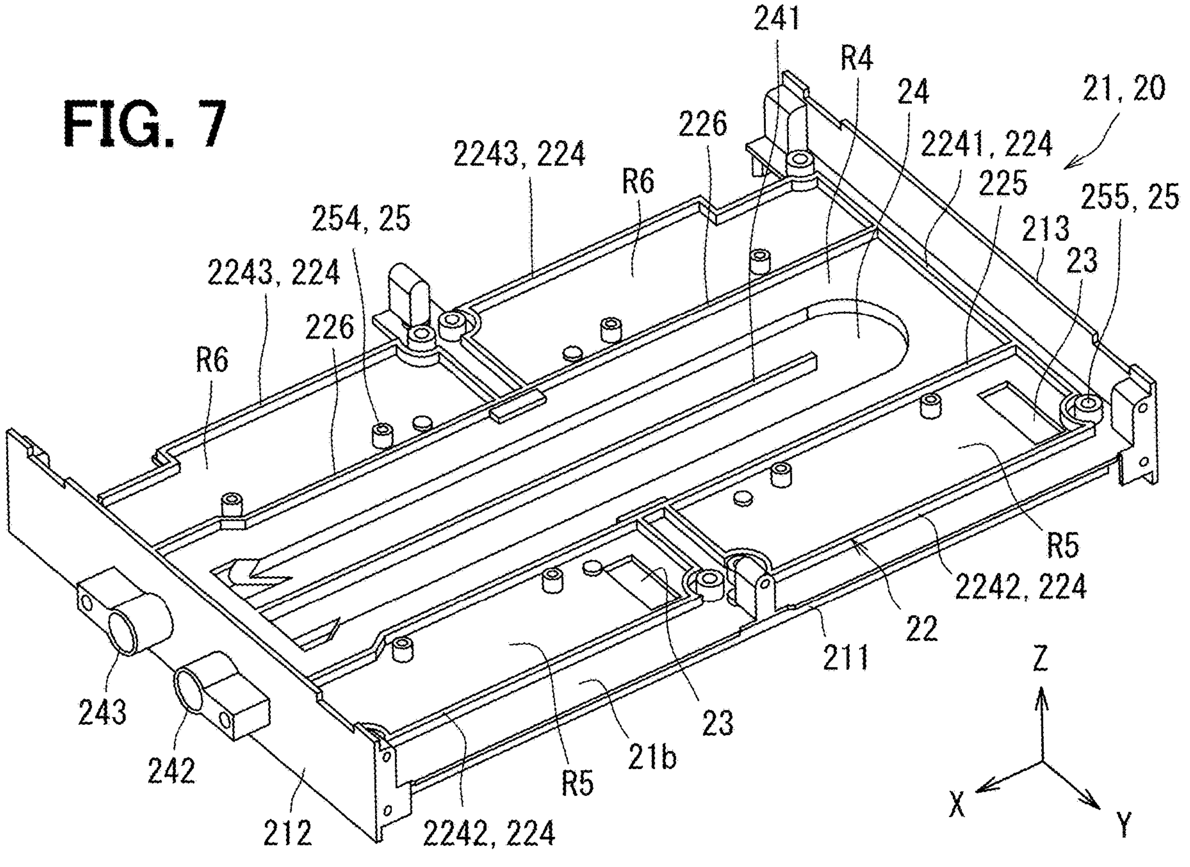
FIG. 7 is a perspective view illustrating a back surface side of a cooling plate.
Figure 8:
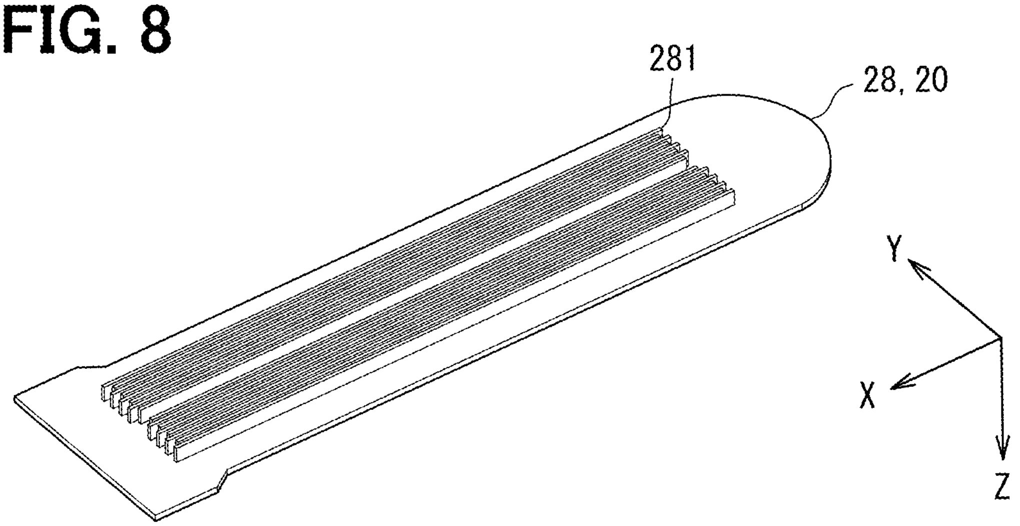
FIG. 8 is a perspective view illustrating a flow path cover.

FIGS. 6 and 7 are each a perspective view illustrating the cooling plate of the cooler. FIG. 6 illustrates one surface side of the cooling plate, and FIG. 7 illustrates a back surface side thereof. FIG. 8 is a perspective view illustrating a flow path cover.

As illustrated in FIGS. 1 to 8, the cooler 20 includes the cooling plate 21 described above. The cooling plate 21 includes a wall part 22, a through-hole 23, a flow path 24, and a fixing part 25. The cooler 20 includes an introduction pipe 26, a discharge pipe 27, and a flow path cover 28 in addition to the cooling plate 21.

The cooling plate 21 has one surface 21*a* and a back surface 21*b* opposite to the one surface 21*a* in the Z direction. The cooling plate 21 cools the circuit board 30 disposed on the one surface 21*a* and the circuit board 40 disposed on the back surface 21*b*. The cooling plate 21 cools electronic components mounted on the circuit boards 30, 40, the electronic components generating a large amount of heat. The cooling plate 21 is made of a metal material such as aluminum.

The cooling plate 21 includes a body part 211 and side plate parts 212, 213. The one surface 21*a* is one surface of the body part 211, and the back surface 21*b* is a back surface of the body part 211. The body part 211 has a plate thickness direction in the Z direction. The body part 211 has a substantially rectangular shape in the plan view with a longitudinal direction in the X direction. In the X direction, the side plate part 212 is connected to one of ends of the body part 211, and the side plate part 213 is connected to the other of the ends of the body part 211. The side plate parts 212, 213 each have a plate thickness direction in the X direction. The side plate parts 212, 213 each have a substantially rectangular shape with a longitudinal direction in the Y direction in the plan view from the X direction. The side plate parts 212, 213 are each connected to the body part 211 at an intermediate position in the Z direction. The cooling plate 21 has a substantially H shape when viewed from the Y direction. The side plate parts 212,213 constitute an outer shell of the electronic device 10 together with the housing 60.

The wall part 22 has a predetermined height in the Z direction. As illustrated in FIG. 6, the wall part 22 includes wall parts 221, 222, 223 provided on the one surface 21*a*. The wall parts 221, 222, 223 each protrude from the one surface 21*a*. The wall part 221 is provided overlapping an outer peripheral edge part of the circuit board 30, specifically, a land 312 in the plan view. The wall part 221 is provided along an outer periphery of the body part 211. The wall part 221 has a ring shape forming a substantial rectangle in the plan view with a longitudinal direction in the X direction.

The wall parts 222, 223 each extend in the X direction. The wall part 222 is connected at one end to the wall part 221 on a side close to the side plate part 212, and at the other end to the wall part 221 on a side close to the side plate part 213. Similarly, the wall part 223 is connected at one end to the wall part 221 on the side close to the side plate part 212, and at the other end to the wall part 221 on the side close to the side plate part 213. The wall parts 222, 223 divide a region surrounded by the wall part 221. The wall part 221 includes a wall part 2211 located between the wall part 222 and the wall part 223, and wall parts 2212, 2213 being parts other than the wall part 2211. The wall parts 221, 222, 223 provide three divided regions R1, R2, R3.

The region R1 is surrounded by the wall parts 2211, the wall part 222, and the wall part 223. The wall part 2211, the wall part 222, and the wall part 223 are continuously and integrally provided, and have a ring shape forming a substantial rectangle in plan view with a longitudinal direction in the X direction. The region R2 is surrounded by the wall part 2212 and the wall part 222. The wall part 2212 and the wall part 222 are continuously and integrally provided, and have a ring shape forming a substantial rectangle in plan view with a longitudinal direction in the X direction. The region R3 is surrounded by the wall part 2213 and the wall part 223. The wall part 2213 and the wall part 223 are continuously and integrally provided, and have a ring shape forming a substantial rectangle in plan view with a longitudinal direction in the X direction. The three regions R1, R2, R3 are aligned in a lateral direction in the Y direction with the region R1 as the center.

As illustrated in FIG. 7, the wall part 22 includes wall parts 224, 225, 226 provided on the back surface 21*b*. The wall parts 224, 225, 226 each protrude from the back surface 21*b*. The wall part 224 is provided overlapping an outer peripheral edge part of the circuit board 40, specifically, a land 412 in plan view. Most of the wall part 224 is provided along the outer periphery of the body part 211. The electronic device 10 illustrated includes two circuit boards 40. The circuit boards 40 are disposed side by side in the X direction. Thus, a part of the wall part 224 extends in the Y direction from an intermediate position in the X direction and terminates at a connection position with the wall part 225, 226. The wall part 224 is not provided in a part overlapping the flow path 24 in plan view.

The wall parts 225, 226 each extend in the X direction. The wall part 225 is connected at one end to the wall part 224 on the side close to the side plate part 212, and at the other end to the wall part 224 on the side close to the side plate part 213. Similarly, the wall part 226 is connected at one end to the wall part 224 on the side close to the side plate part 212, and at the other end to the wall part 224 on the side close to the side plate part 213. The wall part 224 includes a wall part 2241 located between the wall part 225 and the wall part 226, and wall parts 2242, 2243 being parts other than the wall part 2241. The wall parts 224, 225, 226 provide three divided regions R4, R5, R6.

The region R4 is a region surrounded by the wall parts 2241, the wall part 225, and the wall part 226. The wall part 2241, the wall part 225, and the wall part 226 are continuously and integrally provided, and have a ring shape forming a substantial rectangle in plan view with a longitudinal direction in the X direction. The region R4 is provided in common for the two circuit boards 40. The region R5 is surrounded by the wall part 2242 and the wall part 225. The wall part 2242 and the wall part 225 are continuously and integrally provided, and have a ring shape forming a substantial rectangle in plan view with a longitudinal direction in the X direction. The wall part 22 provides two regions R5 corresponding to the two circuit boards 40. The two regions R5 are aligned in the X direction.

The region R6 is surrounded by the wall part 2243 and the wall part 226. The wall part 2243 and the wall part 226 are continuously and integrally provided, and have a ring shape forming a substantial rectangle in plan view with a longitudinal direction in the X direction. The wall part 22 provides two regions R6 corresponding to the two circuit boards 40. The two regions R6 are aligned in the X direction. The three regions R4, R5, R6 are aligned in the Y direction with the region R4 as the center.

The through-hole 23 is provided to electrically connect the circuit board 30 and the circuit board 40. The through-hole 23 passes through the body part 211 of the cooling plate 21 in the Z direction to be open to the one surface 21*a* and the back surface 21*b*. The cooling plate 21 includes two through-holes 23 corresponding to the two circuit boards 40. The through-hole 23 is provided in the region R2 on the one surface 21*a*, and is provided in the region R5 on the back surface 21*b*.

The flow path 24 is provided overlapping at least a heat generating component in plan view to effectively cool the circuit boards 30, 40, especially the heat generating component. The flow path 24 extends in a direction in which the two circuit boards 40 are aligned, i.e., extends along the X direction. The flow path 24 is provided overlapping a heat generating component of the circuit board 30 and heat generating components of the two circuit boards 40 in plan view. The flow path 24 is provided in the region R4 on the back surface 21*b*. The flow path 24 is provided being recessed toward the one surface 21*a*. The flow path 24 includes a bottom part 24*a* located in the region R1 on the one surface 21*a*. The bottom part 24*a* has a height lower than a height of the wall part 22 on the one surface 21*a*.

The flow path 24 has a folded structure. The flow path 24 is separated by a partition wall 241 extending in the X direction and has a substantially U-shaped plane. The cooling plate 21 including the partition wall 241 allows a refrigerant to flow to near the side plate part 213 in the X direction. The side plate part 212 is provided with an introduction part 242 of a refrigerant and a discharge part 243 thereof. The introduction part 242 and the discharge part 243 passes through the side plate part 212. The refrigerant introduced from the introduction part 242 flows through the flow path 24 from the side plate part 212 toward the side plate part 213. The refrigerant returned flows through the flow path 24 from the side plate part 213 toward the side plate part 212 to be discharged through the discharge part 243. Available examples of the refrigerant include a phase-changing refrigerant such as water or ammonia, and a non-phase-changing refrigerant such as ethylene glycol.

The introduction pipe 26 is attached to the introduction part 242 of the cooling plate 21. The discharge pipe 27 is attached to the discharge part 243. The introduction pipe 26 is for supplying a refrigerant to the cooler 20. The discharge pipe 27 is for discharging the refrigerant from the cooler 20. Attachment positions of the introduction pipe 26 and the discharge pipe 27 are not particularly limited. The introduction pipe 26 and the discharge pipe 27 may be attached to a common surface or may be attached to respective surfaces different from each other. The electronic device 10 exemplified includes the introduction pipe 26 and the discharge pipe 27 that are attached to the side plate part 212.

The flow path cover 28 is a member covering the flow path 24. The flow path cover 28 is made of a metal material such as aluminum as with cooling plate 21. The flow path cover 28 has a peripheral edge part that is joined liquid-tightly to a peripheral part of the flow path 24 in the body part 211 of the cooling plate 21. The flow path cover 28 is provided on its surface with a plurality of fins 281, the surface facing the cooling plate 21. Each of the fins 281 has a predetermined height in the Z direction and extends in the X direction. The plurality of fins 281 is aligned in the Y direction. The fins 281 are provided to increase a contact area with the refrigerant, and enhance heat exchange with the refrigerant, i.e., cooling efficiency.

The fixing part 25 of the cooling plate 21 serves to fix another element of the electronic device 10 to the cooling plate 21. The fixing part 25 is a boss provided with a screw hole, for example. The fixing part 25 includes fixing parts 251, 252, 253 provided on the one surface 21*a*. The fixing part 251 is for screwing the back plate 50 (501) corresponding to the circuit board 30 and the circuit board 30. Four fixing parts 251 are provided outside the region R1. Two of the fixing parts 251 are provided side by side in the X direction in the region R2, and the other two of the fixing parts 251 are provided side by side in the X direction in the region R3. The four fixing parts 251 are provided near the center of the cooling plate 21 in the X direction.

The fixing part 252 is for screwing a cover 61 and the circuit board 30. Four fixing parts 252 are provided near four respective corners of the body part 211. The fixing parts 252 are provided outside the wall part 22. The fixing part 253 is for screwing the circuit board 30. The fixing part 253 is provided near the center of the cooling plate 21 in the X direction. One of two fixing parts 253 is provided near the wall part 2212 in the region R2, and the other fixing part is provided near the wall part 2213 in the region R3.

The fixing part 25 includes fixing parts 254, 255 provided on the back surface 21*b*. The fixing part 254 is for screwing the back plate 50 (502,503) corresponding to the circuit board 40 and the circuit board 40 (401, 402). Eight fixing parts 254 are provided outside the region R4. Two fixing parts 254 are provided not only in each of two regions R5 but also in each of two regions R6. In each of the regions R5, R6, the two fixing parts 254 are aligned in the X direction. The fixing part 255 is for screwing a cover 62 and the circuit board 40. The fixing part 255 is provided outside the wall part 22. Four of eight fixing parts 255 are provided at respective positions overlapping four corners of a circuit board 401, and the other four are provided at respective positions overlapping four corners of a circuit board 402. The four fixing parts 255 are provided near four respective corners of the body part 211, and the other four fixing parts 255 are provided near the center of the cooling plate 21 in the X direction.

Circuit Board

Figure 9:
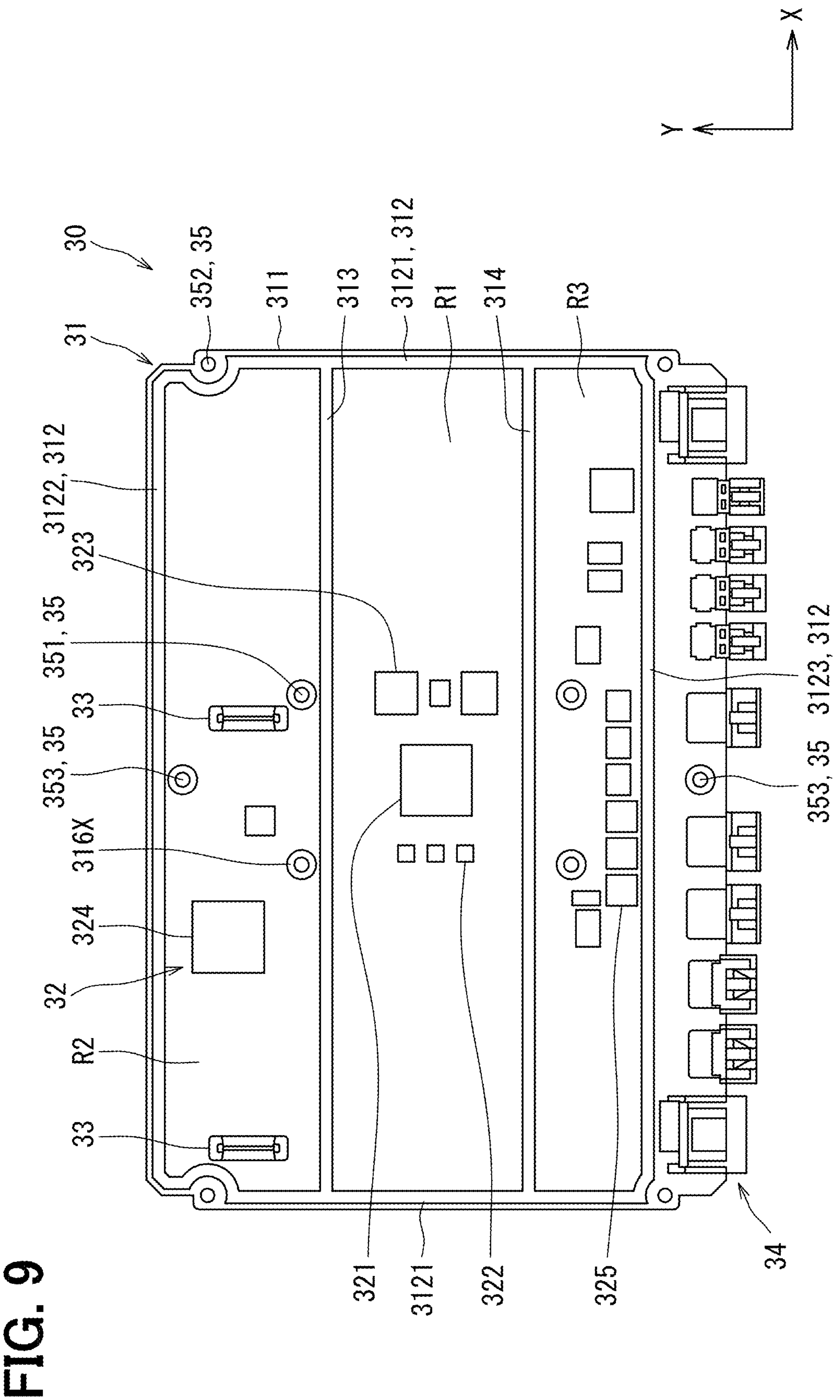
FIG. 9 is a plan view illustrating a circuit board disposed on one surface side.
Figure 10:
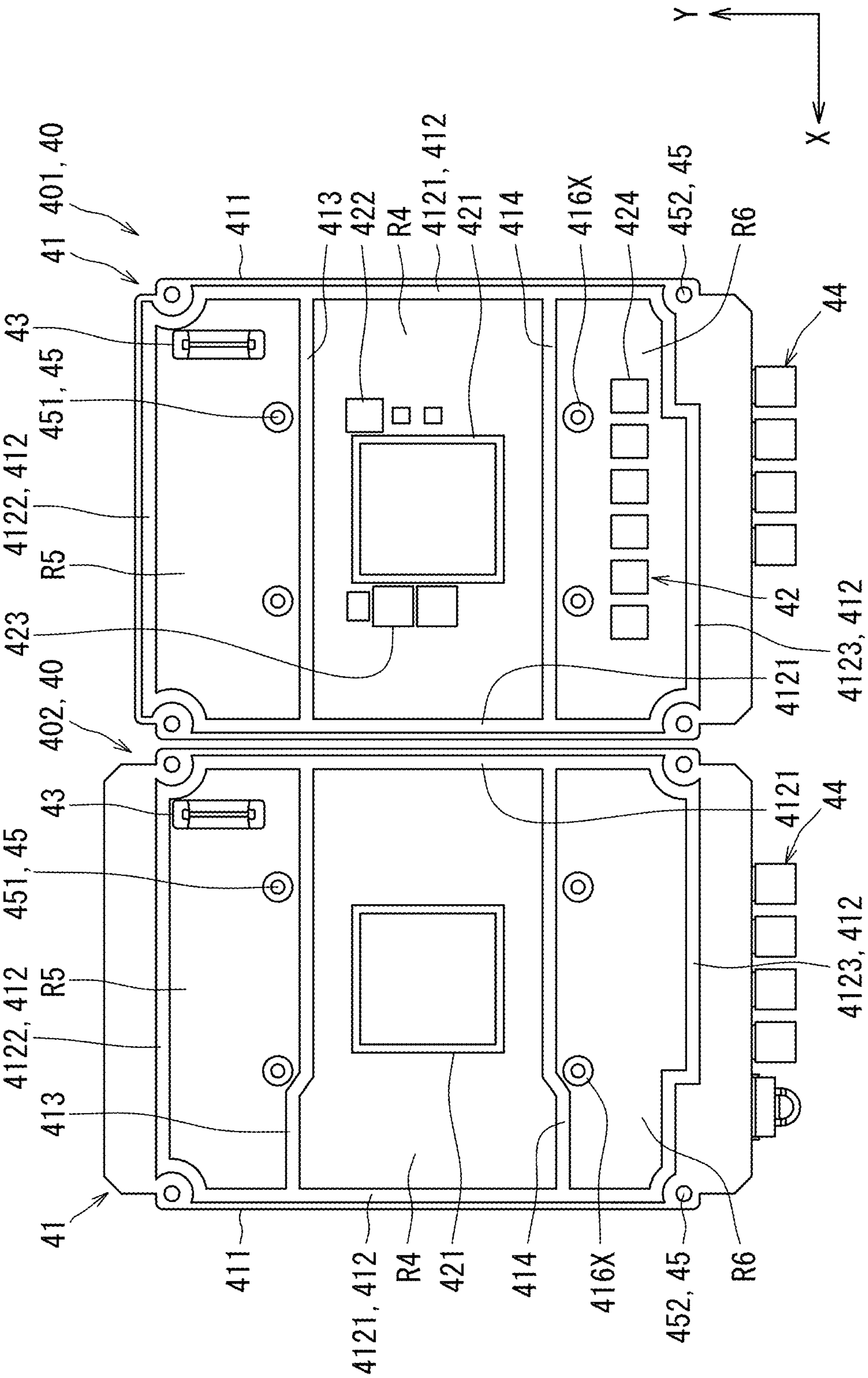
FIG. 10 is a plan view illustrating a circuit board disposed on a back surface side.
Figure 11:
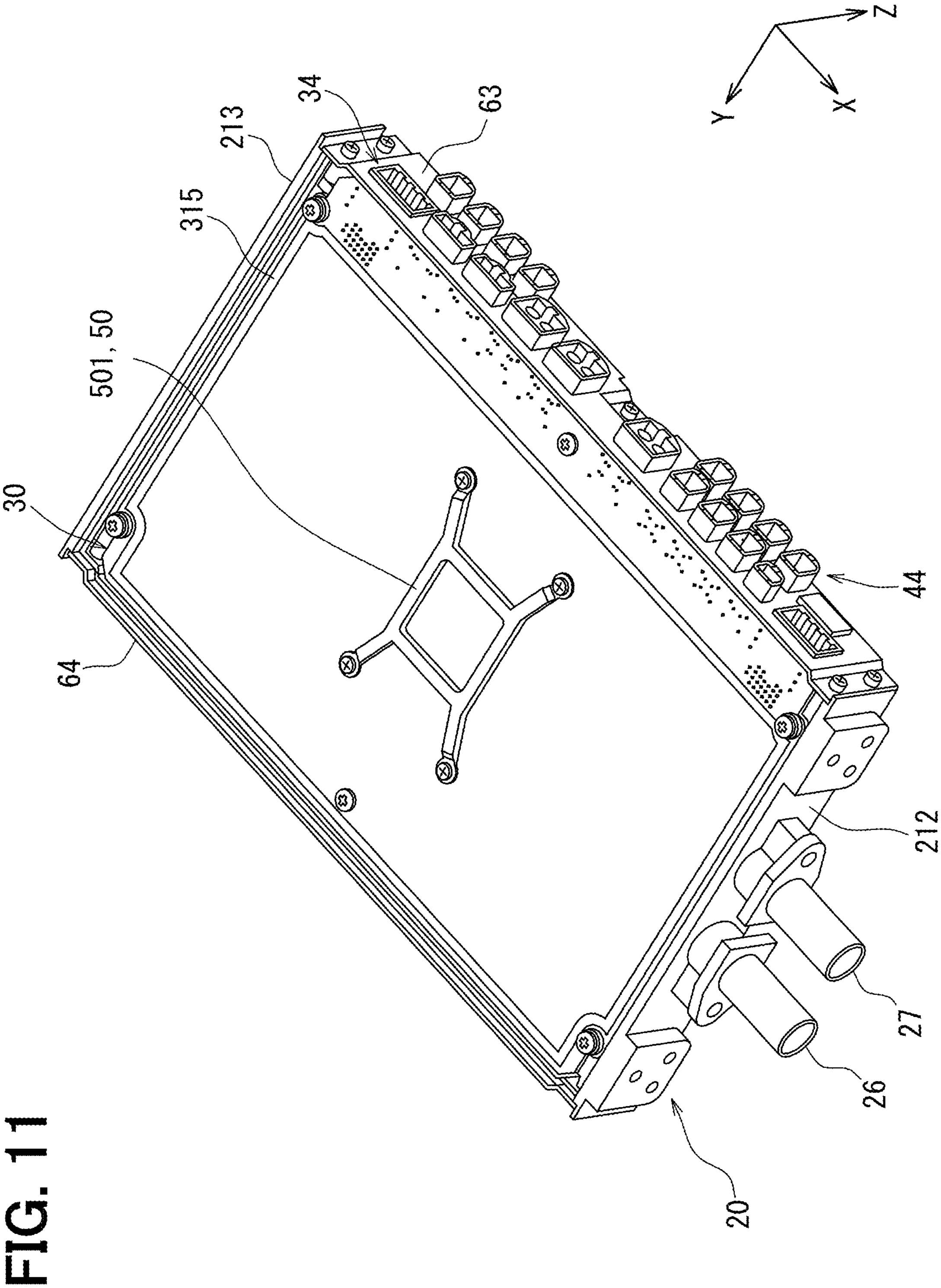
FIG. 11 is a perspective view illustrating a state in which a cover on one surface side is removed.
Figure 12:
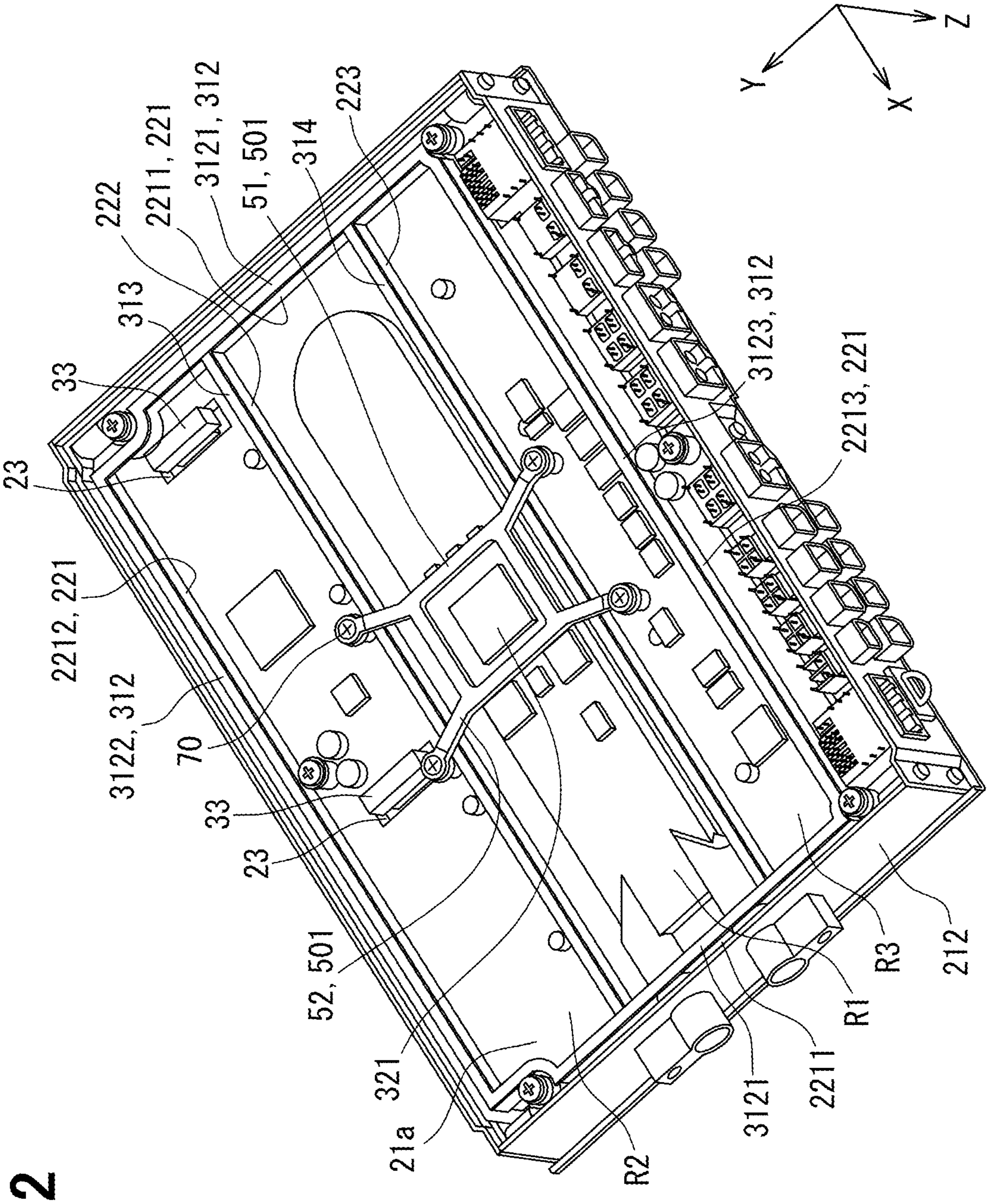
FIG. 12 is a perspective view illustrating a positional relationship among a wall part, an electronic component, a land, and a back plate on one surface side.
Figure 13:
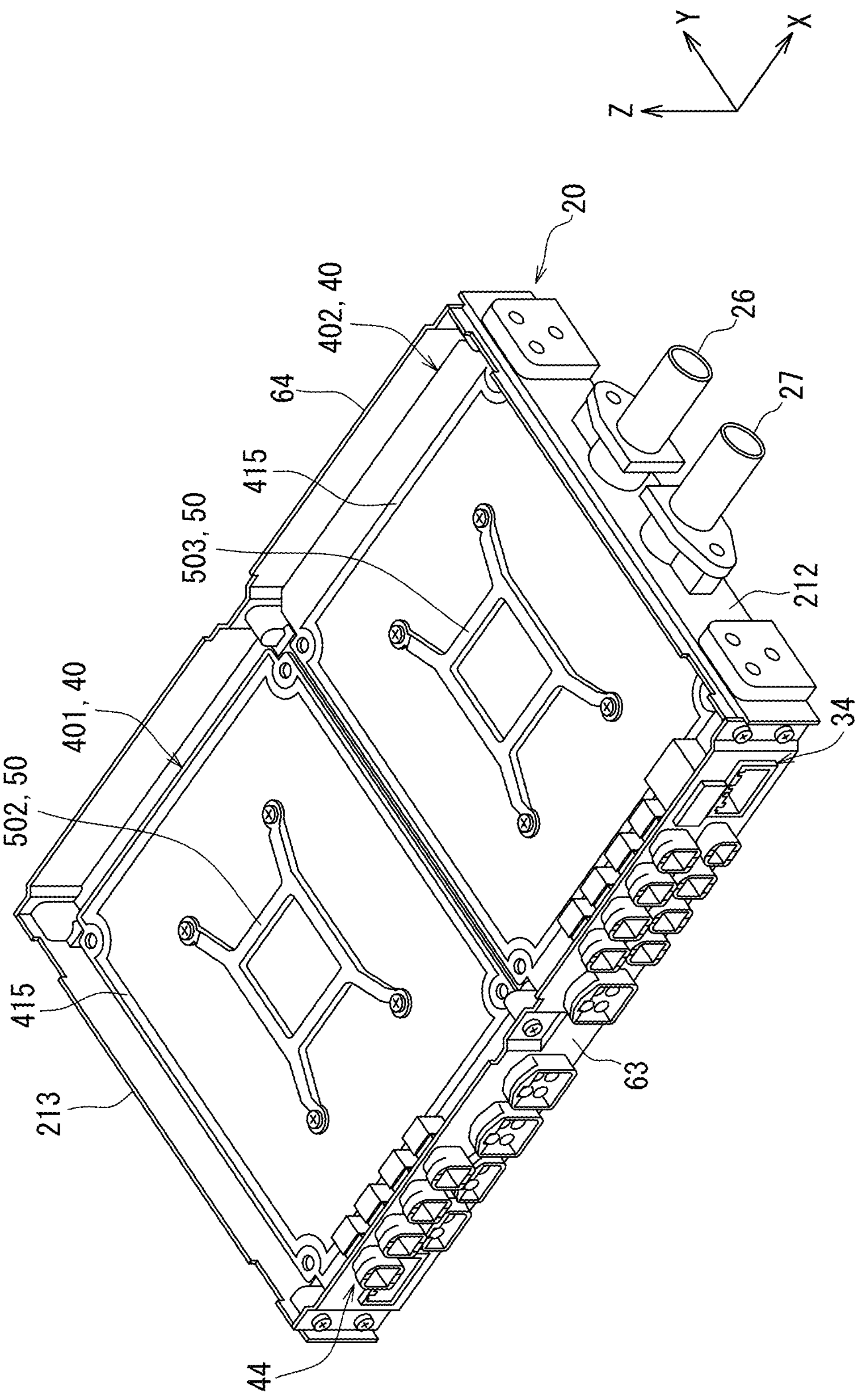
FIG. 13 is a perspective view illustrating a state in which a cover on a back surface side is removed.
Figure 14:
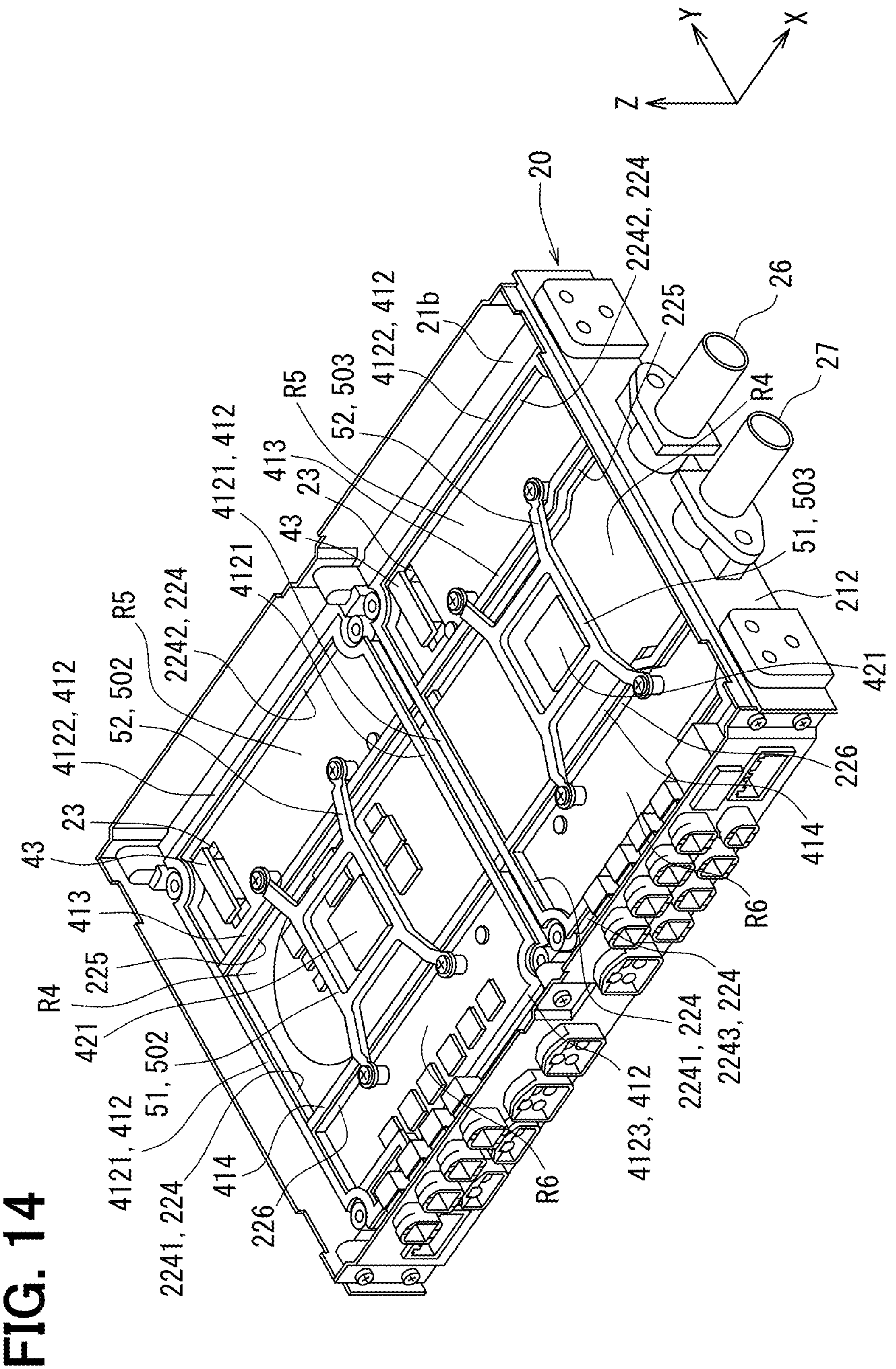
FIG. 14 is a perspective view illustrating a positional relationship among a wall part, an electronic component, a land, and a back plate on a back surface side.

FIG. 9 is a plan view illustrating a circuit board disposed facing one surface of a cooling plate. FIG. 10 is a plan view illustrating the circuit board disposed facing a back surface of the cooling plate. FIG. 11 is a diagram illustrating a state in which a cover facing one surface is removed in the electronic device. FIG. 12 is a diagram in which an insulating base material constituting the circuit board is removed from FIG. 11. FIG. 12 illustrates a positional relationship among a wall part, an electronic component, a land, and a back plate, facing one surface. FIG. 13 is a diagram illustrating a state in which a cover on the back surface side is removed in the electronic device. FIG. 14 is a diagram in which an insulating base material constituting the circuit board is removed from FIG. 13. FIG. 14 illustrates a positional relationship among a wall part, an electronic component, a land, and a back plate on the back surface side. FIGS. 9, 10, 12, and 14 each illustrate only a land corresponding to a wall part provided on a surface of a printed circuit board, the surface facing the cooling plate, as a conductor of the printed circuit board, for convenience. Only some of electronic components are illustrated.

As described above, the circuit board 30 is disposed on the one surface 21*a* of the cooling plate 21. The circuit board 40 is disposed on the back surface 21*b* of the cooling plate 21. The circuit boards 30, 40 are disposed to sandwich the cooling plate 21 in the Z direction. The circuit board 30 is a base board, and the circuit board 40 is an expansion board. The circuit board 30 is equipped with a function that is not changed depending on a vehicle type, a specification, or the like, i.e., a common function. The circuit board 40 is for expanding a function as opposed to the base board. The circuit board 40 is equipped with an additional function suitable for a vehicle type or a specification. The circuit board 40 can be replaced in accordance with a vehicle type or a specification.

For example, the circuit board 30 is equipped with a primary power supply system, an IVI function, and the like. IVI is an abbreviation for In-Vehicle Infotainment. The circuit board 40 is equipped with an AD function or an ADAS function. AD is an abbreviation for Autonomous driving system. ADAS is an abbreviation for Advanced Driving Assistant System.

The circuit board 30 includes a printed circuit board 31, an electronic component 32, and connectors 33, 34. The printed circuit board 31 has a planar shape that is not particularly limited. The printed circuit board 31 illustrated has a substantially rectangular shape in plan view. The printed circuit board 31 in the electronic device 10 has a plate thickness direction that is substantially parallel to the Z direction.

The printed circuit board 31 includes an insulating base material 311 and a conductor. The insulating base material 311 is made of a material having electrical insulation properties, such as resin. As the insulating base material 311, a material containing only resin may be used, or a combination of a glass fabric, a nonwoven fabric, or the like and resin may be used, for example. The conductor is made of a metal material having good conductivity such as Cu. The conductor includes a wiring layer. The wiring layer may be referred to as a wiring, a wiring pattern, a conductor pattern, or the like. The wiring layer may be formed by patterning metal foil, or may be formed by printing, for example. Multiple wiring layers are disposed in the conductor.

The conductor may include a via conductor or a through-hole land in addition to the wiring layer. The via conductor is formed by disposing a conductor such as plating in a through-hole (via) formed in an insulating layer constituting the insulating base material 311. The via conductor electrically connects wiring layers disposed in different layers to each other, for example. The through-hole land is formed on a wall surface of the through-hole passing through the printed circuit board 31 in the Z direction. The through-hole land may be formed around an opening together with the wall surface of the through-hole.

The conductor includes a land serving as an electrode part of the wiring layer in a surface layer of the printed circuit board 31. The conductor in the electronic device 10 illustrated includes lands 312, 313, 314, 315 that provide a reference potential (ground potential) in the circuit board 30. As described later, the conductor includes a via conductor and a ground layer disposed inside the insulating base material 311. Although details will be described later, the lands 312, 313, 314, 315 are connected to the ground layer using the via conductor. The lands 312, 313, 314 are electrically connected to the corresponding wall parts 22 with a gasket or the like interposed therebetween. The land 315 is electrically connected to the cover 61 with a gasket or the like interposed therebetween.

The lands 312, 313, 314 are provided on a surface of the printed circuit board 31, the surface facing the cooling plate 21. The lands 312, 313, 314 are provided corresponding to the wall part 22 (221, 222, 223) provided on the one surface 21*a* of the cooling plate 21. The land 312 is provided along an outer periphery of the printed circuit board 31 except for a mounting part of a connector 34. The land 312 has a ring shape forming a substantial rectangle in plan view. The lands 313, 314 each extend in the X direction. The land 313 is connected at one end to the land 312 on the side close to the side plate part 212, and at the other end to the land 312 on the side close to the side plate part 213. Similarly, the land 314 is connected at one end to the land 312 on the side close to the side plate part 212, and at the other end to the land 312 on the side close to the side plate part 213. The lands 313, 314 divide a region surrounded by the land 312 into three regions.

As illustrated in FIG. 12, the land 312 is provided overlapping the wall part 221 in plan view. The land 313 is provided overlapping the wall part 222 in plan view. The land 314 is provided overlapping the wall part 223 in plan view. As illustrated in FIG. 9, the land 312 includes a land 3121 positioned between the land 313 and the land 314, and lands 3122 and 3123 other than the land 3121. The lands 3121, 313, 314 surround a region that corresponds to the region R1 in plan view, so that the region may be referred to below as the region R1. The lands 3122, 313 surround a region that corresponds to the region R2 in plan view, so that the region may be referred to below as the region R2. The lands 3123, 314 surround a region that corresponds to the region R3 in plan view, so that the region may be referred to below as the region R3.

The land 315 are provided on a surface of the printed circuit board 31, the surface opposite to the surface facing the cooling plate 21. The land 315 is provided along the outer periphery of the printed circuit board 31 except for the mounting part of the connector 34. The land 315 has a ring shape forming a substantial rectangle in plan view.

The printed circuit board 31 is provided with a through-hole 35 for fixing. The through-hole 35 includes through-holes 351, 352, 353. The through-hole 351 is for fixing the back plate 50 (501) and the circuit board 30 to the cooling plate 21. The through-hole 351 is provided overlapping the fixing part 251 in plan view. Two of four through-holes 351 are provided in the region R2, and the other two are provided in the region R3.

The through-hole 352 is for fixing the cover 61 and the circuit board 30 to the cooling plate 21. The through-hole 352 is provided overlapping the fixing part 252 in plan view. The through-hole 352 is provided outside the land 312. Four through-holes 352 are provided at four respective corners of the printed circuit board 31. The through-hole 353 is for fixing the circuit board 30 to the cooling plate 21. The through-hole 353 is provided overlapping the fixing part 253 in plan view. One of two through-holes 353 is provided in the region R2, and the other is provided in the region R3. The through-holes 351, 353 are each provided on its wall surface and around its opening with a through-hole land 316X.

The electronic component 32 is mounted on the printed circuit board 31. The printed circuit board 31 is equipped with a plurality of electronic components 32. The electronic components 32 form a circuit together with the conductor described above. The electronic components 32 are disposed at least on a surface of the printed circuit board 31, the surface facing the cooling plate 21. The circuit board 30 is provided with a primary power supply circuit (not illustrated) formed by the conductor and the electronic components 32.

The region R1 is equipped with digital circuits that generate noise and/or are affected by noise, such as a processor, a memory, and a clock oscillator. The noise becomes more problematic particularly as operation frequency increases. The region R1 is equipped with a heat generating component that generates heat while operating. The electronic components 32 mounted in the region R1 include electronic components 321, 322, 323. The electronic component 321 includes a processor, a memory, and the like. The processor constructs a plurality of functional parts by executing a control program stored in the memory. The electronic component 321 is a SoC, for example. The SoC is an abbreviation for System on Chip. As the electronic component 321, a microcomputer or the like may be used. The electronic component 322 is a memory such as a flash or a ROM. The ROM is an abbreviation for Read Only Memory. The electronic component 323 is a power supply IC constituting a secondary power supply circuit. The number of each of the electronic components 321, 322, 323 is not particularly limited. The number may be only one, or two or more.

At least one of heat generating components disposed in the region R1 is connected to the cooling plate 21 with a heat conducting member such as a TIM described later. The electronic device 10 illustrated includes the electronic component 321 (SoC) connected to the cooling plate 21 with the TIM.

The electronic components 32 mounted in the region R2 include an electronic component 324. The electronic component 324 is a communication IC for high-speed data communication between the circuit boards 30, 40. The electronic component 324 is a PCI-e switch, for example. The PCI-e is an abbreviation for Peripheral Component Interconnect-express. The electronic components 32 mounted in the region R3 include an electronic component 325. The electronic component 325 is a communication IC for communicating with a device (external device) different from the electronic device 10. The electronic component 325 is used for high-speed communication such as CAN, LVDS, GVIF, or Ethernet. The CAN, GVIF, and Ethernet are registered trademarks. The CAN is an abbreviation for Controller Area Network. The LVDS is an abbreviation for Low Voltage Differential Signaling. The GVIF is an abbreviation for Gigabit Video InterFace. The electronic component 325 may include a CAN transceiver, an EthernetPHY, and an Ethernet switch, for example.

The connectors 33, 34 are mounted on the printed circuit board 31. The connector 33 is for electrically connecting the circuit board 30 and the circuit board 40. The connector 33 is mounted at a position overlapping the through-hole 23 in plan view. The connector 34 is for electrically connecting an external device and the circuit board 30. Connectors include a connector used for the high-speed communication described above.

The circuit board 40 is similar in configuration to the circuit board 30. The circuit board 40 includes a printed circuit board 41, an electronic component 42, and connectors 43, 44. The electronic device 10 illustrated includes two circuit boards 401, 402 as the circuit board 40. The two circuit boards 401, 402 are disposed side by side in the X direction. Each of the circuit boards 401, 402 has a size of approximately ½ of the circuit board 30 in plan view. The circuit boards 401, 402 each have a substantially rectangular shape in plan view, for example. The printed circuit board 41 in the electronic device 10 has a plate thickness direction that is substantially parallel to the Z direction.

The printed circuit board 41 in each circuit board 40 includes an insulating base material 411 and a conductor. The conductor includes a land in a surface layer of the printed circuit board 41. The conductor in the electronic device 10 illustrated includes lands 412, 413, 414, 415 that provide a ground potential. As described later, the conductor includes a via conductor and a ground layer disposed inside the insulating base material 411. Although details will be described later, the lands 412, 413, 414, 415 are connected to the ground layer using the via conductor. The lands 412, 413, 414 are electrically connected to the corresponding wall parts 22 with a conductive gasket or the like interposed therebetween. The land 415 is electrically connected to the cover 62 with a gasket or the like interposed therebetween.

The lands 412, 413, 414 are provided on a surface of the printed circuit board 41, the surface facing the cooling plate 21. The lands 412, 413, 414 are provided corresponding to the wall part 22 (224, 225, 226) provided on the back surface 21*b* of the cooling plate 21. The land 412 is provided along an outer periphery of the printed circuit board 41 except for a mounting part of the connector 44. The land 412 has a ring shape forming a substantial rectangle in plan view. The lands 413, 414 each extend in the X direction. The lands 413, 414 are each connected at its opposite ends to the land 412. The lands 413, 414 divide a region surrounded by the land 412 into three regions.

As illustrated in FIG. 14, the land 412 is provided overlapping the wall part 224 in plan view. A land 4121 has a ring shape forming a substantial rectangle in plan view across the flow path 24. The land 413 is provided overlapping the wall part 225 in plan view. The land 414 is provided overlapping the wall part 226 in plan view. As illustrated in FIG. 10, the land 412 includes a land 4121 positioned between the land 413 and the land 414, and lands 4122 and 4123 other than the land 4121. The lands 4121, 413, 414 surround a region that corresponds to the region R4 in plan view, so that the region may be referred to below as the region R4. The lands 4122, 413 surround a region that corresponds to the region R5 in plan view, so that the region may be referred to below as the region R5. The lands 4123, 414 surround a region that corresponds to the region R6 in plan view, so that the region may be referred to below as the region R6.

The land 415 is provided on a surface of the printed circuit board 41, the surface opposite to the surface facing the cooling plate 21. The land 415 is provided along the outer periphery of the printed circuit board 41 except for the mounting part of the connector 44. The land 415 has a ring shape forming a substantial rectangle in plan view.

The printed circuit board 41 is provided with a through-hole 45 for fixing. The through-hole 45 includes through-holes 451, 452. The through-hole 451 is for fixing the corresponding back plate 50 and circuit board 40 to the cooling plate 21. The through-hole 451 is provided overlapping the fixing part 254 in plan view. In each circuit board 40, two of four through-holes 451 are provided in the region R4, and the other two are provided in the region R5. The through-hole 452 is for fixing the cover 62 and the circuit board 40 to the cooling plate 21. The through-hole 452 is provided overlapping the fixing part 255 in plan view. The through-hole 452 is provided outside the land 412. Four through-holes 452 are provided at four respective corners of the printed circuit board 41. The through-hole 451 is provided on its wall surface and around its opening with a through-hole land 416X.

The electronic component 42 is mounted on the printed circuit board 41. The printed circuit board 41 is equipped with a plurality of electronic components 42. The electronic components 42 are disposed at least on a surface of the printed circuit board 41, the surface facing the cooling plate 21. The two circuit boards 40 include the circuit board 402 in which only an electronic component 421 is illustrated as the electronic component 42.

The region R4 is equipped with digital circuits that generate noise and/or are affected by noise, such as a processor, a memory, and a clock oscillator. The region R4 is equipped with a heat generating component that generates heat while operating. The electronic components 42 mounted in the region R4 include electronic components 421, 422, 423. The electronic component 421 includes a processor, a memory, and the like. The electronic component 421 is a SoC, for example. As the electronic component 421, a microcomputer or the like may be used. The electronic component 422 is a memory such as a flash or a ROM. The electronic component 423 is a power supply IC constituting a secondary power supply circuit. At least one of heat generating components disposed in the region R4 is connected to the flow path cover 28 of the cooler 20 with a heat conducting member such as a TIM as described later. The electronic device 10 illustrated includes the electronic component 421 (SoC) connected to the flow path cover 28 with the TIM. The number of each of the electronic components 421, 422, 423 is not particularly limited. The number may be only one, or two or more.

The electronic components 42 mounted in the region R6 include an electronic component 424. The electronic component 424 is a communication IC for communicating with an external device. The electronic component 424 is a serializer or a deserializer used for high-speed communication such as the GVIF, for example.

The connectors 43, 44 are mounted on the printed circuit board 41. The connector 43 is for electrically connecting the circuit board 30 and the circuit board 40. The connector 43 is mounted at a position overlapping the through-hole 23 in plan view. The connectors 33, 43 may be referred to as BtoB connectors. Instead of the connectors 33, 43, a flat wire or a flexible board may be used. The connectors 34, 44 each correspond to a connector. The connector 44 is for electrically connecting the circuit board 40 and an external device. Connectors include a connector used for the high-speed communication described above.

Back Plate

As illustrated in FIGS. 5 to 7 and FIGS. 11 to 14, the back plate 50 presses the circuit boards 30, 40 against the cooling plate 21. The back plate 50 has spring properties, and presses the circuit boards 30, 40 against the cooling plate 21 (cooler 20) using a reaction force due to spring deformation. The back plate 50 is disposed on a surface of each of the circuit boards 30, 40, the surface being opposite to a surface facing the cooling plate 21, i.e., is disposed on a back surface thereof. The back plate 50 includes back plates 501, 502, 503. The back plate 501 is attached to the circuit board 30. The back plate 502 is attached to the circuit board 401. The back plate 503 is attached to the circuit board 402. The back plates 501, 502, 503 each have a common structure, for example.

The back plate 50 includes a frame part 51 and a leg part 52. The frame part 51 has a ring shape forming a substantial rectangle in plan view. The frame part 51 of the back plate 501 is provided surrounding the electronic component 321 in plan view. The back plates 502, 503 each include the frame part 51 provided surrounding the corresponding electronic component 421 in plan view. The leg part 52 extends from each of four corners of the frame part 51. The back plate 50 includes four leg parts 52. The leg parts 52 are each provided at its terminal end with a fixing hole for a screw 70. Two of the leg parts 52 aligned in the X direction include terminal ends at an interval wider than an interval between their connection ends with the frame part 51. The leg parts 52 each extend in an oblique direction from the frame part 51. The frame part 51 and the leg parts 52, which are in a screwed state, press the corresponding circuit boards 30, 40 against the cooling plate 21 (cooler 20) using spring reaction force.

In plan view, the frame part 51 of the back plate 501 is provided at a position overlapping the region R1, and the leg parts 52 are each provided over the region R1 and the region R2 or the region R3. In plan view, two of the leg parts 52 cross over the wall part 222 and the land 313 to locate their terminal ends in the region R2. The other two of the leg parts 52 cross over the wall part 223 and the land 314 to locate their terminal ends in the region R3. The screw 70 attached to each of the leg parts 52 of back plate 501 is inserted through the through-hole 351 of the printed circuit board 31 to be fastened to the fixing part 251 of the cooling plate 21.

In plan view, the frame part 51 of the back plate 502 is provided at a position overlapping the region R4, and the leg parts 52 are each provided over the region R4 and the region R5 or the region R6. In plan view, two of the leg parts 52 cross over the wall part 225 and the land 413 to locate their terminal ends in the region R5. In plan view, the other two of the leg parts 52 cross over the wall part 226 and the land 414 to locate their terminal ends in the region R6. The screw 70 attached to each of the leg parts 52 of back plate 501 is inserted through the through-hole 451 of the printed circuit board 41 to be fastened to the fixing part 254 of the cooling plate 21.

Housing

The housing 60 is made of a material capable of shielding electromagnetism. The housing 60 is made of a metal material such as aluminum or iron, for example. The housing 60 may be made of a metal material and a resin material instead of being made of a metal material. For example, metal plating may be applied to an inner surface of a resin molded body, or conductive particles may be mixed with a resin. The housing 60 in the electronic device 10 illustrated is made of a metal material.

As illustrated in FIGS. 1 to 5, the housing 60 includes covers 61, 62 and side plates 63, 64. The covers 61, 62 constitute an outer shell of the electronic device 10 in the Z direction. The cover 61 is disposed facing a back surface of the circuit board 30. The cover 61 is configured to cover the back plate 501 and the circuit board 30. The cover 61 is provided to enclose the back plate 501 and most of the circuit board 30 in plan view. In plan view, a part of the connector 34 is located outside the cover 61. The cover 61 includes a through-hole 610. The screw 70 is inserted through the through-hole 610 and the through-hole 352 of the printed circuit board 31 to be fastened to the fixing part 252 of the cooling plate 21.

The cover 62 is disposed facing a back surface of the circuit board 40 (401, 402). The cover 62 is configured to cover the back plates 502, 503 and the circuit boards 401, 402. The cover 62 is provided to enclose the back plates 502, 503 and most of the circuit boards 401, 402 in plan view. In plan view, a part of the connector 44 is located outside the cover 62. The cover 62 includes a through-hole 620. The screw 70 is inserted through the through-hole 620 and the through-hole 452 of the printed circuit board 41 to be fastened to the fixing part 255 of the cooling plate 21.

The side plates 63, 64 constitute an outer shell of the electronic device 10 in the Y direction. The side plate 63 is disposed close to the connectors 34, 44. The side plate 63 includes through-holes 630, 631. The screw 70 is inserted through the through-hole 630 to be fastened to the fixing part of the cooling plate 21. The through-hole 631 is provided corresponding to the connectors 34, 44 to expose a part of the connectors 34, 44 to the outside of the electronic device 10. The side plate 64 is disposed opposite to the connectors 34, 44 in the Y direction. The side plate 64 includes a through-hole 640. The screw 70 is inserted through the through-hole 640 to be fastened to the fixing part of the cooling plate 21. As described above, the side plate parts 212, 213 of the cooling plate 21 also function as the housing 60. The side plate parts 212, 213 constitute an outer shell of the electronic device 10 in the X direction.

Electromagnetic Shield Body and Cooling Structure

Figure 15:
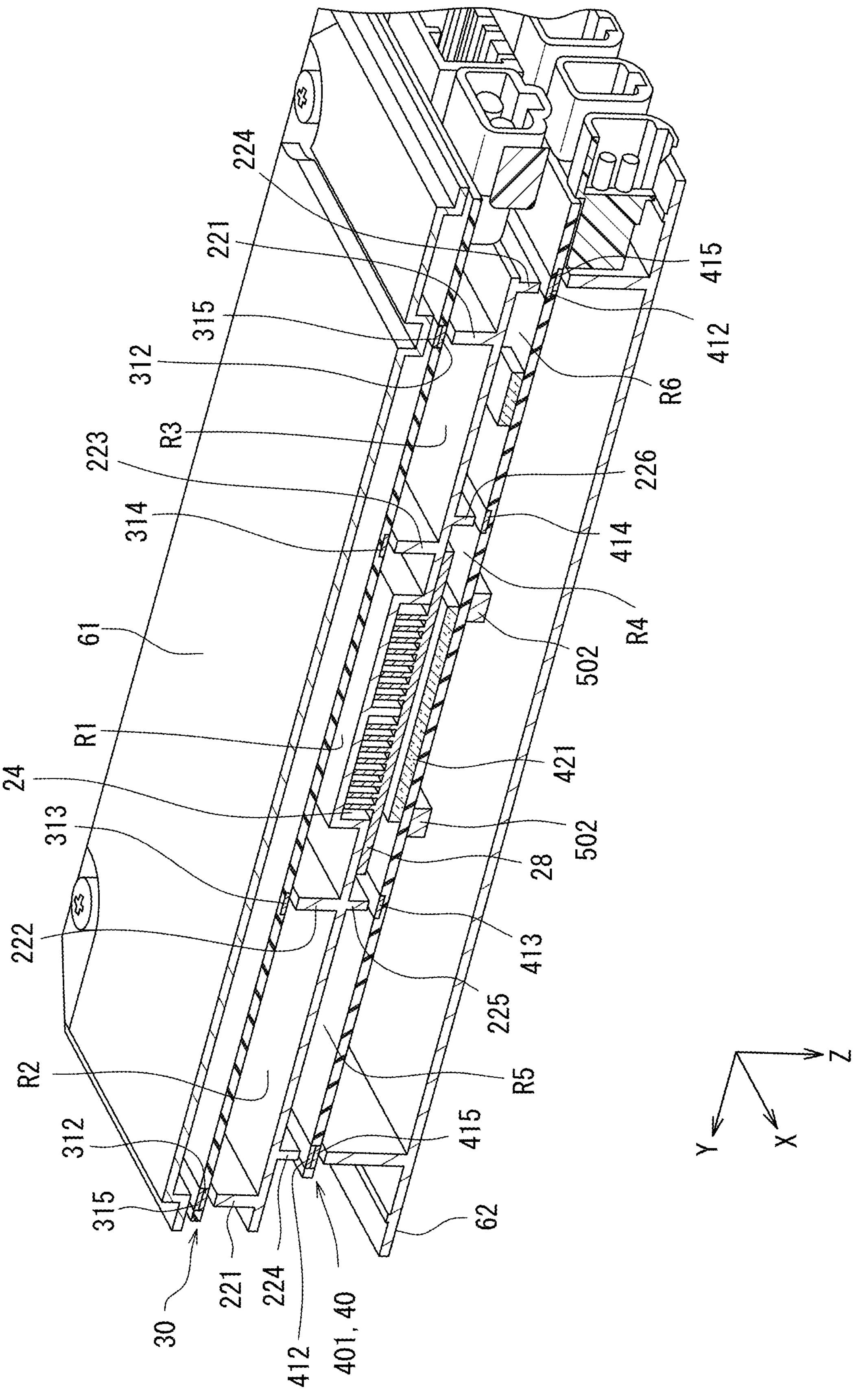
FIG. 15 is a sectional view taken along line XV-XV in FIG. 1.
Figure 16:
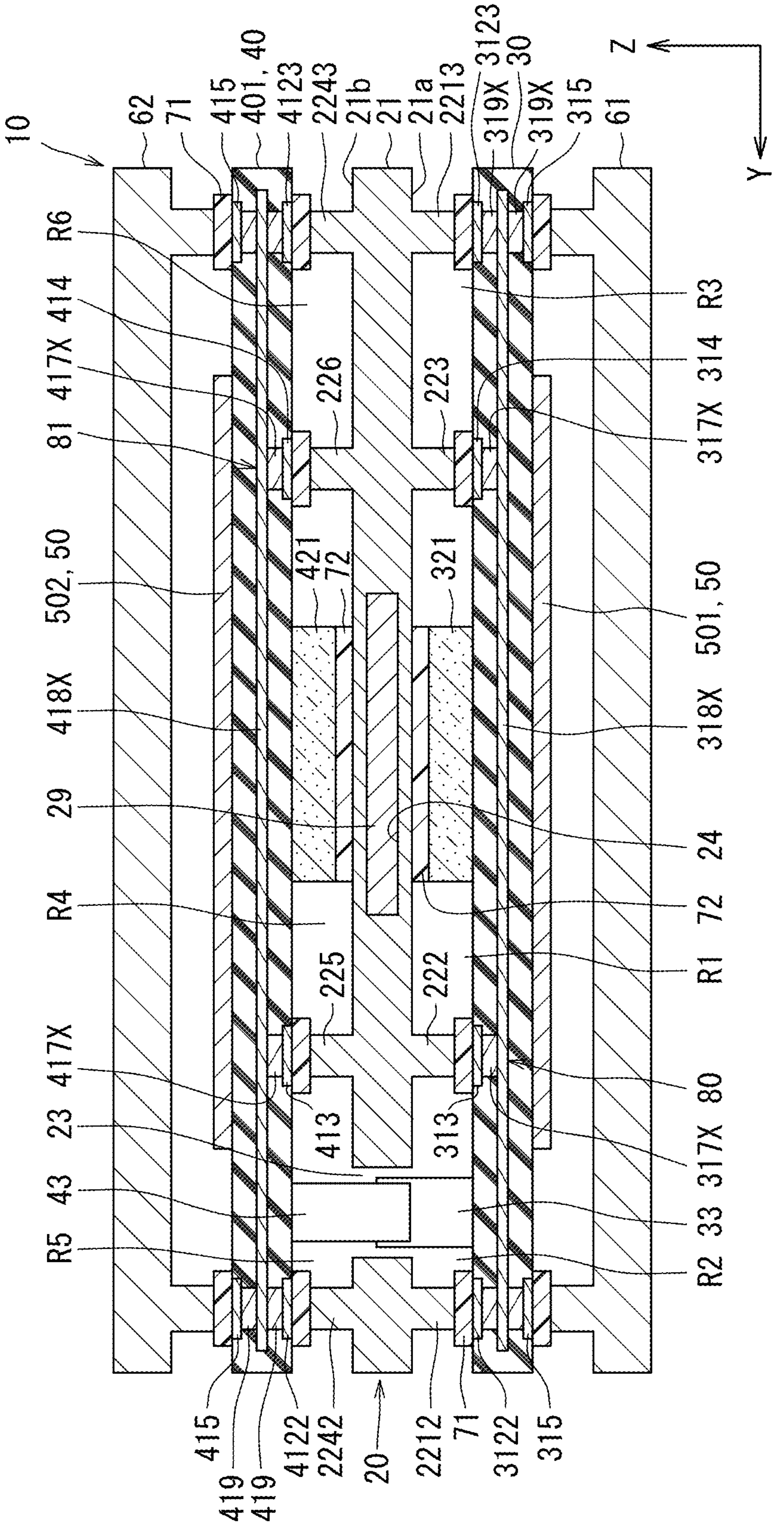
FIG. 16 is a sectional view illustrating an electromagnetic shield body configured in an electronic device.
Figure 17:
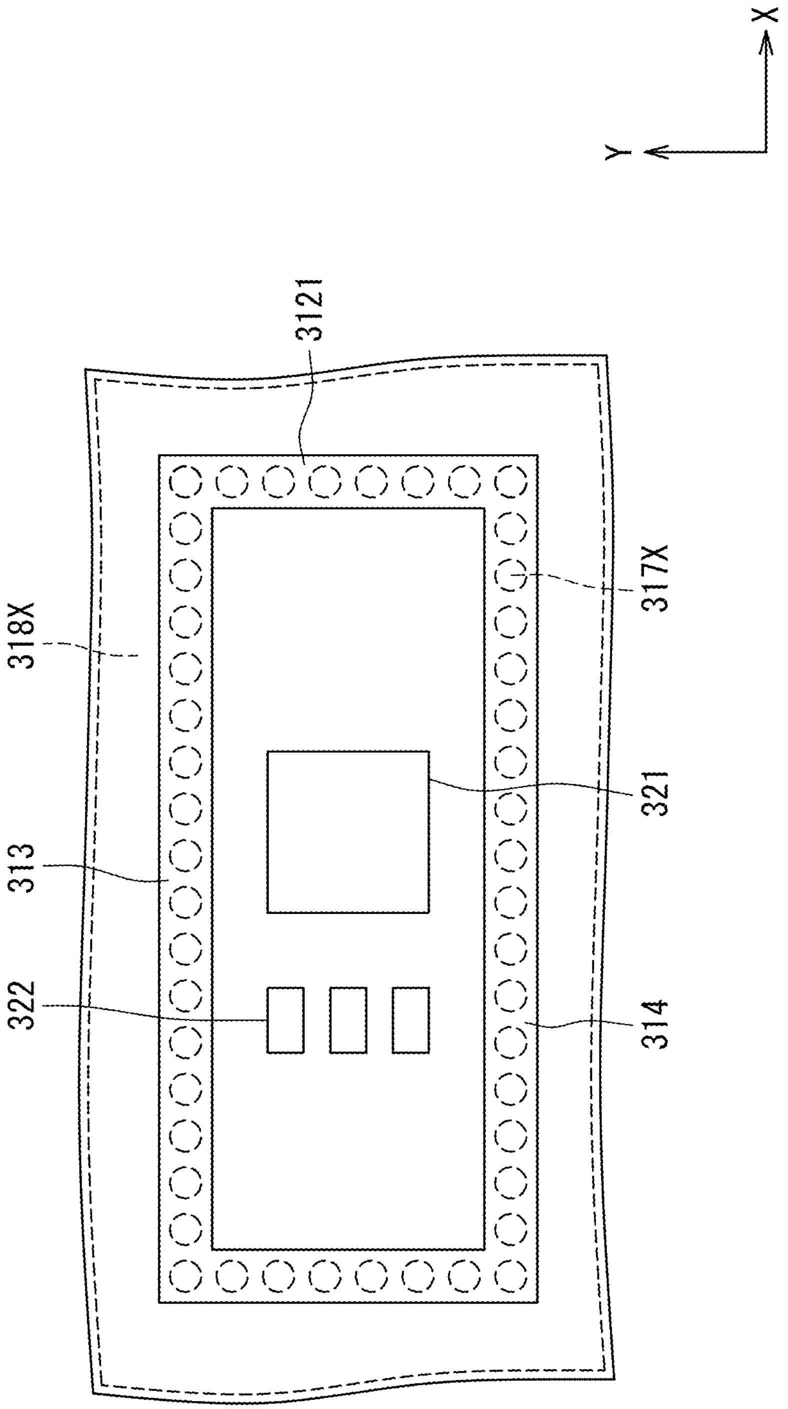
FIG. 17 is a plan view illustrating a land, a via conductor, and a ground layer constituting an electromagnetic shield body.

FIG. 15 is a sectional view taken along line XV-XV in FIG. 1. For convenience, FIG. 15 does not illustrate a gasket and a TIM. FIG. 16 is a sectional view illustrating an electromagnetic shield body configured in the electronic device. FIG. 16 is an image diagram illustrating a heat generating component, a through-hole, and a component of an electromagnetic shield body in a common section. FIG. 17 is a plan view illustrating elements of the electromagnetic shield body in the circuit board.

The electronic device 10 includes an electromagnetic shield body 80. The electromagnetic shield body 80 may be disposed covering a specific circuit element formed on the circuit board 30 and causing noise, or may be disposed covering a specific circuit element for which influence of noise from the outside is desired to be restricted. The electromagnetic shield body 80 includes the cooling plate 21 (body part 211), the wall parts 2211, 222, 223 defining the region R1, the lands 3121, 313, 314, a plurality of via conductors 317X, and a ground layer 318X. The electromagnetic shield body 80 in the electronic device 10 illustrated accommodates the electronic components 32 mounted in the region R1, such as the electronic component 321 (SoC), and the electronic component 322 (memory).

As illustrated in FIG. 16, the electronic device 10 includes a conductive gasket 71 and a TIM 72. The gasket 71 is provided along the wall part 22. The gasket 71 is provided over the entire length of the wall part 22. The gasket 71 is interposed between the wall parts 2211, 222, 223 and the lands 3121, 313, 314 to electrically connect the wall parts 2211, 222, 223 to the corresponding lands 3121, 313, 314. The wall parts 2211, 222, 223 forming a ring shape are electrically connected to the corresponding lands 3121, 313, 314 forming a ring shape over the entire length.

As illustrated in FIG. 17, the via conductors 317X electrically connect the corresponding lands 3121, 313, 314 to the ground layer 318X. The ground layer 318X is a so-called solid ground. The ground layer 318X is disposed in most of a plane. The ground layer 318X in the electronic device 10 illustrated is an inner layer ground disposed inside the insulating base material 311. Instead of the inner layer ground, a ground layer provided on a back surface of the insulating base material 311 may be used. The plurality of via conductors 317X is provided at predetermined intervals along the lands 3121, 313, 314 forming the ring shape. The interval between the corresponding via conductors 317X is preferably equal to or less than ½ wavelength of a frequency of noise to be blocked. To block noise of a plurality of frequencies, the interval is preferably set to equal to or less than ½ wavelength of the lowest frequency. Each element constituting the electromagnetic shield body 80 is fixed at a predetermined potential (ground potential).

The TIM 72 is interposed between the heat generating component mounted on the printed circuit board 31 and the cooling plate 21 (cooler 20). The TIM 72 is interposed between at least some of the electronic components 32 accommodated in the electromagnetic shield body 80 and the cooling plate 21. The TIM 72 in the electronic device 10 illustrated is interposed between the electronic component 321 (SoC) and the cooling plate 21 to be in contact with the electronic component 321 and the cooling plate 21. The TIM 72 thermally connects the electronic component 321 to the cooling plate 21.

The circuit board 30 further includes via conductors 319X. The via conductors 319X electrically connect the land 312 (3122, 3123) to the land 315. The via conductors 319X are provided at predetermined intervals along the lands 3122, 3123 as with the via conductors 317X. The via conductors 319X electrically connect the lands 3122, 3123 to the land 315 with the ground layer 318X interposed therebetween. The lands 3122, 3123 are electrically connected to the wall parts 2212, 2213, respectively, with the gasket 71 interposed therebetween. The lands 3122, 3123 are electrically connected to the wall parts 2212, 2213, respectively, over the entire length thereof. The cover 61 is electrically connected to the land 315 with the gasket 71 interposed therebetween. The gasket 71 is provided over the entire length of the land 315. The land 315 forming a ring shape is electrically connected to the cover 61 over its entire length. The via conductor 319X and the cover 61 are fixed at the ground potential.

The electronic device 10 further includes an electromagnetic shield body 81. The electromagnetic shield body 81 may be disposed covering a specific circuit element formed on the circuit board 40 and causing noise, or may be disposed covering a specific circuit element for which influence of noise from the outside is desired to be restricted. The electromagnetic shield body 81 includes the cooling plate 21 (body part 211), the wall parts 2241, 225, 226 defining the region R4, the lands 4121, 413, 414, a plurality of via conductors 417X, and a ground layer 418X. The electromagnetic shield body 81 in the electronic device 10 illustrated accommodates the electronic components 42 mounted in the region R4, such as the electronic component 421 (SoC), and the electronic component 422 (memory).

The gasket 71 is provided along the wall part 22 as described above. The gasket 71 is interposed between the wall parts 2241, 225, 226 and the lands 4121, 413, 414 to electrically connect the wall parts 2241, 225, 226 to the corresponding lands 4121, 413, 414. The wall parts 2241, 224, 225 forming a ring shape are electrically connected to the corresponding lands 4121, 413, 414 forming a ring shape over the entire length.

As with the via conductor 317X, the via conductor 417X electrically connects the lands 4121, 413, 414 to the ground layer 418X. The ground layer 418X is a solid ground. The ground layer 418X is disposed in most of a plane. The ground layer 418X in the electronic device 10 illustrated is an inner layer ground disposed inside the insulating base material 411. Instead of the inner layer ground, a ground layer provided on a back surface of the insulating base material 411 may be used. The plurality of via conductors 417X is provided at predetermined intervals along the lands 4121, 413, 414 forming the ring shape. The interval between the corresponding via conductors 417X is preferably equal to or less than ½ wavelength of a frequency of noise to be blocked. To block noise of a plurality of frequencies, the interval is preferably set to equal to or less than ½ wavelength of the lowest frequency. Each element constituting the electromagnetic shield body 81 is fixed at a predetermined potential (ground potential).

The TIM 72 is interposed between the heat generating component mounted on the printed circuit board 41 and the cooling plate 21 (cooler 20). The TIM 72 is interposed between at least some of the electronic components 42 accommodated in the electromagnetic shield body 81 and the cooling plate 21. The TIM 72 in the electronic device 10 illustrated is interposed between the electronic component 421 (SoC) and the cooling plate 21 to be in contact with the electronic component 421 and the cooling plate 21. The TIM 72 thermally connects the electronic component 421 to the cooling plate 21.

The circuit board 40 further includes via conductors 419. The via conductors 419 electrically connect the land 412 (4122, 4123) to the land 415. The via conductors 419 are provided at predetermined intervals along the lands 4122, 4123 as with the via conductors 417X. The via conductors 419 electrically connect the lands 4122, 4123 to the land 415 with the ground layer 418X interposed therebetween. The lands 4122, 4123 are electrically connected to the wall parts 2242, 2243, respectively, with the gasket 71 interposed therebetween. The lands 4122, 4123 are electrically connected to the wall parts 2242, 2243, respectively, over the entire length thereof. The cover 62 is electrically connected to the land 415 with the gasket 71 interposed therebetween. The gasket 71 is provided over the entire length of the land 415. The land 415 forming a ring shape is electrically connected to the cover 62 over its entire length. The via conductor 419 and the cover 62 are fixed at the ground potential.

Summary of First Embodiment

According to the present embodiment, the circuit board 30 is disposed facing the one surface 21*a* of the cooling plate 21, and the circuit board 40 is disposed facing the back surface 21*b* thereof. The circuit boards 30, 40 are electrically connected through the through-hole 23 of the cooling plate 21. Thus, the circuit boards 30, 40 can be simplified in connection structure.

Providing the through-hole in the cooling plate may cause noise generated by an electronic component mounted on one of the circuit boards to affect an electronic component mounted on the other of the circuit boards. In the present embodiment, the electronic device 10 includes the electromagnetic shield body 80. The electromagnetic shield body 80 includes the cooling plate 21, a shield wall, a shield lid, and a ground conductor. The wall parts 2211, 222, 223 on the one surface 21*a* of the cooling plate 21 in the electronic device 10 illustrated are provided surrounding the electronic components 32, such as the electronic component 321 (SoC) and the electronic component 322 (memory) mounted in the region R1, in plan view. The through-hole 23 is provided outside the wall parts 2211, 222, 223 in plan view. The wall parts 2211, 222, 223 each correspond to the shield wall (first shield wall). The electronic components 321, 322 each correspond to the first electronic component. The circuit board 30 corresponds to a first circuit board.

The lands 3121, 313, 314 and the via conductors 317X formed on the circuit board 30 provide a reference potential (ground potential) and are provided surrounding the electronic components 321, 322 in plan view. The lands 3121, 313, 314 are electrically connected to the cooling plate 21 through the wall parts 2211, 222, 223, respectively. The lands 3121, 313, 314 and the via conductor 317X correspond to the ground conductor (first ground conductor). The ground layer 318X formed on the circuit board 30 is provided enclosing the lands 3121, 313, 314 and the via conductor 317X in plan view. The ground layer 318X is electrically connected to the cooling plate 21 through the via conductor 317X, the lands 3121, 313, 314, and the wall parts 2211, 222, 223. The ground layer 318X corresponds to the shield lid (first shield lid) configured to cover the electromagnetic shield body.

As described above, the electronic component 321 (SoC) and the electronic component 322 (memory) are disposed inside the electromagnetic shield body 80. The components are disposed in an electromagnetic shielding space formed by the electromagnetic shield body 80. The electromagnetic shield body 80 functions as a noise return path. The electromagnetic shield body 80 shields noise due to a shielding effect. Thus, noise generated by the electronic components 321, 322 can be restricted from affecting the circuit board 40, particularly the electronic component 421 (SoC) and the electronic component 422 (memory) through the through-hole 23. Additionally, noise generated by the electronic components 421, 422 can be restricted from affecting the circuit board 30, particularly the electronic components 321, 322 through the through-hole 23. The circuit board 40 corresponds to a second circuit board. The electronic components 421, 422 each correspond to a second electronic component.

As illustrated, the electronic device 10 may include the back plate 50 (501) that presses the circuit board 30 against the cooling plate 21. The back plate 501 may be disposed crossing the wall parts 222, 223 in plan view, and may be fixed to the cooling plate 21 outside the region R1 surrounded by the wall parts 2211, 222, 223. As a result, the circuit board (printed circuit board 31) can be restricted from being warped by heat. In particular, leakage of electromagnetic noise due to a gap generated between the wall parts 222, 223 and the lands 313, 314 can be restricted.

As described above, the ground layer 318X may serve as the shield wall, or the cover 61 constituting the housing 60 may serve as the shield wall. Using the ground layer 318X enables simplification of configuration. The ground layer 318X may be disposed in an inner layer of the printed circuit board 31, or may be disposed on a surface of the printed circuit board 31, the surface being opposite to a surface thereof facing the cooling plate 21. The cover 61 in the electronic device 10 illustrated is also electrically connected to the lands 3121, 313, 314 through the via conductor 319X, the ground layer 318X, and the via conductor 317X. The electronic device 10 includes an electromagnetic shield body including the cooling plate 21, the wall parts 2212, 222, 223, the lands 3121, 313, 314, the via conductor 317X, the ground layer 318X, the via conductor 319X, the land 315, and the cover 61. The electronic device 10 includes an electromagnetic shield body including the cooling plate 21, the wall part 221, the land 312, the via conductor 319X, the ground layer 318X, the via conductor 319X, the land 315, and the cover 61. As a result, influence of disturbance noise can be restricted. Additionally, emission of noise to the outside of the electronic device 10 can be restricted.

The shield wall may be provided separately from the cooling plate 21. The shield wall may be provided separately from the cooling plate 21 and the circuit board 30. The shield wall may be partly integrated with the circuit board 30 by being mounted on the circuit board 30. The shield wall may be provided separately from the cooling plate 21 and the circuit board 30. As with the wall parts 2212, 222, 223 illustrated, the shield wall may be provided continuously and integrally with the cooling plate 21. This configuration facilitates positioning of the shield wall and the lands 3121, 313, 314 (ground conductors).

As illustrated, the circuit board 30 may include the electronic component 321 (SoC) as the first electronic component disposed inside the electromagnetic shield body 80. As a result, noise generated by the SoC can be restricted from affecting the circuit board 40 through the through-hole 23. Additionally, noise generated by the circuit board 40 can be restricted from affecting the SoC. As described above, the SoC can be cooled by the cooling plate 21 while influence of noise is restricted.

As illustrated, the cooling plate 21 may include the flow path 24 through which the refrigerant flows in the region R1 defined by the shield wall in plan view. This configuration enables the electronic components 321, 322 and the like disposed in the region R1 to be effectively cooled while restricting influence of noise.

The electronic device 10 may include a plurality of electromagnetic shield bodies. The electronic device 10 may include an electromagnetic shield body provided facing the circuit board 30 and an electromagnetic shield body provided facing the circuit board 40. The electronic device 10 illustrated includes electromagnetic shield bodies 80, 81. The electromagnetic shield body 80 corresponds to a first electromagnetic shield body, and the electromagnetic shield body 81 corresponds to a second electromagnetic shield body. The electromagnetic shield body 81 includes the cooling plate 21, a shield wall, a shield lid, and a ground conductor. The wall parts 2241, 225, 226 on the back surface 21*b* of the cooling plate 21 are provided surrounding the electronic components 42, such as the electronic component 421 (SoC) and the electronic component 422 (memory) mounted in the region R4 in plan view. The through-hole 23 is provided outside the wall parts 2241, 225, 226 in plan view. The wall parts 2241, 225, 226 each correspond to the shield wall (second shield wall).

The lands 4121, 413, 414 and the via conductors 417X formed on the circuit board 40 provide a reference potential (ground potential) and are provided surrounding the electronic components 421, 422 in plan view. The lands 4121, 413, 414 are electrically connected to the cooling plate 21 through the wall parts 2241, 225, 226, respectively. The lands 4121, 413, 414 and the via conductor 417X correspond to the ground conductor (second ground conductor). The ground layer 418X formed on the circuit board 40 is provided enclosing the lands 4121, 413, 414 and the via conductor 417X in plan view. The ground layer 418X is electrically connected to the cooling plate 21 through the via conductor 417X, the lands 4121, 413, 414, and the wall parts 2241, 225, 226. The ground layer 418X corresponds to a second shield lid.

As described above, the electronic component 421 (SoC) and the electronic component 422 (memory) are disposed inside the electromagnetic shield body 81. The electronic components 421, 422 are disposed in an electromagnetic shielding space formed by the electromagnetic shield body 81. The electromagnetic shield body 81 functions as a noise return path. The electromagnetic shield body 81 shields noise due to a shielding effect. Thus, noise generated by the electronic components 421, 422 can be restricted from affecting the circuit board 30, particularly the electronic components 321, 322 through the through-hole 23. Additionally, noise generated by the electronic components 321, 322 can be restricted from affecting the circuit board 40, particularly the electronic components 421, 422 through the through-hole 23. Double electromagnetic shield walls formed by the electromagnetic shield bodies 80, 81 exist between the electronic components 321, 322 and the electronic components 421, 422, i.e., between the region R1 and the region R4. Thus, influence of noise between the circuit boards 30, 40 can be more effectively restricted.

The electronic device 10 may include only the electromagnetic shield body 81. In this case, the circuit board 40 corresponds to the first circuit board, and the electronic components 421, 422 each correspond to the first electronic component.

Although the example has been described in which the electronic device 10 includes the two circuit boards 40 (401, 402), the present disclosure is not limited thereto. Only one circuit board 40 may be provided, or three or more circuit boards may be provided. For example, when there is one circuit board 40, only one through-hole 23 may be provided.

Each of the via conductors 317X, 319X, 417X, 419 may be one via conductor, or a plurality of via conductors connected in the Z direction.

Second Embodiment

This embodiment is a modification based on the preceding embodiment, and the description of the preceding embodiment can be incorporated. In the preceding embodiment, the connectors 34, 44 are pulled out from a common surface of the housing 60. Alternatively, the connector 44 may be pulled out from a surface different a surface from which the connector 34 is pulled out. The connector 44 may be configured to be pulled out from a selected surface.

Figure 18:
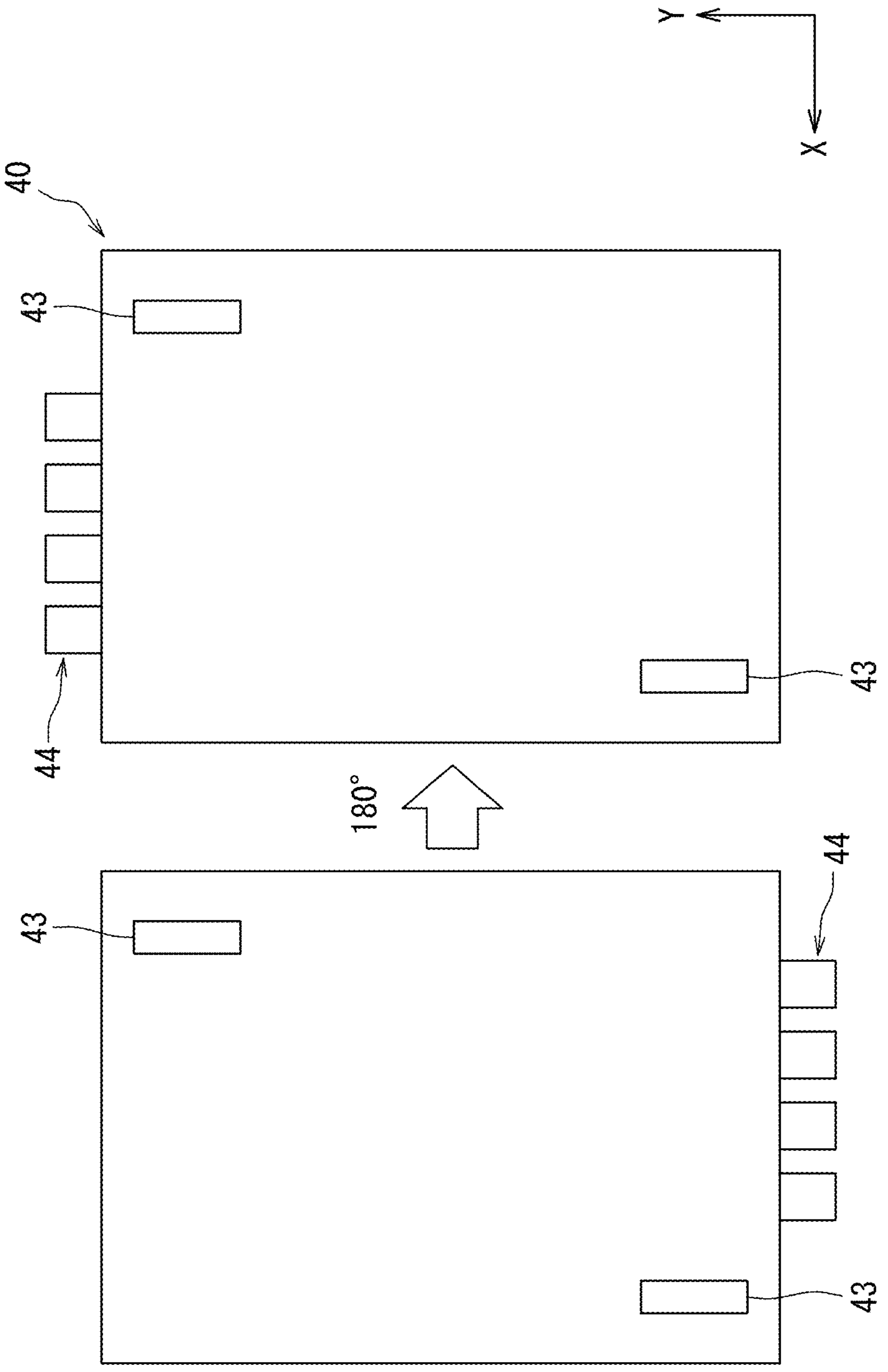
FIG. 18 is a plan view illustrating a circuit board on a back surface side in an electronic device according to a second embodiment.

FIG. 18 is a plan view illustrating an example of the circuit board 40 in the electronic device 10 according to a second embodiment. As illustrated in FIG. 18, the printed circuit board 41 in the circuit board 40 has a shape having two-fold rotational symmetry about a Z axis. The printed circuit board 41 is equipped with two connectors 43. The two connectors 43 are disposed having two-fold rotational symmetry about the Z axis. Although not illustrated, a through-hole for exposing the connector 44 is also provided in the side plate 64 of the housing 60.

Thus, even when the circuit board 40 is rotated by 180° about the Z axis, the connector 43 can be disposed in the through-hole 23 of the cooling plate 21. The printed circuit board 41 also can be disposed in a predetermined space. Although not illustrated, a through-hole for exposing the connector 44 is also provided in the side plate 64 of the housing 60. Other configurations are similar to those described in the preceding embodiment.

Summary of Second Embodiment

The present embodiment enables achieving the effects described in the preceding embodiment. The printed circuit board 41 and the connector 43 have two-fold rotational symmetry about the Z axis, so that the connector 44 can be pulled out from the side plate 64 opposite to the connector 34 to the outside. The connector 44 can also be pulled out from the side plate 63 common to the connector 34. As a result, a degree of freedom in mounting in a mobile body can be increased. Although the example has been described in which the printed circuit board 41 and the connector 43 have the two-fold rotational symmetry, at least the lands 412, 413, 414, the through-hole 45, and the connector 43 may have the two-fold rotational symmetry. The printed circuit board 41 (insulating base material 411) may have an outer contour without having the two-fold rotational symmetry.

Third Embodiment

A schematic configuration of an electronic device according to a third embodiment will be described. The electronic device may be referred to as an electronic control unit (ECU). The ECU is an abbreviation for Electronic Control Unit. The electronic device may be mounted on a moving body, for example. Examples of the moving object include a vehicle, a flying object, a ship, a construction machine, and an agricultural machine. The electronic device of the present embodiment is mounted on a vehicle, for example.

Electronic Device

Figure 19:
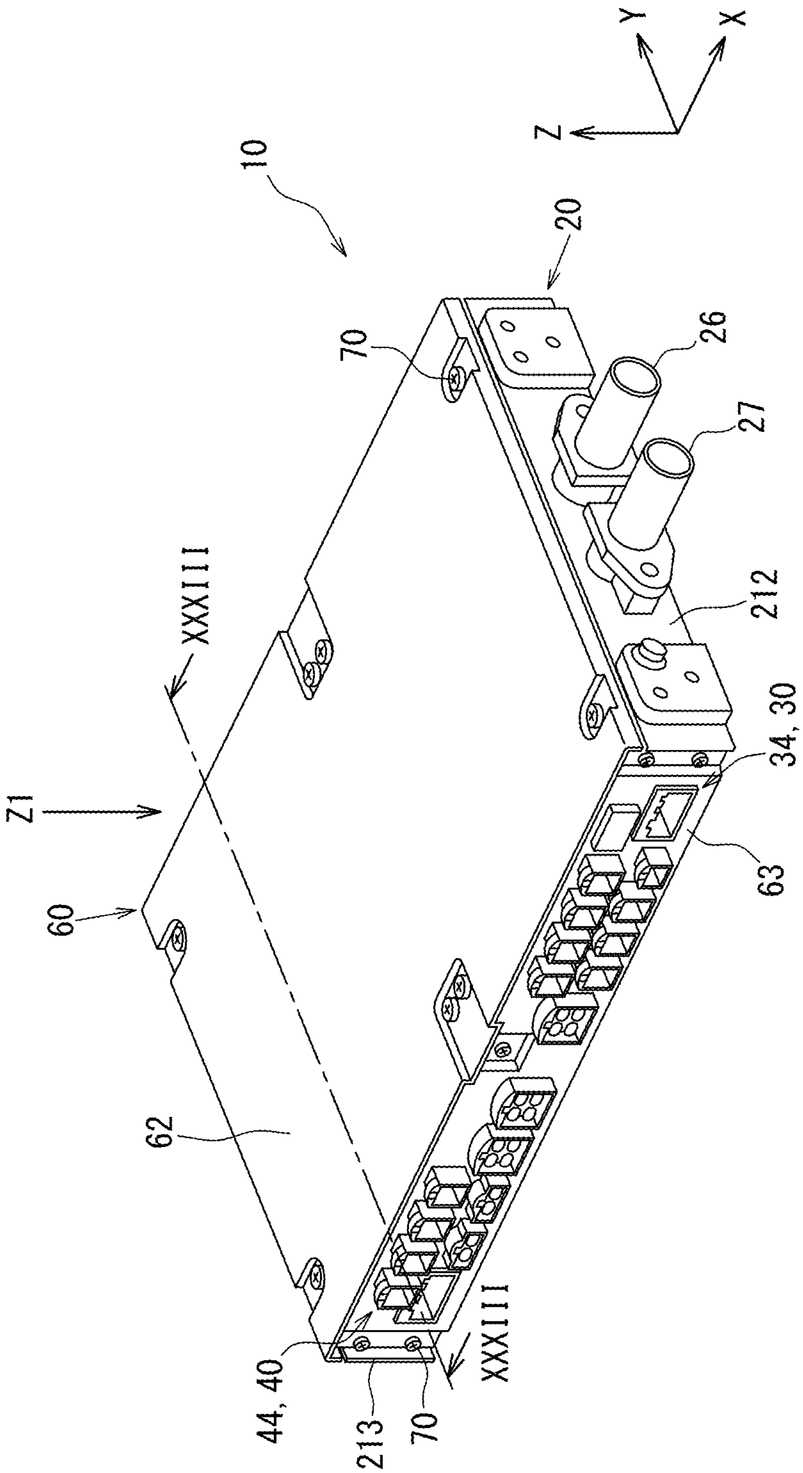
FIG. 19 is a perspective view illustrating an electronic device according to a third embodiment.
Figure 20:
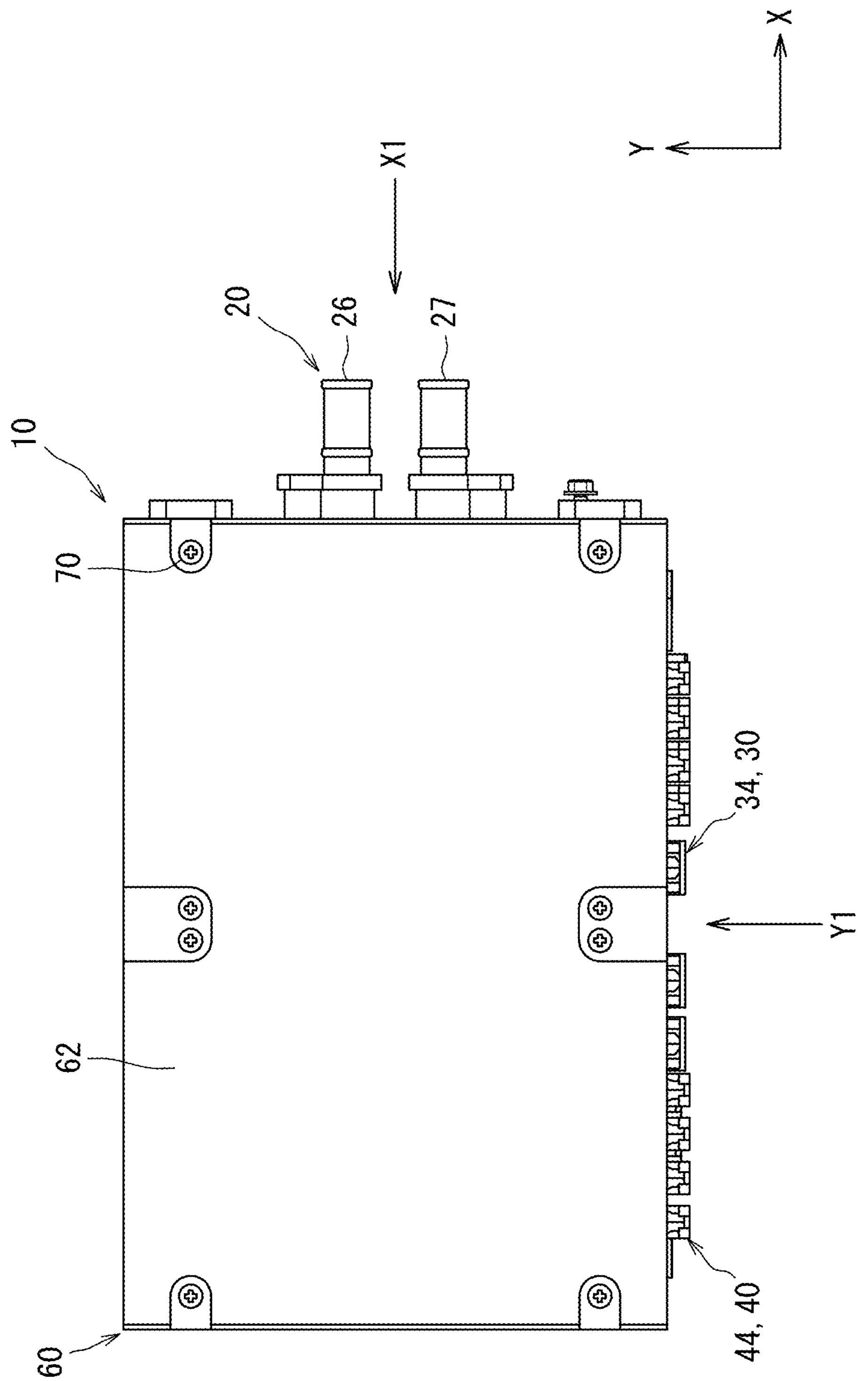
FIG. 20 is a plan view viewed from a Z1 direction illustrated in FIG. 19.
Figure 21:
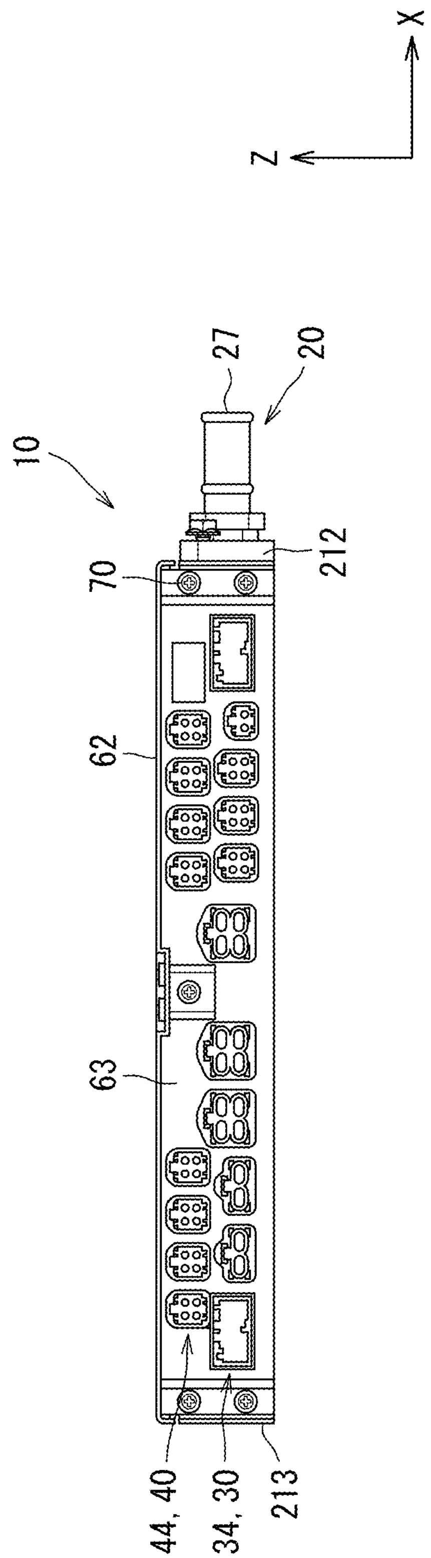
FIG. 21 is a plan view as viewed from a Y1 direction illustrated in FIG. 20.
Figure 22:
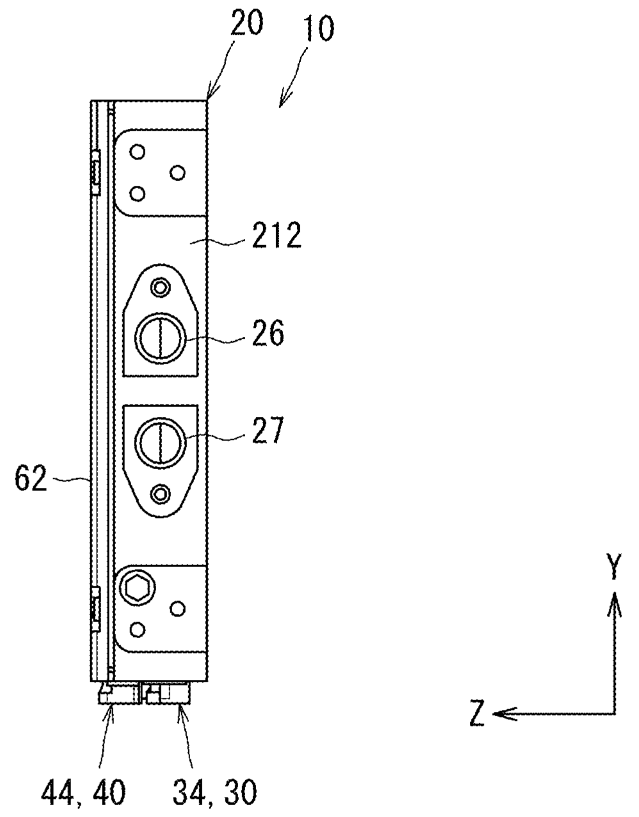
FIG. 22 is a plan view viewed from an X1 direction illustrated in FIG. 20.
Figure 23:
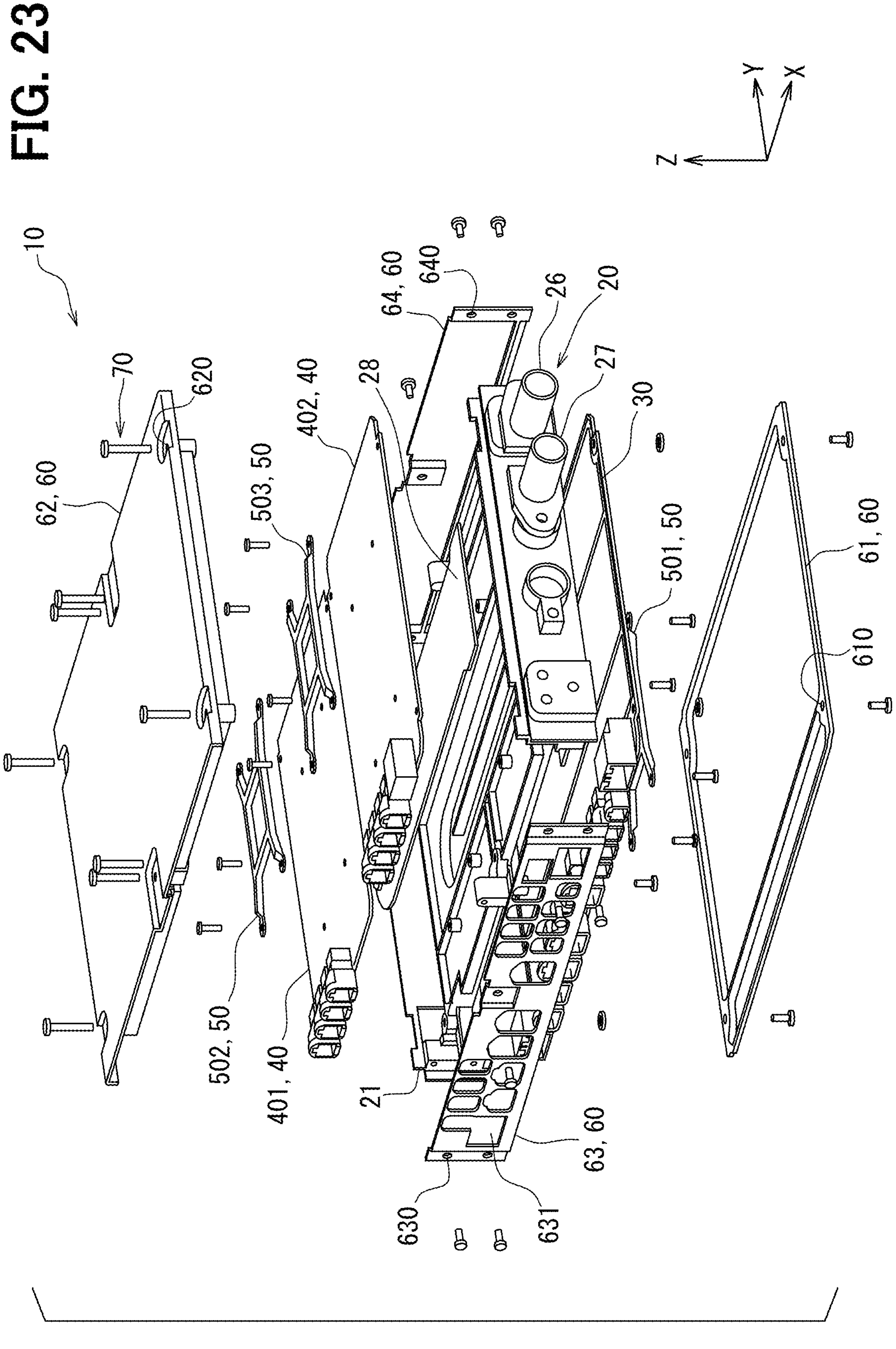
FIG. 23 is an exploded perspective view of an electronic device.

FIG. 19 is a perspective view illustrating an example of an electronic device. FIG. 20 is a plan view of the electronic device as viewed from a Z1 direction illustrated in FIG. 19. FIG. 21 is a plan view of the electronic device as viewed from a Y1 direction illustrated in FIG. 20. FIG. 22 is a plan view of the electronic device as viewed from an X1 direction illustrated in FIG. 20. FIG. 23 is an exploded perspective view of the electronic device. For convenience, FIG. 23 does not illustrate a gasket and a TIM. The TIM is an abbreviation for Thermal Interface Material.

A plate thickness direction of a cooling plate (body part) is referred to as a Z direction. One direction orthogonal to the Z direction is referred to as an X direction, and a direction orthogonal to both the Z direction and the X direction is referred to as a Y direction. Unless otherwise specified, a shape in plan view from the Z direction, in other words, a shape along an XY plane defined by the X direction and the Y direction is referred to as a planar shape. The plan view from the Z direction may be simply referred to as plan view. The Z direction corresponds to a predetermined direction.

As illustrated in FIGS. 19 to 23, an electronic device 10 includes a cooler 20, circuit boards 30, 40, a back plate 50, and a housing 60. The cooler 20 includes a cooling plate 21. The circuit board 30 is disposed on one surface of the cooling plate 21 in the Z direction. The circuit board 40 is disposed on a back surface of the cooling plate 21. The back plate 50 is disposed on a surface of each of the circuit boards 30, 40, the surface being opposite to a surface facing the cooling plate 21. The housing 60 constitutes at least a part of an outer shell (outer surface) of the electronic device 10.

As illustrated, the electronic device 10 has a substantially rectangular shape in plan view in the Z direction. The electronic device 10 has a length in the Z direction, the length being shorter than a length in the X direction and a length in the Y direction. The electronic device 10 has a low height structure that is thin in the Z direction.

Cooler

Figure 24:
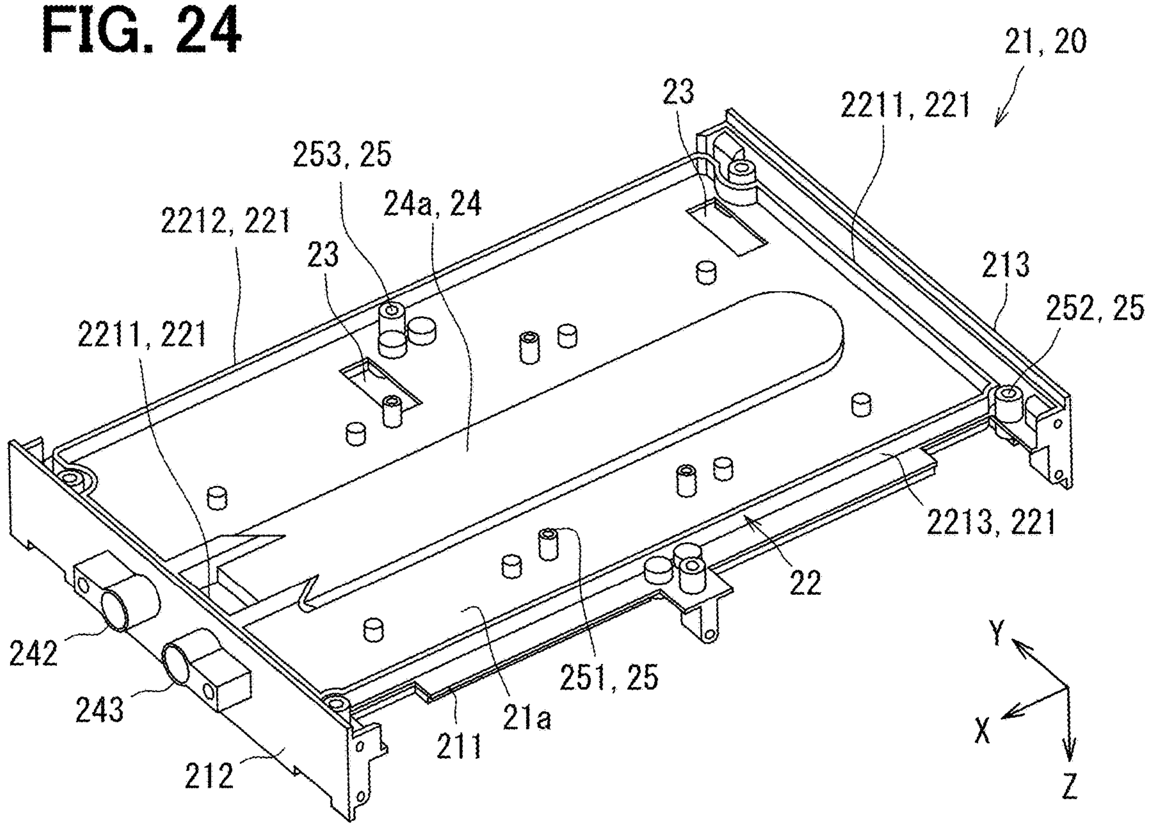
FIG. 24 is a perspective view illustrating one surface side of a cooling plate.
Figure 25:
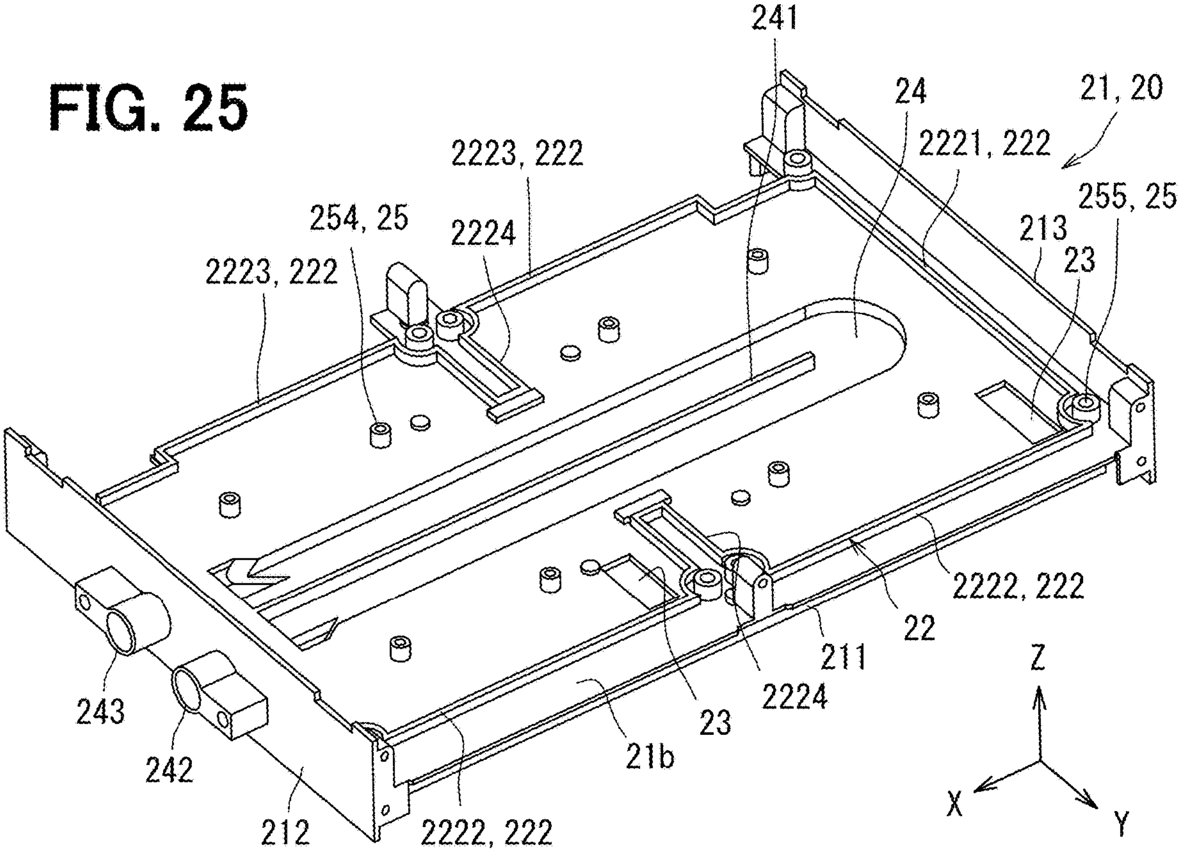
FIG. 25 is a perspective view illustrating a back surface side of a cooling plate.
Figure 26:
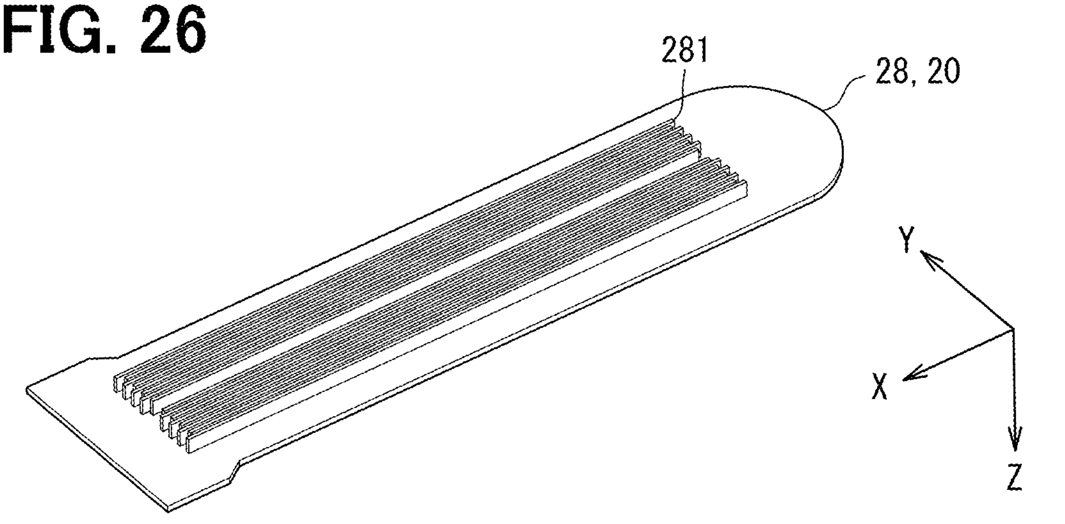
FIG. 26 is a perspective view illustrating a flow path cover.

FIGS. 24 and 25 are each a perspective view illustrating the cooling plate of the cooler. FIG. 24 illustrates one surface side of the cooling plate, and FIG. 25 illustrates a back surface side thereof. FIG. 26 is a perspective view illustrating a flow path cover.

As illustrated in FIGS. 19 to 26, the cooler 20 includes the cooling plate 21 described above. The cooling plate 21 includes a wall part 22, a through-hole 23, a flow path 24, and a fixing part 25. The cooler 20 includes an introduction pipe 26, a discharge pipe 27, and a flow path cover 28 in addition to the cooling plate 21.

The cooling plate 21 has one surface 21*a* and a back surface 21*b* opposite to the one surface 21*a* in the Z direction. The cooling plate 21 cools the circuit board 30 disposed on the one surface 21*a* and the circuit board 40 disposed on the back surface 21*b*. The cooling plate 21 cools especially electronic components mounted on the circuit boards 30, 40, the electronic components generating a large amount of heat. The cooling plate 21 is made of a metal material such as aluminum.

The cooling plate 21 includes a body part 211 and side plate parts 212, 213. The one surface 21*a* is one surface of the body part 211, and the back surface 21*b* is a back surface of the body part 211. The body part 211 has a plate thickness direction in the Z direction. The body part 211 has a substantially rectangular shape in plan view with a longitudinal direction in the X direction. In the X direction, the side plate part 212 is connected to one of ends of the body part 211, and the side plate part 213 is connected to the other of the ends of the body part 211. The side plate parts 212, 213 each have a plate thickness direction in the X direction. The side plate parts 212, 213 each have a substantially rectangular shape with a longitudinal direction in the Y direction in plan view from the X direction. The side plate parts 212, 213 are each connected to the body part 211 at an intermediate position in the Z direction. The cooling plate 21 has a substantially H shape when viewed from the Y direction. The side plate parts 212,213 constitute an outer shell of the electronic device 10 together with the housing 60.

The wall part 22 has a predetermined height in the Z direction. As illustrated in FIG. 24, the wall part 22 includes a wall part 221 provided on the one surface 21*a*. The wall part 221 protrudes from the one surface 21*a*. The wall part 221 is provided overlapping an outer peripheral edge part of the circuit board 30, specifically, a land 312 in plan view. The wall part 221 is provided along an outer periphery of a body part 211. The wall part 221 has a ring shape forming a substantial rectangle in plan view with a longitudinal direction in the X direction.

The wall part 221 includes wall parts 2211, 2212, 2213. The wall parts 2211 are provided near respective ends of the body part 211 in the X direction. One of the wall parts 2211 is provided near a side plate part 212, and the other of the wall parts 2211 is provided near a side plate part 213. The wall parts 2211 each extend substantially in the Y direction. The wall parts 2212, 2213 are connected to the wall parts 2211. The wall part 2212 is provided near one end of the body part 211 in the Y direction, and the wall part 2213 is provided near the other end of the body part 211 in the Y direction. The wall parts 2212, 2213 each extend substantially in the X direction.

As illustrated in FIG. 25, the wall part 22 includes a wall part 222 provided on a back surface 21*b*. The wall part 222 protrudes from the back surface 21*b*. The wall part 222 is provided overlapping an outer peripheral edge part of the circuit board 40, specifically, a land 412 in plan view. Most of the wall part 222 is provided along the outer periphery of the body part 211. The electronic device 10 illustrated includes two circuit boards 40. The circuit boards 40 are disposed side by side in the X direction. Thus, a part of the wall part 224 extends in the Y direction from an intermediate position in the X direction. The wall part 224 is not provided in a part overlapping the flow path 24 in plan view. The wall part 221 forms a ring shape.

The wall part 222 includes wall parts 2221, 2222, 2223, 2224. The wall parts 2221 are provided near respective ends of the body part 211 in the X direction. One of the wall parts 2221 is provided near the side plate part 212, and the other of the wall parts 2221 is provided near the side plate part 213. The wall parts 2221 each extend substantially in the Y direction. The wall parts 2222, 2223 are connected to the wall parts 2221. The wall part 2222 is provided near the one end of the body part 211 in the Y direction, and the wall part 2223 is provided near the other end of the body part 211 in the Y direction. The wall parts 2222, 2223 are divided into two corresponding to the two circuit boards 40. One of the wall parts 2222 is connected to the wall part 2221 close to the side plate part 212, and the other of the wall parts 2222 is connected to the wall part 2221 close to the side plate part 213. The same applies to the wall part 2223. The wall parts 2222, 2223 each extend substantially in the X direction.

The wall parts 2224 are each disposed facing the wall part 2221 in the X direction. The wall parts 2224 each have a substantially U shape in plan view to correspond to lands 412 of the two circuit boards 40 aligned in the X direction without crossing the flow path 24. One of the wall parts 2224 is connected to the wall part 2222, and the other of the wall parts 2224 is connected to the wall part 2223. The one of the wall parts 2224 is connected at one end to the wall part 2222 close to the side plate part 212, and at the other end to the wall part 2222 close to the side plate part 213. The same applies to the wall part 2224 connected to the wall part 2223.

The through-hole 23 is provided to electrically connect the circuit board 30 and the circuit board 40. The through-hole 23 passes through the body part 211 of the cooling plate 21 in the Z direction to be open to the one surface 21*a* and the back surface 21*b*. The cooling plate 21 includes two through-holes 23 corresponding to the two circuit boards 40. The through-holes 23 are provided near the corresponding wall parts 2212, 2222 in the Y direction. The through-holes 23 are provided between the corresponding wall parts 2212, 2222 and the flow path 24 in the Y direction.

The flow path 24 is provided overlapping at least a heat generating component in plan view to effectively cool the circuit boards 30, 40, especially the heat generating component. The flow path 24 extends in a direction in which the two circuit boards 40 are aligned, i.e., extends along the X direction. The flow path 24 is provided overlapping a heat generating component of the circuit board 30 and heat generating components of the two circuit boards 40 in plan view. The flow path 24 is provided near the center of the body part 211 in the Y direction. The flow path 24 is provided being recessed toward the one surface 21*a*. The flow path 24 includes a bottom part 24*a* having a height lower than a height of the wall part 22 on the one surface 21*a*.

The flow path 24 has a folded structure. The flow path 24 is separated by a partition wall 241 extending in the X direction and has a substantially U-shaped plane. The cooling plate 21 including the partition wall 241 allows a refrigerant to flow to near the side plate part 213 in the X direction. The side plate part 212 is provided with an introduction part 242 of a refrigerant and a discharge part 243 thereof. The introduction part 242 and the discharge part 243 passes through the side plate part 212. The refrigerant introduced from the introduction part 242 flows through the flow path 24 from the side plate part 212 toward the side plate part 213. The refrigerant returned flows through the flow path 24 from the side plate part 213 toward the side plate part 212 to be discharged through the discharge part 243. Available examples of the refrigerant include a phase-changing refrigerant such as water or ammonia, and a non-phase-changing refrigerant such as ethylene glycol.

The introduction pipe 26 is attached to the introduction part 242 of the cooling plate 21. The discharge pipe 27 is attached to the discharge part 243. The introduction pipe 26 is for supplying a refrigerant to the cooler 20. The discharge pipe 27 is for discharging the refrigerant from the cooler 20. Attachment positions of the introduction pipe 26 and the discharge pipe 27 are not particularly limited. The introduction pipe 26 and the discharge pipe 27 may be attached to a common surface or may be attached to respective surfaces different from each other. The electronic device 10 exemplified includes the introduction pipe 26 and the discharge pipe 27 that are attached to the side plate part 212.

The flow path cover 28 is a member covering the flow path 24. The flow path cover 28 is made of a metal material such as aluminum as with cooling plate 21. The flow path cover 28 has a peripheral edge part that is joined liquid-tightly to a peripheral part of the flow path 24 in the body part 211 of the cooling plate 21. The flow path cover 28 is provided on its surface with a plurality of fins 281, the surface facing the cooling plate 21. Each of the fins 281 has a predetermined height in the Z direction and extends in the X direction. The plurality of fins 281 is aligned in the Y direction. The fins 281 are provided to increase a contact area with the refrigerant, and enhance heat exchange with the refrigerant, i.e., cooling efficiency.

The fixing part 25 of the cooling plate 21 serves to fix another element of the electronic device 10 to the cooling plate 21. The fixing part 25 is a boss provided with a screw hole, for example. The fixing part 25 includes fixing parts 251, 252, 253 provided on the one surface 21*a*. The fixing part 251 is for screwing the back plate 50 (501) corresponding to the circuit board 30 and the circuit board 30. Two fixing parts 251 are provided side by side in the X direction between the wall part 2212 and the flow path 24. Other two fixing parts 251 are provided side by side in the X direction between the wall part 2213 and the flow path 24. The four fixing parts 251 are provided near the center of the cooling plate 21 in the X direction.

The fixing part 252 is for screwing a cover 61 and the circuit board 30. Four fixing parts 252 are provided near four respective corners of the body part 211. The fixing parts 252 are provided outside the wall part 221. The fixing part 253 is for screwing the circuit board 30. The fixing part 253 is provided near the center of the cooling plate 21 in the X direction. One of two fixing parts 253 is provided near the wall part 2212, and the other is provided near the wall part 2213.

The fixing part 25 includes fixing parts 254, 255 provided on the back surface 21*b*. The fixing part 254 is for screwing the back plate 50 (502,503) corresponding to the circuit board 40 and the circuit board 40 (401, 402). Four fixing parts 254 are provided at respective positions overlapping a circuit board 401 in plan view, and other four fixing parts 254 are provided at respective positions overlapping a circuit board 402 in plan view. Two of the fixing parts 254 corresponding to the circuit board 401 are provided side by side in the X direction between the wall part 2222 and the flow path 24, and the other two are provided side by side in the X direction between the wall part 2223 and the flow path 24. The same applies to the fixing parts 254 corresponding to the circuit board 402.

The fixing part 255 is for screwing a cover 62 and the circuit board 40. The fixing part 255 is provided outside the wall part 222. Four of eight fixing parts 255 are provided at respective positions overlapping four corners of a circuit board 401, and the other four are provided at respective positions overlapping four corners of a circuit board 402. The four fixing parts 255 are provided near four respective corners of the body part 211, and the other four fixing parts 255 are provided near the center of the cooling plate 21 in the X direction.

Circuit Board

Figure 27:
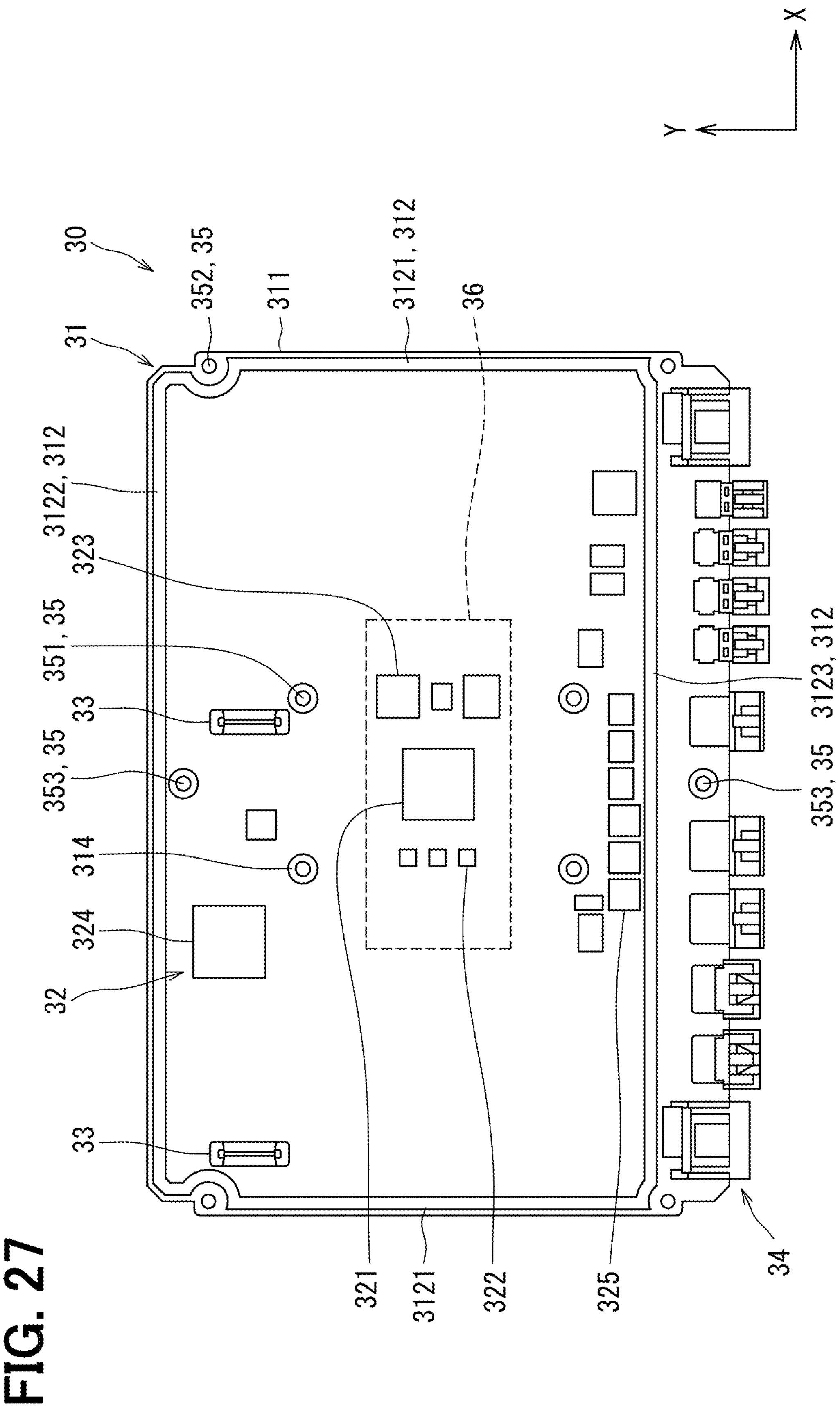
FIG. 27 is a plan view illustrating a circuit board disposed on one surface side.
Figure 28:
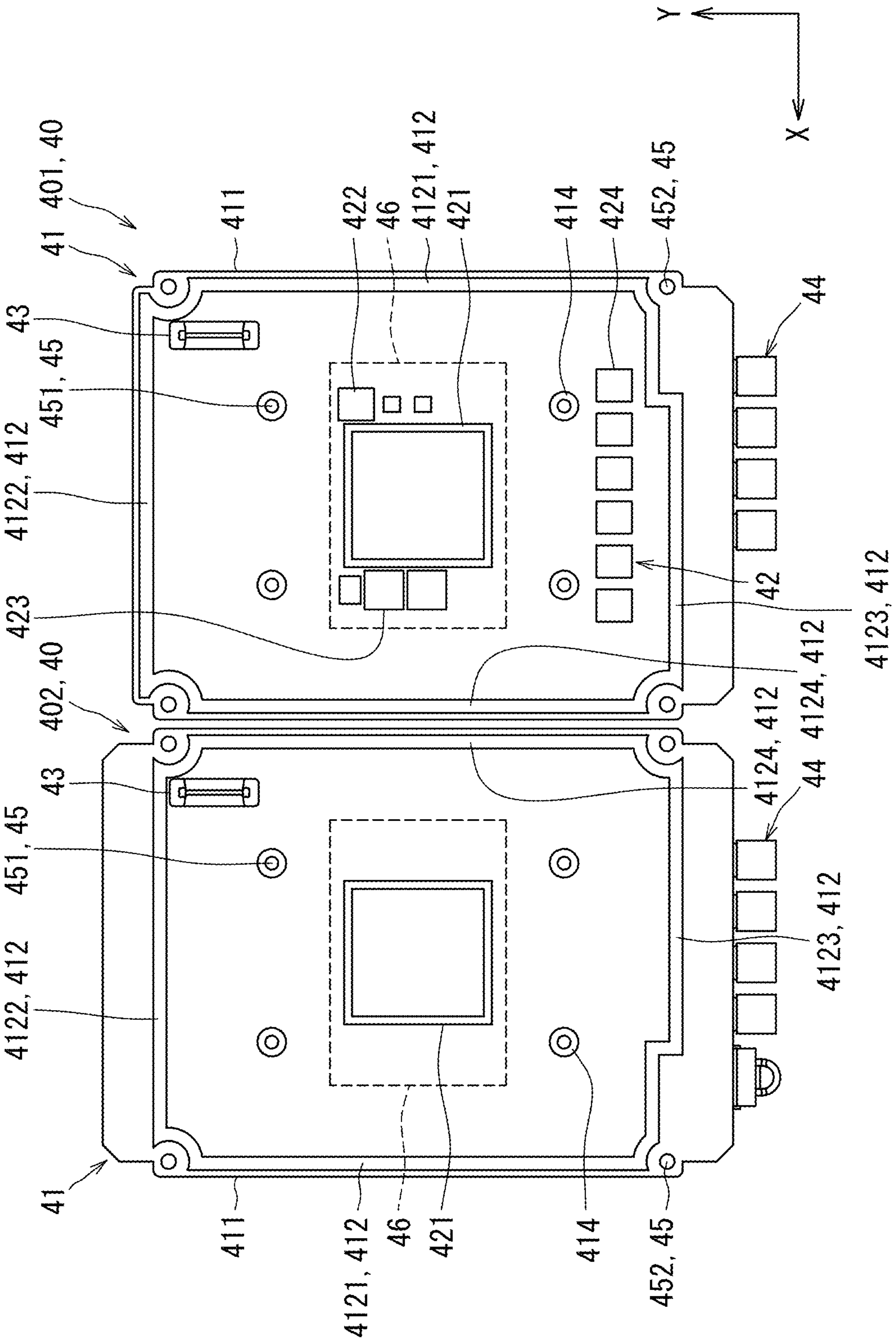
FIG. 28 is a plan view illustrating a circuit board disposed on a back surface side.
Figure 29:
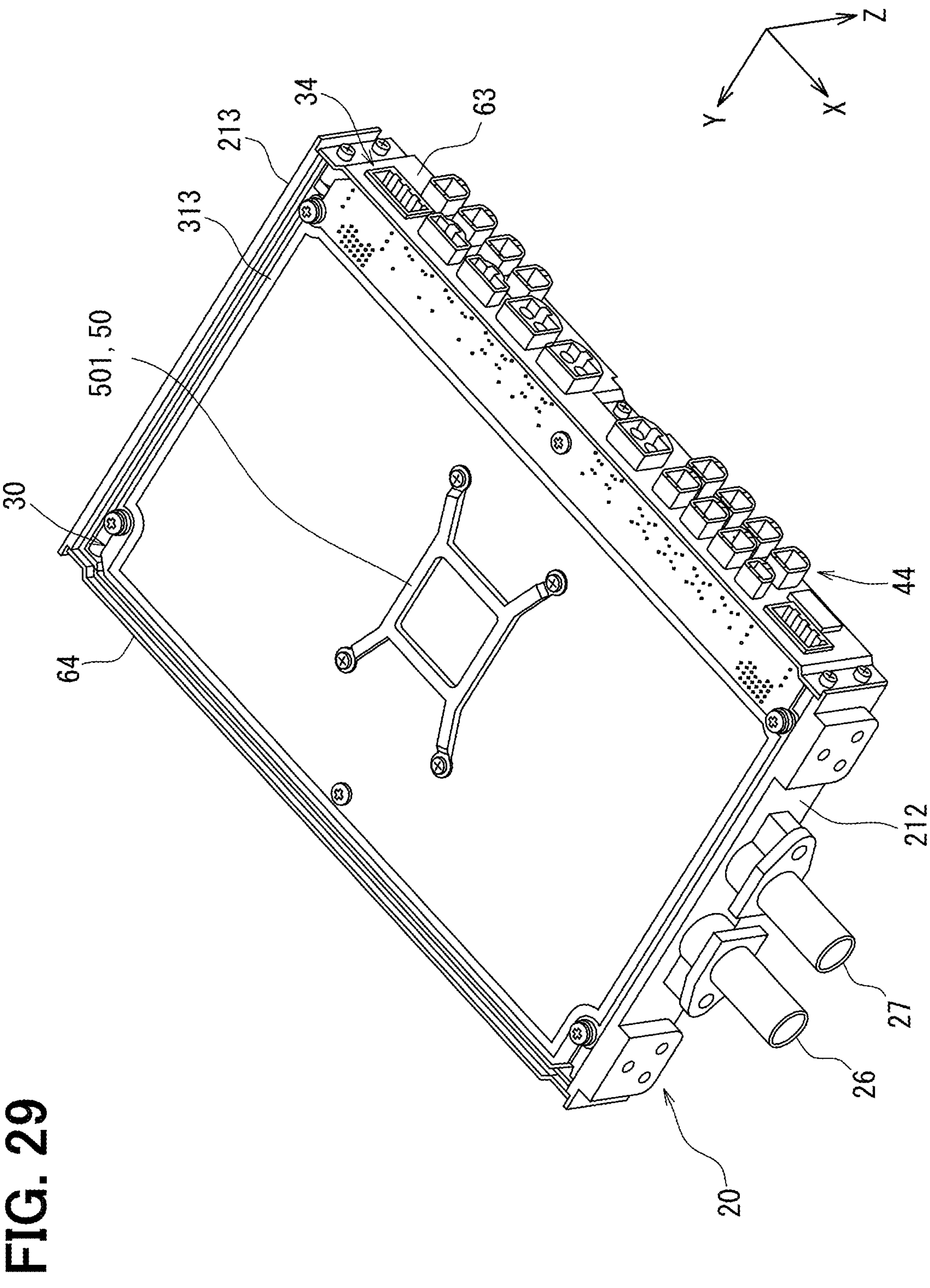
FIG. 29 is a perspective view illustrating a state in which a cover on one surface side is removed.
Figure 30:
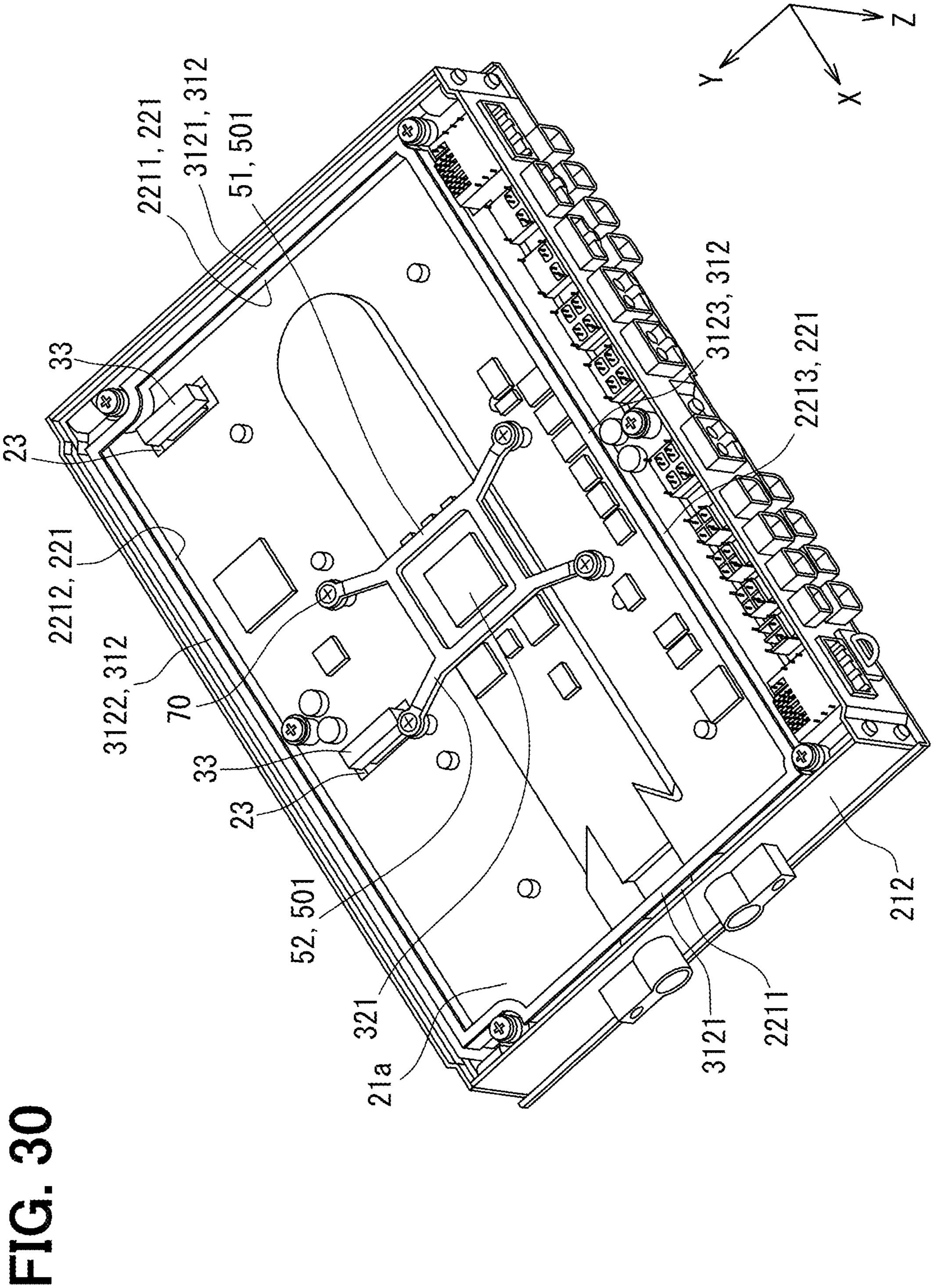
FIG. 30 is a perspective view illustrating a positional relationship among a wall part, an electronic component, a land corresponding to the wall part, and a back plate on one surface side.
Figure 31:
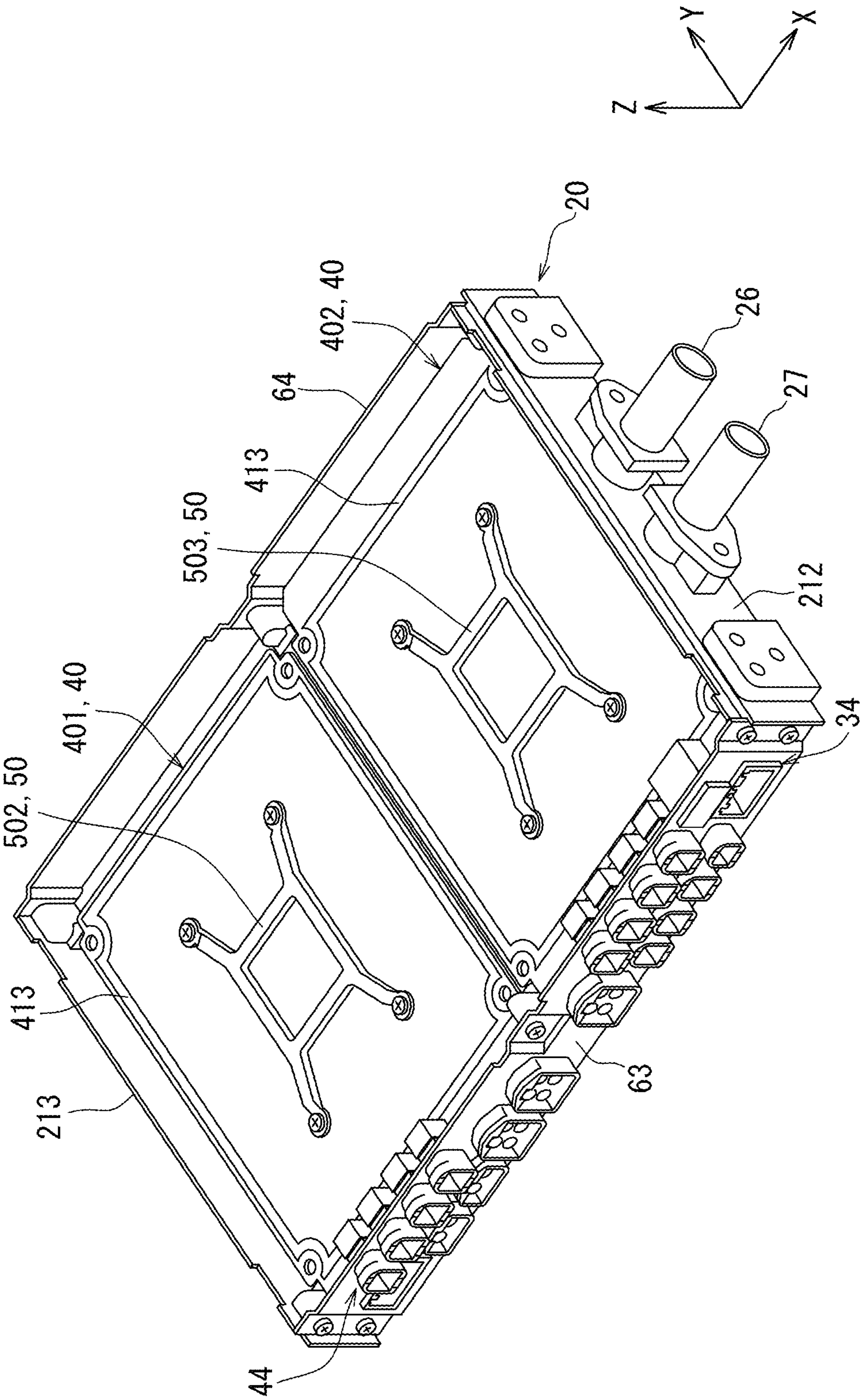
FIG. 31 is a perspective view illustrating a state in which a cover on a back surface side is removed.
Figure 32:
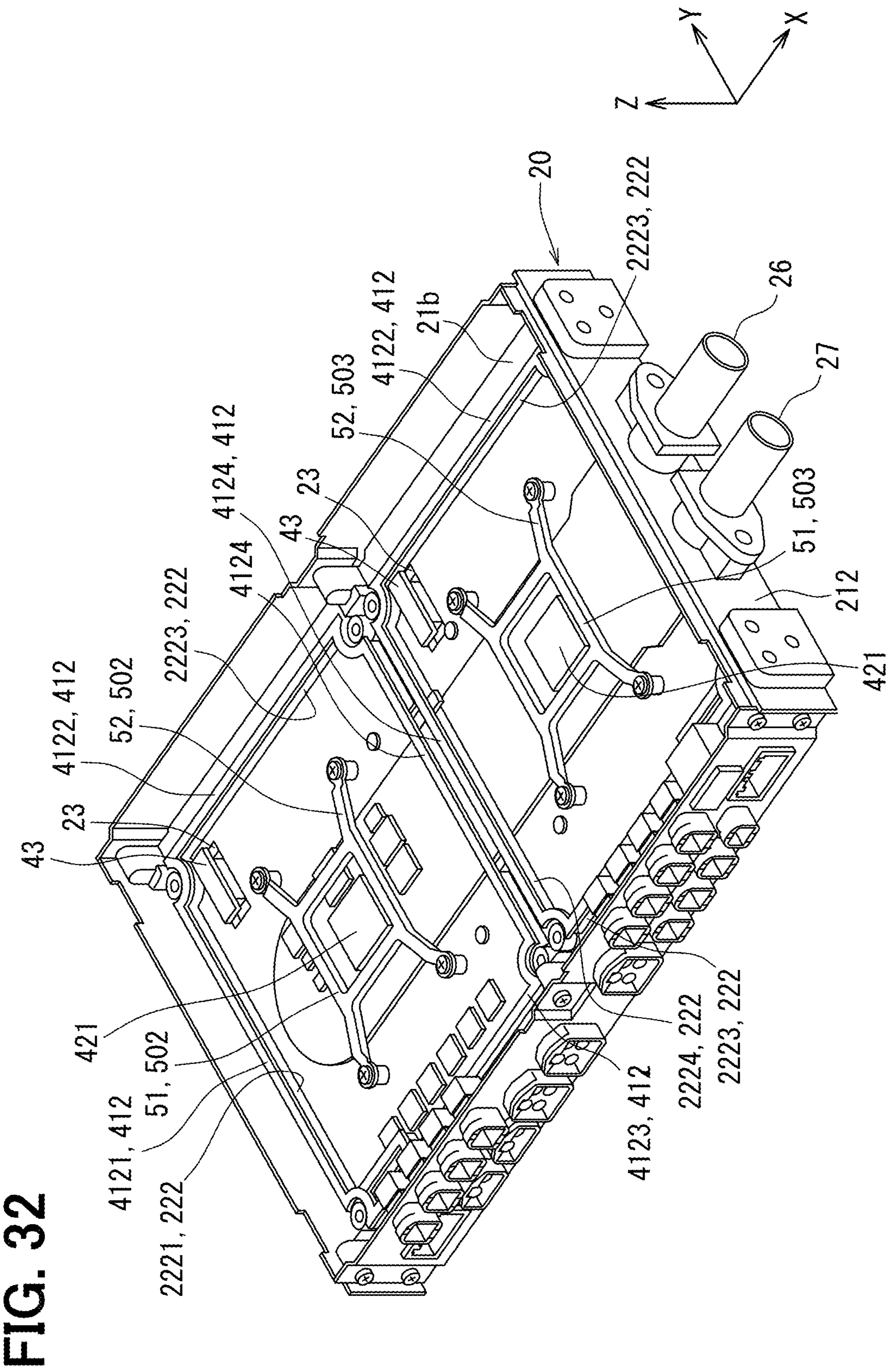
FIG. 32 is a perspective view illustrating a positional relationship among a wall part, an electronic component, a land corresponding to the wall part, and a back plate on a back surface side.

FIG. 27 is a plan view illustrating the circuit board disposed facing one surface of the cooling plate. FIG. 28 is a plan view illustrating the circuit board disposed facing a back surface of the cooling plate. FIGS. 27 and 28 each illustrate a shield cover with a broken line to indicate an electronic component covered with the shield cover, for convenience. FIG. 29 is a diagram illustrating a state in which a cover on one surface side is removed in the electronic device. FIG. 30 is a diagram in which some of elements constituting the circuit board are removed from FIG. 29. FIG. 30 illustrates a positional relationship among a wall part, an electronic component, a land, and a back plate on the one surface side. FIG. 31 is a diagram illustrating a state in which a cover on the back surface side is removed in the electronic device. FIG. 32 is a diagram in which some of the elements constituting the circuit board are removed from FIG. 31. FIG. 32 illustrates a positional relationship among a wall part, an electronic component, a land, and a back plate on the back surface side. FIGS. 27, 28, 30, and 32 each illustrate only a land corresponding to a wall part provided on a surface of a printed circuit board, the surface facing the cooling plate, as a conductor of the printed circuit board, for convenience. For example, a land corresponding to the shield cover is removed. Only some of electronic components are illustrated. FIGS. 30 and 32 illustrate no shield cover. For convenience, no solder resist is illustrated.

As described above, the circuit board 30 is disposed on the one surface 21*a* of the cooling plate 21. The circuit board 40 is disposed on the back surface 21*b* of the cooling plate 21. The circuit boards 30, 40 are disposed to sandwich the cooling plate 21 in the Z direction. The circuit board 30 is a base board, and the circuit board 40 is an expansion board. The circuit board 30 is equipped with a function that is not changed depending on a vehicle type, a specification, or the like, i.e., a common function. The circuit board 40 is for expanding a function as opposed to the base board. The circuit board 40 is equipped with an additional function suitable for a vehicle type or a specification. The circuit board 40 can be replaced in accordance with a vehicle type or a specification.

For example, the circuit board 30 is equipped with a primary power supply system, an IVI function, and the like. IVI is an abbreviation for In-Vehicle Infotainment. The circuit board 40 is equipped with an AD function or an ADAS function. AD is an abbreviation for Autonomous driving system. ADAS is an abbreviation for Advanced Driving Assistant System.

The circuit board 30 includes a printed circuit board 31, an electronic component 32, and connectors 33, 34. The printed circuit board 31 has a planar shape that is not particularly limited. The printed circuit board 31 illustrated has a substantially rectangular shape in plan view. The printed circuit board 31 in the electronic device 10 has a plate thickness direction that is substantially parallel to the Z direction.

The printed circuit board 31 includes an insulating base material 311 and a conductor. The insulating base material 311 is made of a material having electrical insulation properties, such as resin. As the insulating base material 311, a material containing only resin may be used, or a combination of a glass fabric, a nonwoven fabric, or the like and resin may be used, for example. The conductor is made of a metal material having good conductivity such as Cu. The conductor includes a wiring layer. The wiring layer may be referred to as a wiring, a wiring pattern, a conductor pattern, or the like. The wiring layer may be formed by patterning metal foil, or may be formed by printing, for example. Multiple wiring layers are disposed in the insulating base material.

The conductor may include a via conductor or a through-hole land in addition to the wiring layer. The via conductor is formed by disposing a conductor such as plating in a through-hole (via) formed in an insulating layer constituting the insulating base material 311. The via conductor electrically connects wiring layers disposed in different layers to each other, for example. The through-hole land is formed on a wall surface of the through-hole passing through the printed circuit board 31 in the Z direction. The through-hole land may be formed around an opening together with the wall surface of the through-hole.

The conductor includes a land serving as an electrode part of the wiring layer in a surface layer of the printed circuit board 31. The conductor in the electronic device 10 illustrated includes lands 312, 313 that provide a reference potential (ground potential) in the circuit board 30. As described later, the conductor includes a via conductor and a ground layer disposed inside the insulating base material 311. Although details will be described later, the lands 312, 313 are connected to the ground layer using the via conductor. The lands 312 is electrically connected to the corresponding wall part 221 with a gasket or the like interposed therebetween. The lands 313 is electrically connected to the cover 61 with the gasket or the like interposed therebetween.

The land 312 is provided on a surface of the printed circuit board 31, the surface facing the cooling plate 21. The land 312 is provided corresponding to the wall part 221 provided on the one surface 21*a* of the cooling plate 21. The land 312 is provided along an outer periphery of the printed circuit board 31 except for a mounting part of a connector 34. The land 312 has a ring shape forming a substantial rectangle in plan view.

As illustrated in FIG. 30, the land 312 is provided overlapping the wall part 221 in plan view. The land 312 includes lands 3121, 3122, 3123. The lands 3121 are provided near respective ends of the printed circuit board 31 in the X direction. One of the lands 3121 is located near the side plate part 212, and the other of the lands 3121 is located near the side plate part 213. The lands 3121 each extend substantially in the Y direction. The lands 3122, 3123 are connected to the land 3121. The land 3122 is provided near one end of the printed circuit board 31 in the Y direction, and the land 3123 is provided opposite to the land 3122 and near the mounting part of the connector 34. The lands 3122, 3123 extend substantially in the X direction.

The land 313 is provided on a surface of the printed circuit board 31, the surface opposite to the surface facing the cooling plate 21. As with the land 312, the land 313 is provided along the outer periphery of the printed circuit board 31 except for the mounting part of the connector 34. The land 313 has a ring shape forming a substantial rectangle in plan view.

The printed circuit board 31 is provided with a through-hole 35 for fixing. The through-hole 35 includes through-holes 351, 352, 353. The through-hole 351 is for fixing the back plate 50 (501) and the circuit board 30 to the cooling plate 21. The through-hole 351 is provided overlapping the fixing part 251 in plan view. Two of four through-holes 351 are provided closer to the land 3122 than the center of the printed circuit board 31 in the Y direction, and are aligned in the X direction. The other two are provided closer to the land 3123 than the center of the printed circuit board 31 in the Y direction, and are aligned in the X direction.

The through-hole 352 is for fixing the cover 61 and the circuit board 30 to the cooling plate 21. The through-hole 352 is provided overlapping the fixing part 252 in plan view. The through-hole 352 is provided outside the land 312. Four through-holes 352 are provided at four respective corners of the printed circuit board 31. The through-hole 353 is for fixing the circuit board 30 to the cooling plate 21. The through-hole 353 is provided overlapping the fixing part 253 in plan view. One of the two through-holes 353 is provided near the land 3122, and the other is provided near the land 3123. The through-holes 351, 353 are each provided on its wall surface and around its opening with a through-hole land 314.

The electronic component 32 is mounted on the printed circuit board 31. The printed circuit board 31 is equipped with a plurality of electronic components 32. The electronic components 32 form a circuit together with the conductor described above. The electronic components 32 are disposed at least on a surface of the printed circuit board 31, the surface facing the cooling plate 21. The circuit board 30 is provided with a primary power supply circuit (not illustrated) formed by the conductor and the electronic components 32.

The printed circuit board 31 in the electronic device 10 illustrated includes a central region equipped with a digital circuit that generates noise and/or is affected by noise, such as a processor, a memory, and a clock oscillator. The noise becomes more problematic particularly as operation frequency increases. The central region is equipped with a heat generating component that generates heat while operating. The electronic components 32 mounted in the central region include electronic components 321, 322, 323. The electronic component 321 includes a processor, a memory, and the like. The processor constructs a plurality of functional parts by executing a control program stored in the memory. The electronic component 321 is a SoC, for example. The SoC is an abbreviation for System on Chip. As the electronic component 321, a microcomputer or the like may be used. The electronic component 322 is a memory such as a flash or a ROM. The ROM is an abbreviation for Read Only Memory. The electronic component 323 is a power supply IC constituting a secondary power supply circuit. The number of each of the electronic components 321, 322, 323 is not particularly limited. The number may be only one, or two or more. At least one of heat generating components may be connected to the cooling plate 21 with a heat conducting member such as a TIM.

The electronic components 32 mounted in a region between the central region and the land 3122 includes an electronic component 324. The electronic component 324 is a communication IC for high-speed data communication between the circuit boards 30, 40. The electronic component 324 is a PCI-e switch, for example. The PCI-e is an abbreviation for Peripheral Component Interconnect-express. The electronic components 32 mounted in a region between the central region and the land 3123 includes an electronic component 325. The electronic component 325 is a communication IC for communicating with a device (external device) different from the electronic device 10. The electronic component 325 is used for high-speed communication such as CAN, LVDS, GVIF, or Ethernet. The CAN, GVIF, and Ethernet are registered trademarks. The CAN is an abbreviation for Controller Area Network. The LVDS is an abbreviation for Low Voltage Differential Signaling. The GVIF is an abbreviation for Gigabit Video InterFace. The electronic component 325 may include a CAN transceiver, an EthernetPHY, and an Ethernet switch, for example.

The connectors 33, 34 are mounted on the printed circuit board 31. The connector 33 is for electrically connecting the circuit board 30 and the circuit board 40. The connector 33 is mounted at a position overlapping the through-hole 23 in plan view. The connector 33 is mounted in the same region as the electronic component 324. The connector 34 is for electrically connecting an external device and the circuit board 30. The connector 34 includes a connector used for the high-speed communication described above. The connector 34 is disposed between an end of the printed circuit board 31 and the land 3123 in the Y direction.

The circuit board 30 further includes a shield cover 36. The shield cover 36 is a metal plate material made of a material such as nickel silver containing Cu, for example. The shield cover 36 is mounted on the printed circuit board 31. The shield cover 36 is electrically connected to a corresponding land as described later. The shield cover 36 is disposed on a surface of the printed circuit board 31 while covering the electronic components 32 that generate noise and/or are affected by noise, the surface facing the cooling plate 21. The shield cover 36 in the electronic device 10 illustrated is disposed in the central region to cover the electronic components 321, 322, 323. Detailed structure of the shield cover 36 will be described later.

The circuit board 40 is similar in configuration to the circuit board 30. The circuit board 40 includes a printed circuit board 41, an electronic component 42, and connectors 43, 44. The electronic device 10 illustrated includes two circuit boards 401, 402 as the circuit board 40. The two circuit boards 401, 402 are disposed side by side in the X direction. Each of the circuit boards 401, 402 has a size of approximately ½ of the circuit board 30 in plan view. The circuit boards 401, 402 each have a substantially rectangular shape in plan view, for example. The printed circuit board 41 in the electronic device 10 has a plate thickness direction that is substantially parallel to the Z direction.

The printed circuit board 41 in each circuit board 40 includes an insulating base material 411 and a conductor. The conductor includes a land in a surface layer of the printed circuit board 41. The conductor in the electronic device 10 illustrated includes lands 412, 413 that provide a ground potential. As described later, the conductor includes a via conductor and a ground layer disposed inside the insulating base material 411. Although details will be described later, the lands 412, 413 are connected to the ground layer using the via conductor. The land 412 is electrically connected to the corresponding wall part 222 with a conductive gasket or the like interposed therebetween. The lands 413 is electrically connected to the cover 62 with the gasket or the like interposed therebetween.

The land 412 is provided on a surface of the printed circuit board 41, the surface facing the cooling plate 21. The land 412 is provided corresponding to the wall part 222 provided on the back surface 21*b* of the cooling plate 21. The land 412 is provided along an outer periphery of the printed circuit board 41 except for a mounting part of the connector 44. The land 412 has a ring shape forming a substantial rectangle in plan view.

As illustrated in FIG. 32, the land 412 is provided overlapping the wall part 222 in plan view. The land 412 includes lands 4121, 4122, 4123, 4124. The land 4124 is disposed along each of adjacent sides of the two respective circuit boards 401, 402. The land 4124 extends substantially in the Y direction. The land 4121 is disposed along a side opposite to the land 4124 on each of the circuit boards 401, 402. The land 4121 extends substantially in the Y direction. Each of the circuit boards 401, 402 includes the land 4121 provided near one end of the printed circuit board 41 in the X direction, and the land 4124 provided near the other end thereof.

The lands 4122, 4123 are connected to the lands 4121, 4124. The land 4122 is provided near one end of each printed circuit board 41 in the Y direction, and the land 4123 is provided opposite to the land 4122 and near the mounting part of the connector 44. The lands 4122, 4123 extend substantially in the X direction.

The land 413 is provided on a surface of the printed circuit board 41, the surface opposite to the surface facing the cooling plate 21. The land 413 is provided along the outer periphery of the printed circuit board 41 except for the mounting part of the connector 44. The land 413 has a ring shape forming a substantial rectangle in plan view.

The printed circuit board 41 is provided with a through-hole 45 for fixing. The through-hole 45 includes through-holes 451, 452. The through-hole 451 is for fixing the corresponding back plate 50 and circuit board 40 to the cooling plate 21. The through-hole 451 is provided overlapping the fixing part 254 in plan view. Two of four through-holes 451 in each printed circuit board 41 are provided closer to the land 4122 than the center of the printed circuit board 41 in the Y direction, and are aligned in the X direction. The other two are provided closer to the land 4123 than the center of the printed circuit board 41 in the Y direction, and are aligned in the X direction.

The through-hole 452 is for fixing the cover 62 and the circuit board 40 to the cooling plate 21. The through-hole 452 is provided overlapping the fixing part 255 in plan view. The through-hole 452 is provided outside the land 412. Four through-holes 452 are provided at four respective corners of the printed circuit board 41. The through-hole 451 is provided on its wall surface and around its opening with a through-hole land 414.

The electronic component 42 is mounted on the printed circuit board 41. The printed circuit board 41 is equipped with a plurality of electronic components 42. The electronic components 42 are disposed at least on a surface of the printed circuit board 41, the surface facing the cooling plate 21. The two circuit boards 40 include the circuit board 402 in which only an electronic component 421 is illustrated as the electronic component 42.

The printed circuit board 41 includes a central region equipped with digital circuits that generate noise and/or are affected by noise, such as a processor, a memory, and a clock oscillator. The central region is equipped with a heat generating component that generates heat while operating. The electronic components 42 mounted in the central region include electronic components 421, 422, 423. The electronic component 421 includes a processor, a memory, and the like. The electronic component 421 is a SoC, for example. As the electronic component 421, a microcomputer or the like may be used. The electronic component 422 is a memory such as a flash or a ROM. The electronic component 423 is a power supply IC constituting a secondary power supply circuit. At least one of heat generating components disposed in the central region may be connected to the flow path cover 28 of the cooler 20 with a heat conducting member such as a TIM. The number of each of the electronic components 421, 422, 423 is not particularly limited. The number may be only one, or two or more.

The electronic components 42 mounted in a region between the central region and the land 4123 includes an electronic component 424. The electronic component 424 is a communication IC for communicating with an external device. The electronic component 424 is a serializer or a deserializer used for high-speed communication such as the GVIF, for example.

The connectors 43, 44 are mounted on the printed circuit board 41. The connector 43 is for electrically connecting the circuit board 30 and the circuit board 40. The connector 43 is mounted at a position overlapping the through-hole 23 in plan view. The connector 43 is disposed in a region between the central region and the land 4122. The connectors 33, 43 may be referred to as BtoB connectors. Instead of the connectors 33, 43, a flat wire or a flexible board may be used. The connectors 34, 44 each correspond to a connector. The connector 44 is for electrically connecting the circuit board 40 and an external device. Connectors include a connector used for the high-speed communication described above.

The circuit board 40 further includes a shield cover 46. As with the shield cover 36, the shield cover 46 is a metal plate material made of a material such as nickel silver containing Cu, for example. The shield cover 46 is mounted on the printed circuit board 41. The shield cover 46 is electrically connected to a corresponding land as described later. The shield cover 46 is disposed on a surface of the printed circuit board 41 while covering the electronic components 42 that generate noise and/or are affected by noise, the surface facing the cooling plate 21. The shield cover 46 in the electronic device 10 illustrated is disposed in the central region to cover the electronic component 421 and the like. Detailed structure of the shield cover 46 will be described later.

Back Plate

As illustrated in FIGS. 23 to 25 and FIGS. 29 to 32, the back plate 50 presses the circuit boards 30, 40 against the cooling plate 21. The back plate 50 has spring properties, and presses the circuit boards 30, 40 against the cooling plate 21 (cooler 20) using a reaction force due to spring deformation. The back plate 50 is disposed on a surface of each of the circuit boards 30, 40, the surface being opposite to a surface facing the cooling plate 21, i.e., is disposed on a back surface thereof. The back plate 50 includes back plates 501, 502, 503. The back plate 501 is disposed on the circuit board 30. The back plate 502 is disposed on the circuit board 401. The back plate 503 is disposed on the circuit board 402. The back plates 501, 502, 503 each have a common structure, for example.

The back plate 50 includes a frame part 51 and a leg part 52. The frame part 51 has a ring shape forming a substantial rectangle in plan view. The frame part 51 of the back plate 501 is provided surrounding the electronic component 321 in plan view. The back plates 502, 503 each include the frame part 51 provided surrounding the corresponding electronic component 421 in plan view. The leg part 52 extends from each of four corners of the frame part 51. The back plate 50 includes four leg parts 52. The leg parts 52 are each provided at its terminal end with a fixing hole for a screw 70. Two of the leg parts 52 aligned in the X direction include terminal ends at an interval wider than an interval between their connection ends with the frame part 51. The leg parts 52 each extend in an oblique direction from the frame part 51. The frame part 51 and the leg parts 52, which are in a screwed state, press the corresponding circuit boards 30, 40 against the cooling plate 21 (cooler 20) using spring reaction force.

In plan view, the frame part 51 of the back plate 501 is provided at a position overlapping the central region of printed circuit board 31. The two leg parts 52 extend from the central region to a region between the central region and the land 3122 in plan view. The other two leg parts 52 extend from the central region to a region between the central region and the land 3123 in plan view. The screw 70 attached to each of the leg parts 52 of back plate 501 is inserted through the through-hole 351 of the printed circuit board 31 to be fastened to the fixing part 251 of the cooling plate 21.

In plan view, the frame part 51 of the back plate 502 is provided at a position overlapping the central region of printed circuit board 41. The two leg parts 52 extend from the central region to a region between the central region and the land 4122 in plan view. The other two leg parts 52 extend from the central region to a region between the central region and the land 4123 in plan view. The screw 70 attached to each of the leg parts 52 of back plate 501 is inserted through the through-hole 451 of the printed circuit board 41 to be fastened to the fixing part 254 of the cooling plate 21.

The back plate 503 is similar to the back plate 502.

Housing

The housing 60 is made of a material capable of shielding electromagnetism. The housing 60 is made of a metal material such as aluminum or iron, for example. The housing 60 may be made of a metal material and a resin material instead of being made of a metal material. For example, metal plating may be applied to an inner surface of a resin molded body, or conductive particles may be mixed with a resin. The housing 60 in the electronic device 10 illustrated is made of a metal material.

As illustrated in FIGS. 19 to 23, the housing 60 includes covers 61, 62 and side plates 63, 64. The covers 61, 62 constitute an outer shell of the electronic device 10 in the Z direction. The cover 61 is disposed facing a back surface of the circuit board 30. The cover 61 is configured to cover the back plate 501 and the circuit board 30. The cover 61 is provided to enclose the back plate 501 and most of the circuit board 30 in plan view. In plan view, a part of the connector 34 is located outside the cover 61. The cover 61 includes a through-hole 610. The screw 70 is inserted through the through-hole 610 and the through-hole 352 of the printed circuit board 31 to be fastened to the fixing part 252 of the cooling plate 21.

The cover 62 is disposed facing a back surface of the circuit board 40 (401, 402). The cover 62 is configured to cover the back plates 502, 503 and the circuit boards 401, 402. The cover 62 is provided to enclose the back plates 502, 503 and most of the circuit boards 401, 402 in plan view. In plan view, a part of the connector 44 is located outside the cover 62. The cover 62 includes a through-hole 620. The screw 70 is inserted through the through-hole 620 and the through-hole 452 of the printed circuit board 41 to be fastened to the fixing part 255 of the cooling plate 21.

The side plates 63, 64 constitute an outer shell of the electronic device 10 in the Y direction. The side plate 63 is disposed close to the connectors 34, 44. The side plate 63 includes through-holes 630, 631. The screw 70 is inserted through the through-hole 630 to be fastened to the fixing part of the cooling plate 21. The through-hole 631 is provided corresponding to the connectors 34, 44 to expose a part of the connectors 34, 44 to the outside of the electronic device 10. The side plate 64 is disposed opposite to the connectors 34, 44 in the Y direction. The side plate 64 includes a through-hole 640. The screw 70 is inserted through the through-hole 640 to be fastened to the fixing part of the cooling plate 21. As described above, the side plate parts 212, 213 of the cooling plate 21 also function as the housing 60. The side plate parts 212, 213 constitute an outer shell of the electronic device 10 in the X direction.

Electromagnetic Shield Body and Cooling Structure

Figure 33:
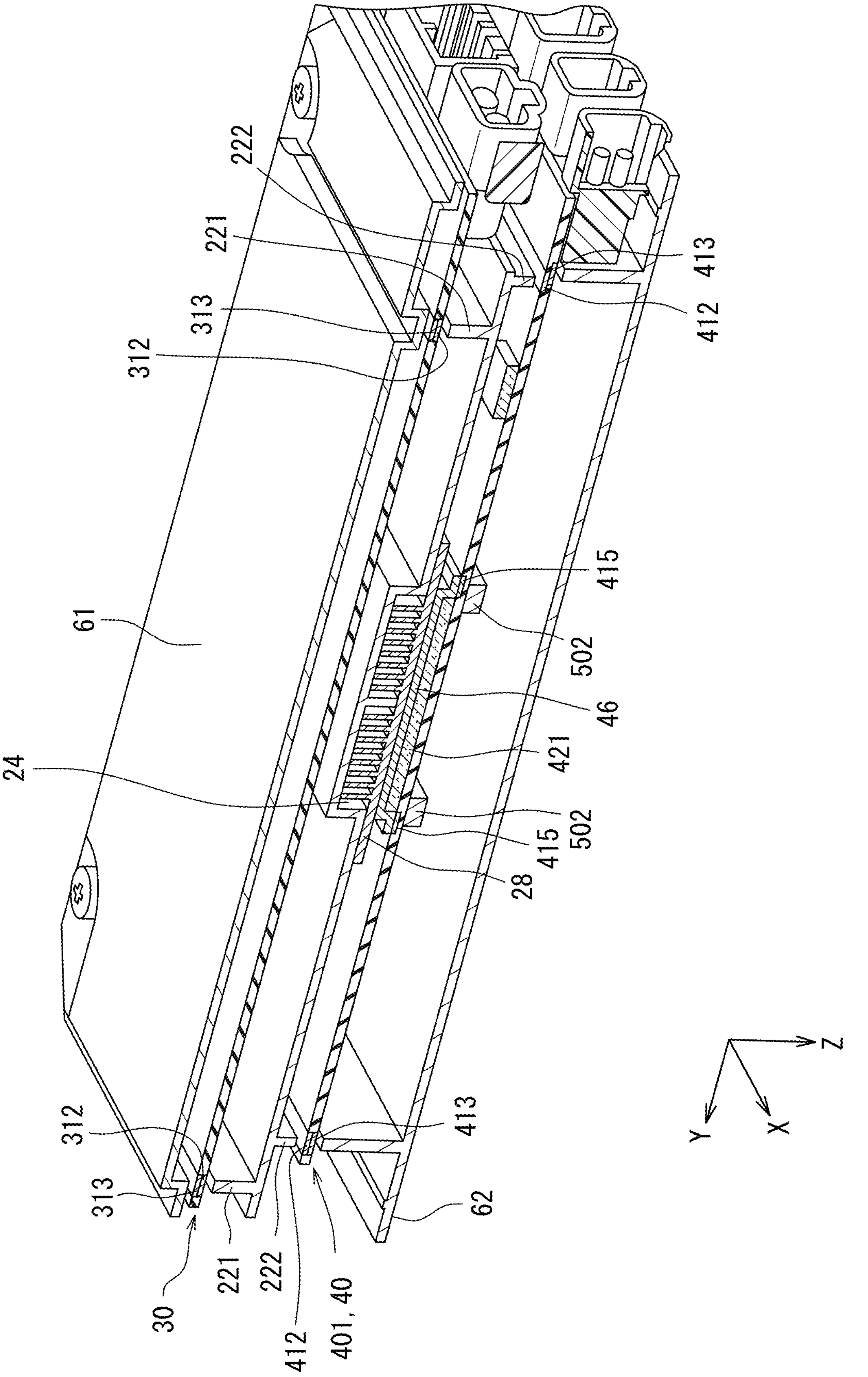
FIG. 33 is a sectional view taken along line XXXIII-XXXIII of FIG. 19.
Figure 34:
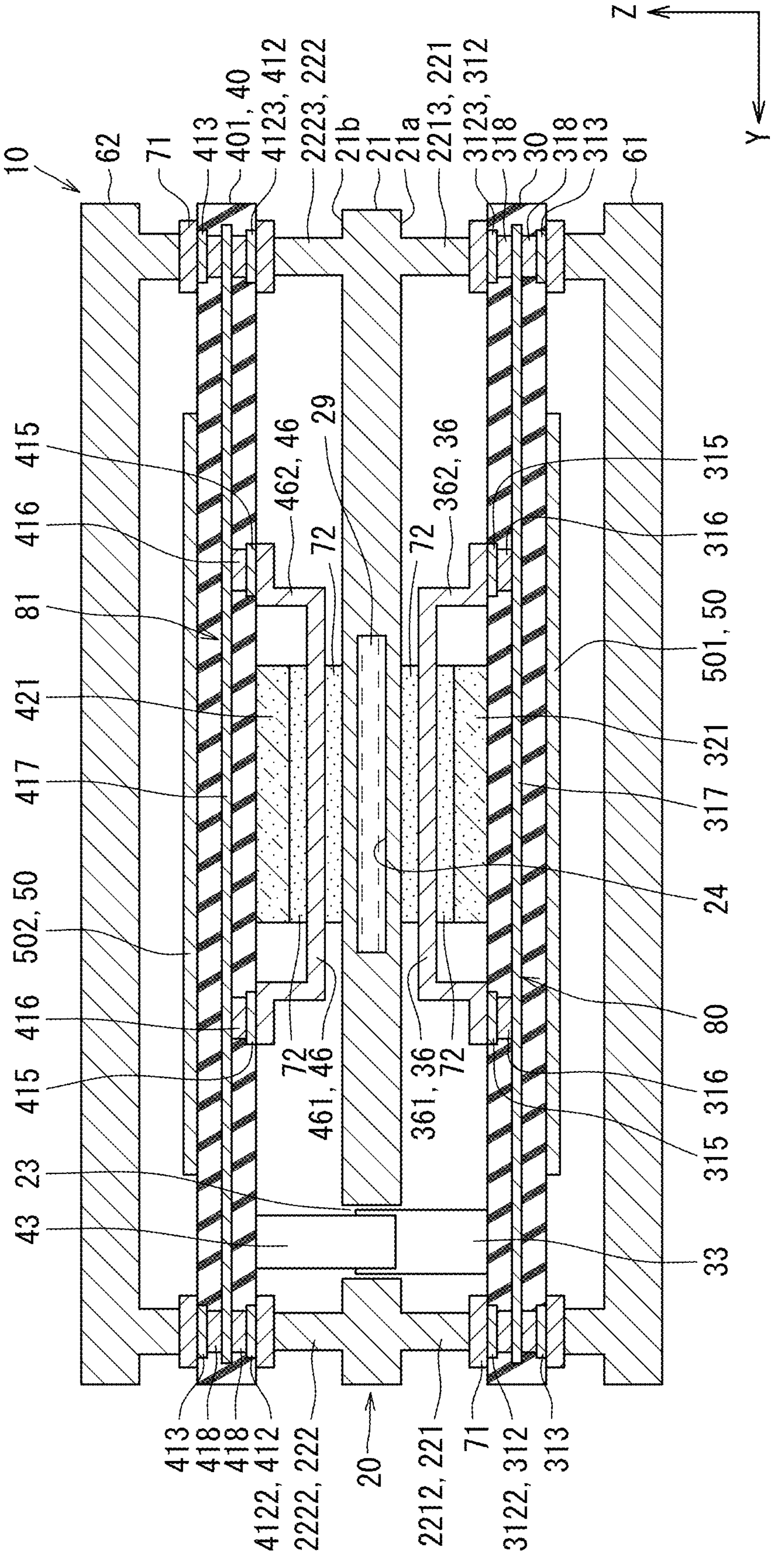
FIG. 34 is a sectional view illustrating an electromagnetic shield body configured in an electronic device.
Figure 35:
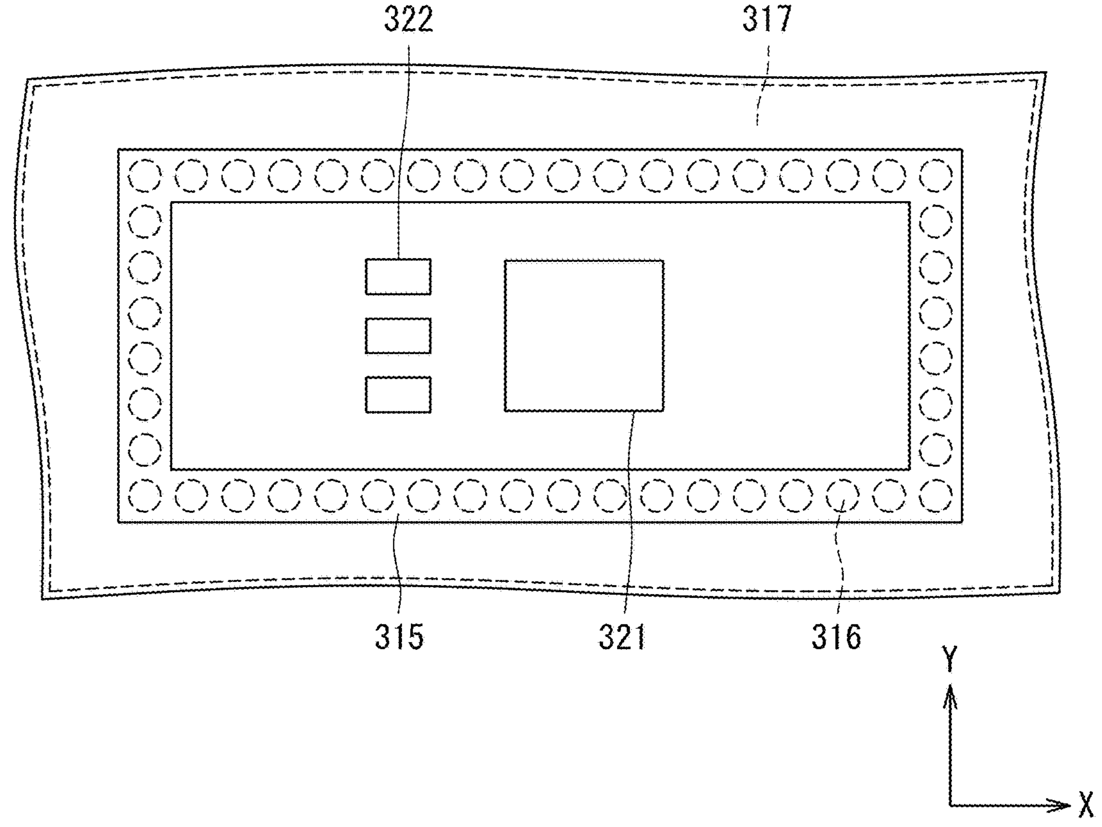
FIG. 35 is a plan view illustrating a land, a via conductor, and a ground layer constituting an electromagnetic shield body.

FIG. 33 is a sectional view taken along line XXXIII-XXXIII of FIG. 19. For convenience, FIG. 33 does not illustrate a gasket and a TIM. FIG. 34 is a sectional view illustrating an electromagnetic shield body configured in the electronic device. FIG. 34 is an image diagram illustrating a heat generating component, a through-hole, and a component of an electromagnetic shield body in a common section. FIG. 35 is a plan view illustrating elements of the electromagnetic shield body in the circuit board.

A refrigerant 29 flows through the flow path 24 of the cooling plate 21. The electronic device 10 includes an electromagnetic shield body 80. The electromagnetic shield body 80 may be disposed covering a specific circuit element formed on the circuit board 30 and causing noise, or may be disposed covering a specific circuit element for which influence of noise from the outside is desired to be restricted. The electromagnetic shield body 80 includes a land 315, a plurality of via conductors 316, a ground layer 317, and the shield cover 36. The electromagnetic shield body 80 in the electronic device 10 illustrated accommodates the electronic components 32 mounted in a central region of the printed circuit board 31, such as the electronic component 321 (SoC), and the electronic component 322 (memory).

As illustrated in FIG. 34, the electronic device 10 includes a conductive gasket 71 and a TIM 72. The gasket 71 is provided along the wall part 221, for example. The gasket 71 is provided over the entire length of the wall part 221. The gasket 71 is interposed between the wall parts 2211, 2212, 2213 and the lands 3121, 3122, 3123 to electrically connect the wall parts 2211, 2212, 2213 to the corresponding lands 3121, 3122, 3123. The wall part 221 forming a ring shape are electrically connected to the land 312 forming a ring shape over the entire length.

As illustrated in FIG. 35, the via conductors 316 electrically connect the land 315 to the ground layer 317. The ground layer 317 is a so-called solid ground. The ground layer 317 is disposed in most of a plane. The ground layer 317 in the electronic device 10 illustrated is an inner layer ground disposed inside the insulating base material 311. Instead of the inner layer ground, a ground layer provided on a back surface of the insulating base material 411 may be used. The plurality of via conductors 316 is provided at predetermined intervals along the land 315 forming the ring shape. The interval between the corresponding via conductors 316 is preferably equal to or less than ½ wavelength of a frequency of noise to be blocked. To block noise of a plurality of frequencies, the interval is preferably set to equal to or less than ½ wavelength of the lowest frequency. The interval is more preferably equal to or less than ¼ wavelength of the frequency of the noise to be blocked. Each element constituting the electromagnetic shield body 80 is fixed at a predetermined potential (ground potential).

The shield cover 36 is provided to cover the electronic components 32 disposed in the central region as described above. The shield cover 36 is electrically connected to the land 315. The shield cover 36 in the electronic device 10 illustrated includes a top wall 361 and a side wall 362. The top wall 361 is disposed between the electronic components 32 and the cooling plate 21 in the Z direction. The top wall 361 faces an upper surface of each of the electronic components 32. The top wall 361 has a substantially rectangular shape in plan view, for example. The side wall 362 is connected to an outer peripheral end of the top wall 361. The side wall 362 has a tubular shape. The side wall 362 surrounds the electronic components 32 in the central region in plan view. The side wall 362 extends in the Z direction. The side wall 362 is connected at its lower end to the land 315. The lower end is connected to the land 315 by solder bonding, for example. The lower end of the side wall 362 forming a ring shape is electrically connected to the land 315 forming a ring shape over the entire length.

The TIM 72 transfers heat of the heat generating component mounted on the printed circuit board 31 to another member. The TIM 72 is interposed between the top wall 361 of the shield cover 36 and the cooling plate 21. The TIM 72 is interposed between at least some of the electronic components 32 accommodated in the shield cover 36 (electromagnetic shield body 80) and the top wall 361. The TIM 72 in the electronic device 10 illustrated is provided at a position overlapping the electronic component 321 (SoC) in plan view. The TIM 72 is interposed between the top wall 361 and the cooling plate 21 while being in contact with the top wall 361 and the cooling plate 21. The TIM 72 is interposed between an upper surface of the electronic component 321 and the top wall 361 while being in contact with the electronic component 321 and the top wall 361. The TIM 72 thermally connects the shield cover 36 to the cooling plate 21. The TIM 72 thermally connects the electronic component 321 to the shield cover 36. The TIM 72 thermally connects the electronic component 321 to the cooling plate 21.

The circuit board 30 further includes via conductors 318. The via conductors 318 electrically connect the land 312 to the land 313. The via conductors 318 are provided at predetermined intervals along the land 312 as with the via conductors 316. The via conductors 318 electrically connect the land 312 to the land 313 with the ground layer 317 interposed therebetween. The land 312 is electrically connected to the wall part 221 with the gasket 71 interposed therebetween. The land 312 is electrically connected to the wall part 221 over the entire length thereof. The cover 61 is electrically connected to the land 313 with the gasket 71 interposed therebetween. The gasket 71 is provided over the entire length of the land 313. The land 313 forming a ring shape is electrically connected to the cover 61 over its entire length. The via conductor 318 and the cover 61 are fixed at the ground potential.

The electronic device 10 further includes an electromagnetic shield body 81. The electromagnetic shield body 81 may be disposed covering a specific circuit element formed on the circuit board 40 and causing noise, or may be disposed covering a specific circuit element for which influence of noise from the outside is desired to be restricted. The electromagnetic shield body 81 is similar in configuration to the electromagnetic shield body 80. The electromagnetic shield body 81 includes a land 415, a plurality of via conductors 416, a ground layer 417, and the shield cover 46. The electromagnetic shield body 81 in the electronic device 10 illustrated accommodates the electronic components 42 mounted in a central region of the printed circuit board 41, such as the electronic component 421 (SoC), and the electronic component 422 (memory).

The gasket 71 is provided along the wall part 22 as described above. The gasket 71 is interposed between the wall parts 2221, 2222, 2223, 2224 and the lands 4121, 4122, 4123, 4124 to electrically connect the wall parts 2221, 2222, 2223, 2224 to the lands 4121, 4122, 4123, 4124. The wall part 222 forming a ring shape are electrically connected to the land 412 forming a ring shape over the entire length.

As with the via conductor 316, the via conductor 416 electrically connects the land 415 to the ground layer 417. The ground layer 417 is a solid ground. The ground layer 417 is disposed in most of a plane. The ground layer 417 in the electronic device 10 illustrated is an inner layer ground disposed inside the insulating base material 411. Instead of the inner layer ground, a ground layer provided on a back surface of the insulating base material 411 may be used. The plurality of via conductors 416 is provided at predetermined intervals along the land 415 forming the ring shape. The interval between the corresponding via conductors 416 is preferably equal to or less than ½ wavelength of a frequency of noise to be blocked. To block noise of a plurality of frequencies, the interval is preferably set to equal to or less than ½ wavelength of the lowest frequency. The interval is more preferably equal to or less than ¼ wavelength of the frequency of the noise to be blocked. Each element constituting the electromagnetic shield body 81 is fixed at a predetermined potential (ground potential).

The shield cover 46 is provided to cover the electronic components 42 disposed in the central region as described above. The shield cover 46 is electrically connected to the land 415. The shield cover 46 in the electronic device 10 illustrated is similar in structure to the shield cover 36. The shield cover 46 includes a top wall 461 and a side wall 462. The top wall 461 is disposed between the electronic components 42 and the cooling plate 21. The top wall 461 has a substantially rectangular shape in plan view, for example. The side wall 462 is connected to an outer peripheral end of the top wall 461. The side wall 462 has a tubular shape. The side wall 462 surrounds the electronic components 42 in the central region in plan view. The side wall 462 extends in the Z direction. The side wall 462 is connected at its lower end to the land 415. The lower end is connected to the land 415 by solder bonding, for example. The lower end of the side wall 462 forming a ring shape is electrically connected to the land 415 forming a ring shape over the entire length.

The TIM 72 transfers heat of the heat generating component mounted on the printed circuit board 41 to another member. The TIM 72 is interposed between the top wall 461 of the shield cover 46 and the cooling plate 21. The TIM 72 is interposed between at least some of the electronic components 42 accommodated in the shield cover 46 (electromagnetic shield body 81) and the top wall 461. The TIM 72 in the electronic device 10 illustrated is provided at a position overlapping the electronic component 421 (SoC) in plan view. The TIM 72 is interposed between the top wall 461 and the cooling plate 21 while being in contact with the top wall 461 and the cooling plate 21. The TIM 72 is interposed between an upper surface of the electronic component 421 and the top wall 461 while being in contact with the electronic component 421 and the top wall 461. The TIM 72 thermally connects the shield cover 46 to the cooling plate 21. The TIM 72 thermally connects the electronic component 421 to the shield cover 46. The TIM 72 thermally connects the electronic component 421 to the cooling plate 21.

The circuit board 40 further includes via conductors 418. The via conductors 418 electrically connect the land 412 to the land 413. The via conductors 418 are provided at predetermined intervals along the land 412 as with the via conductors 416. The via conductors 418 electrically connect the land 412 to the land 413 with the ground layer 417 interposed therebetween. The land 412 is electrically connected to the wall part 222 with the gasket 71 interposed therebetween. The land 412 is electrically connected to the wall part 222 over the entire length thereof. The cover 62 is electrically connected to the land 413 with the gasket 71 interposed therebetween. The gasket 71 is provided over the entire length of the land 413. The land 413 forming a ring shape is electrically connected to the cover 62 over its entire length. The via conductor 418 and the cover 62 are fixed at the ground potential.

Summary of Third Embodiment

According to the present embodiment, the circuit board 30 is disposed facing the one surface 21*a* of the cooling plate 21, and the circuit board 40 is disposed facing the back surface 21*b* thereof. The circuit boards 30, 40 are electrically connected through the through-hole 23 of the cooling plate 21. Thus, the circuit boards 30, 40 can be simplified in connection structure.

Providing the through-hole in the cooling plate may cause noise generated by an electronic component mounted on one of the circuit boards to affect an electronic component mounted on the other of the circuit boards. In the present embodiment, the electronic device 10 includes the electromagnetic shield body 80. The electromagnetic shield body 80 includes a shield base, a ground conductor, and the shield cover 36. The shield cover 36 in the electronic device 10 illustrated is provided covering the electronic components 32 mounted on the central region of the printed circuit board 31, such as the electronic component 321 (SoC) and the electronic component 322 (memory), in plan view. The shield cover 36 is provided to accommodate the electronic components 32. The electronic components 321, 322 each correspond to the first electronic component. The circuit board 30 corresponds to a first circuit board.

The land 315 and the via conductors 316 formed on the circuit board 30 provide a reference potential (ground potential) and are provided surrounding the electronic components 321, 322 in plan view. The land 315 and the via conductors 316 correspond to a ground conductor. The ground layer 317 formed on the circuit board 30 is provided enclosing the land 315 and the via conductors 316 in plan view. The shield cover 36 is electrically connected to the ground layer 317 through the land 315 and the via conductors 316. The ground layer 317 corresponds to the shield base.

As described above, the electronic component 321 (SoC) and the electronic component 322 (memory) are disposed inside the electromagnetic shield body 80. The components are disposed in an electromagnetic shielding space formed by the electromagnetic shield body 80. The electromagnetic shield body 80 functions as a noise return path. The electromagnetic shield body 80 shields noise due to a shielding effect. The through-hole 23 is provided outside the electromagnetic shield body 80. Thus, noise generated by the electronic components 321, 322 can be restricted from affecting the circuit board 40, particularly the electronic component 421 (SoC) and the electronic component 422 (memory) through the through-hole 23. Additionally, noise generated by the electronic components 421, 422 can be restricted from affecting the circuit board 30, particularly the electronic components 321, 322 through the through-hole 23. The circuit board 40 corresponds to a second circuit board. The electronic components 421, 422 each correspond to a second electronic component. The electronic device 10 may include only the electromagnetic shield body 81. In this case, the circuit board 40 corresponds to the first circuit board, and the electronic components 421, 422 each correspond to the first electronic component.

The electromagnetic shield body 80 is configured using the shield cover 36 mounted on the printed circuit board 31. The cooling plate 21 is not used as an element of the electromagnetic shield body 80, so that the cooling plate 21 can be simplified in structure. The shield cover 36 is one of components mounted on the printed circuit board 31, and can take various forms. Thus, a degree of freedom in design can be improved as compared with a configuration in which the cooling plate 21 is one of elements of the electromagnetic shield body 80.

As illustrated, the electronic device 10 may include a heat conducting member that transfers heat generated by the first electronic component. The TIM 72 in the electronic device 10 illustrated corresponds to the heat conducting member. The TIM 72 transfers heat generated by the electronic component 321, for example. As a result, heat dissipation of the electronic component 321 can be improved while influence of noise is suppressed.

As illustrated, the TIM 72 may be interposed between the top wall 361 of the shield cover 36 and the cooling plate 21. The TIM 72 also may be interposed between the electronic component 321 (first electronic component) and the top wall. When the TIM 72 is disposed above and below the top wall 361, heat generated by the electronic component 321 is transferred to the cooling plate 21 through the TIM 72, the top wall 361 of the shield cover 36, and the TIM 72, for example. Thus, the heat dissipation of the electronic component 321 can be further improved while influence of noise is suppressed.

As illustrated, the electronic device 10 may include the back plate 50 (501) that presses the circuit board 30 against the cooling plate 21. The back plate 501 may be disposed crossing the shield cover 36 in plan view, and may be fixed to the cooling plate 21 at a position not overlapping the shield cover 36. As a result, the circuit board 30 (printed circuit board 31) can be restricted from being warped by heat. In particular, deterioration in heat dissipation due to a gap generated between the TIM 72 and the shield cover 36 and/or the cooling plate 21, for example, can be restricted in a configuration including the TIM 72.

As illustrated, the ground layer 317 may serve as the shield base. Alternatively, the cover 61 constituting the housing 60 serve as the shield base. Using the ground layer 317 enables simplification of configuration. The ground layer 317 may be disposed in an inner layer of the printed circuit board 31, or may be disposed on a surface of the printed circuit board 31, the surface being opposite to a surface thereof facing the cooling plate 21.

The cover 61 in the electronic device 10 illustrated is also electrically connected to the land 315 through the via conductor 318, the ground layer 317, and the via conductor 316. The electronic device 10 includes an electromagnetic shield body including the shield cover 36, the land 315, the via conductor 316, the ground layer 317, the via conductor 318, the land 313, and the cover 61. The electronic device 10 includes an electromagnetic shield body including the cooling plate 21, the wall part 221, the land 312, the via conductor 318, the ground layer 317, the via conductor 318, the land 313, and the cover 61. As a result, influence of disturbance noise can be restricted. Additionally, emission of noise to the outside of the electronic device 10 can be restricted.

As illustrated, the circuit board 30 may include the electronic component 321 (SoC) as the first electronic component disposed inside the electromagnetic shield body 80. As a result, noise generated by the SoC can be restricted from affecting the circuit board 40 through the through-hole 23. Additionally, noise generated by the circuit board 40 can be restricted from affecting the SoC. As described above, the SoC can be cooled by the cooling plate 21 while influence of noise is restricted.

Modification

Figure 36:
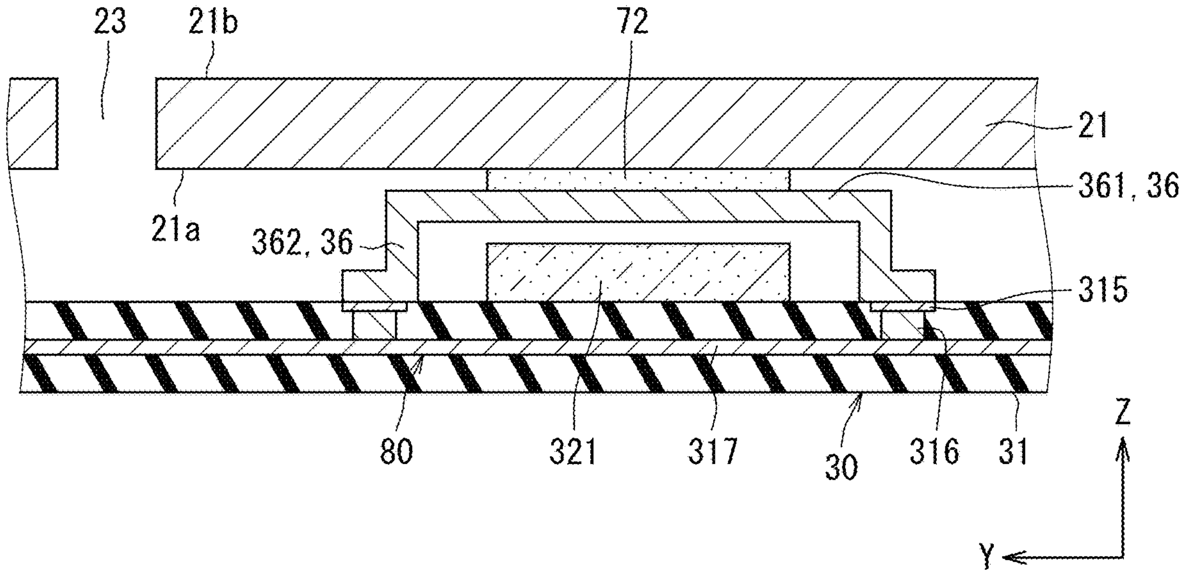
FIG. 36 is a diagram illustrating a modification.

Placement of the TIM 72 serving as a heat conducting member is not limited to the above example. For example, the TIM 72 may be disposed only between the top wall 361 of the shield cover 36 and the cooling plate 21 as illustrated in FIG. 36. This structure allows heat of the electronic component 321 to be transferred to the cooling plate 21 through the circuit board 30, the shield cover 36, and the TIM 72. Thus, the heat dissipation of the electronic component 321 can be improved while influence of noise is suppressed.

Figure 37:
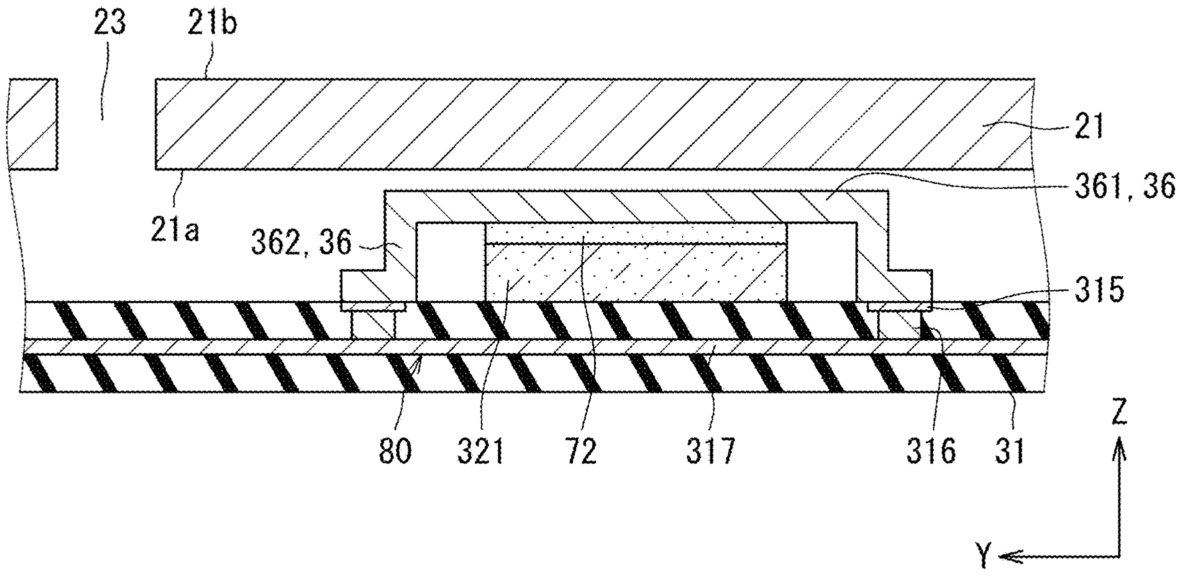
FIG. 37 is a diagram illustrating a modification.

As illustrated in FIG. 37, the TIM 72 may be disposed only between the top wall 361 of the shield cover 36 and the electronic component 321. This structure allows the heat of the electronic component 321 to be transferred to the TIM 72, the shield cover 36, and the circuit board 30. The circuit board 30 is fixed to the cooling plate 21, and the heat of the electronic component 321 is transferred to the cooling plate 21 through the circuit board 30. The heat of the electronic component 321 can be dissipated from its opposite surfaces. Thus, the heat dissipation of the electronic component 321 can be improved while influence of noise is suppressed. FIGS. 36 and 37 each illustrate a modification. FIGS. 36 and 37 each illustrate only the periphery of the electronic component 321 in the electronic device 10.

Although the example has been described in which the electronic device 10 includes the two circuit boards 40 (401, 402), the present disclosure is not limited thereto. Only one circuit board 40 may be provided, or three or more circuit boards may be provided. For example, when there is one circuit board 40, only one through-hole 23 may be provided.

Each of the via conductors 316, 318, 416, 418 may be one via conductor, or a plurality of via conductors connected in the Z direction.

Fourth Embodiment

This embodiment is a modification based on the preceding embodiment, and the description of the preceding embodiment can be incorporated. The preceding embodiment includes the TIMs 72 located above and below the top wall 361, the TIMs 72 being separated from each other by the top wall 361. Alternatively, the TIMs 72 located above and below the top wall 361 may be connected to each other.

Figure 38:
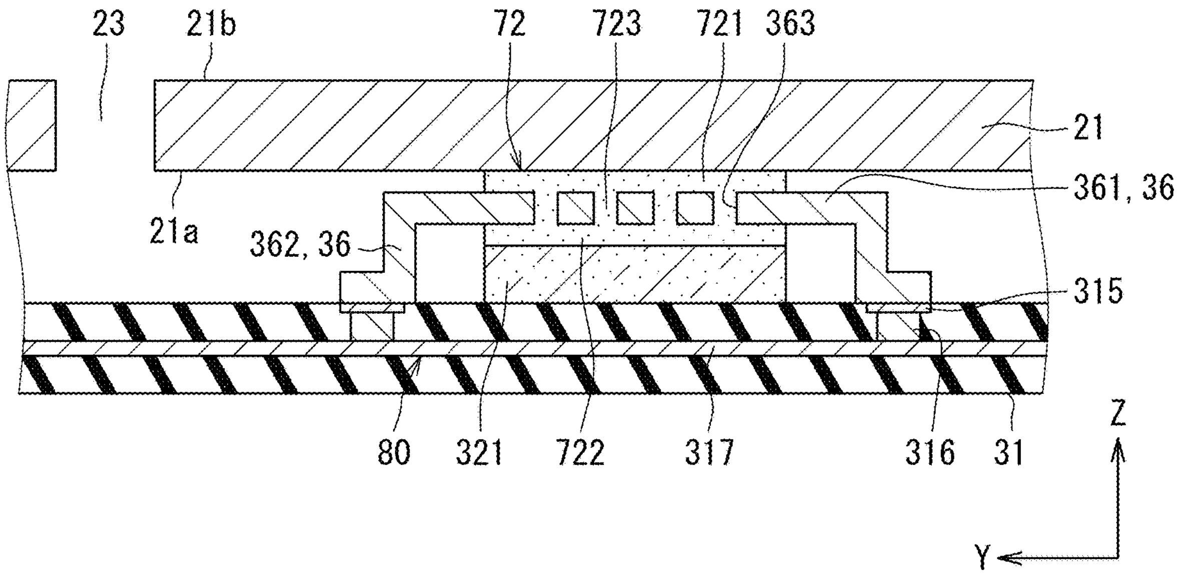
FIG. 38 is a sectional view illustrating a structure around an electronic component in an electronic device according to a fourth embodiment.

FIG. 38 is a plan view illustrating the periphery of the electronic component 321 in the electronic device 10 according to a fourth embodiment. FIG. 38 corresponds to FIGS. 36 and 37. As illustrated in FIG. 38, the shield cover 36 includes at least one communication hole 363 in the top wall 361. The communication hole 363 passes through the top wall 361. The communication hole 363 has a diameter equal to or less than ½ wavelength of a frequency of noise to be blocked. The diameter is more preferably equal to or less than ¼ wavelength of the frequency of the noise to be blocked. The shield cover 36 in the electronic device 10 illustrated includes a plurality of communication holes 363.

The TIM 72 (heat conducting member) interposed between the electronic component 321 and the cooling plate 21 includes a first heat conductor 721, a second heat conductor 722, and a communication part 723. The first heat conductor 721 is interposed between the top wall 361 and the cooling plate 21 while being in contact with the top wall 361 and the cooling plate 21. The second heat conductor 722 is interposed between the top wall 361 and the electronic component 321 while being in contact with the top wall 361 and the electronic component 321. The communication part 723 is disposed in the communication hole 363. The communication part 723 is connected at one end to the first heat conductor 721, and at the other end to the second heat conductor 722. Other configurations are similar to those described in the preceding embodiment.

Summary of Fourth Embodiment

According to the present embodiment, the top wall 361 of the shield cover 36 is provided with the communication hole 363 to integrally connect the TIMs 72 positioned above and below the top wall 361 to each other. As a result, some of heat generated by the electronic component 321 is transferred from the second heat conductor 722 to the first heat conductor 721 through the communication part 723. Heat dissipation can be improved by suppressing loss due to thermal resistance at an interface between the shield cover 36 and the TIM 72. The communication part 723 disposed in the communication hole 363 also functions as an anchor for displacement in the Z direction, so that positional displacement of the TIM 72 due to vibration, for example, can be suppressed.

The communication hole 363 has a diameter set to equal to or less than ½ wavelength of the frequency of the noise to be blocked, so that the effect described in the preceding embodiment can be achieved. For example, noise generated by the electronic components 321, 322 can be restricted from affecting the circuit board 40, particularly the electronic component 421 (SoC) and the electronic component 422 (memory) through the through-hole 23. The configuration described above is not limited for the circuit board 30, the configuration being capable of restricting noise generated by the electronic components 421, 422 from affecting the circuit board 30, particularly the electronic components 321, 322, through the through-hole 23. A similar configuration may be applied for the circuit board 40. For example, the top wall 461 of the shield cover 46 may be provided with a communication hole, and the TIM 72 interposed between the electronic component 421 and the cooling plate 21 may include the first heat conductor 721, the second heat conductor 722, and the communication part 723.

Fifth Embodiment

This embodiment is a modification based on the preceding embodiment, and the description of the preceding embodiment can be incorporated. The top wall 361 in the preceding embodiment is provided with the communication hole 363. Alternatively, a side wall 362 may be provided with an opening.

Figure 39:
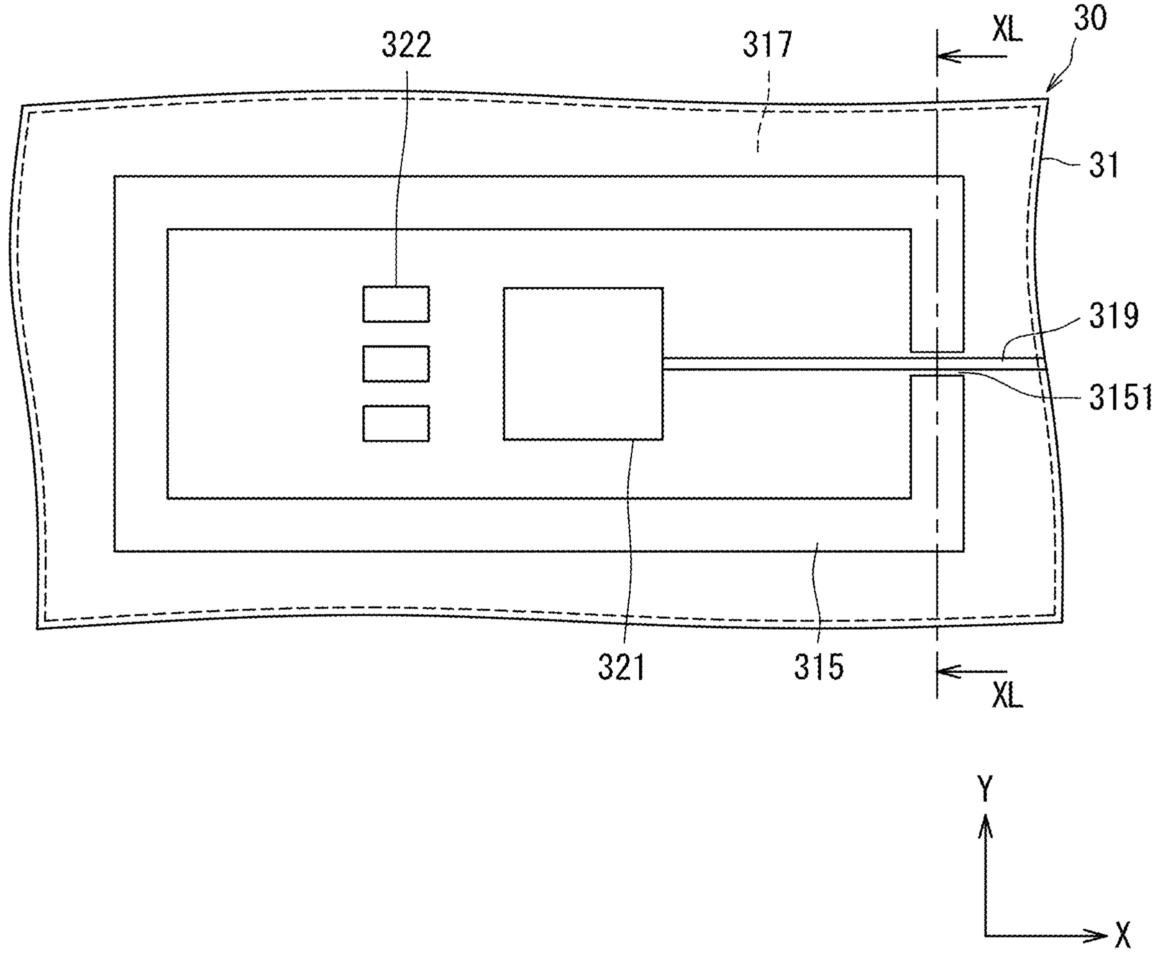
FIG. 39 is a plan view illustrating a positional relationship between surface layer wiring and a land constituting an electromagnetic shield body in an electronic device according to a fifth embodiment.
Figure 40:
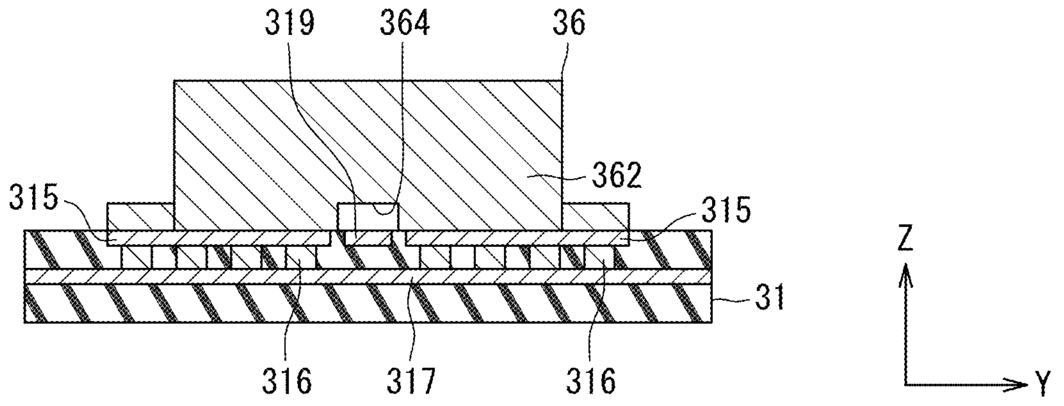
FIG. 40 is a sectional view taken along line XL-XL illustrated in FIG. 39.

FIG. 39 illustrates a positional relationship between surface layer wiring and a land constituting an electromagnetic shield body in an electronic device 10 according to a fifth embodiment. FIG. 40 is a sectional view taken along line XL-XL illustrated in FIG. 39. The present embodiment also does not show a solder resist of a circuit board 30.

As illustrated in FIG. 39, a land 315 to be connected to a shield cover 36 has a substantially C shape in plan view. The land 315 includes a gap 3151. The gap 3151 has a width set to equal to or less than ½ wavelength, more preferably equal to or less than ¼ wavelength, of a frequency of noise to be blocked. A printed circuit board 31 is provided on its surface with a surface layer wiring 319, the surface facing a cooling plate 21. The surface layer wiring 319 is electrically connected to a first electronic component, such as an electronic component 321. The surface layer wiring 319 is pulled out of the land 315 through the gap 3151.

The shield cover 36 includes the side wall 362 provided with an opening 364. The opening 364 is provided at a lower end of the side wall 362 and passes through the side wall 362. The opening 364 is provided at a position overlapping the gap 3151 of the land 315 in plan view. The opening 364 is provided at a position overlapping the surface layer wiring 319 in plan view. The opening 364 is provided to secure insulation of the surface layer wiring 319 from the shield cover 36. The opening 364 has a size set to equal to or less than ½ wavelength, more preferably equal to or less than ¼ wavelength, of the frequency of the noise to be blocked. Other configurations are similar to those described in the preceding embodiment.

Summary of Fifth Embodiment

According to the present embodiment, the opening 364 is provided in the side wall 362 of the shield cover 36, and the surface layer wiring 319 connected to the electronic component 321 is pulled out of the electromagnetic shield body 80 through a part immediately below the opening 364 in the printed circuit board 31. This configuration enables improvement in degree of freedom in wiring.

The opening 364 has a size set to equal to or less than ½ wavelength of the frequency of the noise to be blocked, so that the effect described in the preceding embodiment can be achieved. For example, noise generated by electronic components 321, 322 can be restricted from affecting a circuit board 40, particularly an electronic component 421 (SoC) and an electronic component 422 (memory) through a through-hole 23. Additionally, noise generated by the electronic components 421, 422 can be restricted from affecting the circuit board 30, particularly the electronic components 321, 322 through the through-hole 23. That is, the degree of freedom in wiring can be improved while influence of noise is suppressed between the circuit boards 30, 40.

As long as a solder resist (not illustrated) covering the surface layer wiring 319 can secure electrical insulation, the land 315 may be provided with the gap 3151 without providing the opening 364 in the side wall 362.

Sixth Embodiment

This embodiment is a modification based on the preceding embodiment, and the description of the preceding embodiment can be incorporated. The shield cover 36 mounted on the printed circuit board 31 in the preceding embodiment is used as the electromagnetic shield body 80. Alternatively, a shield wall in a tubular shape may be used.

Figure 41:
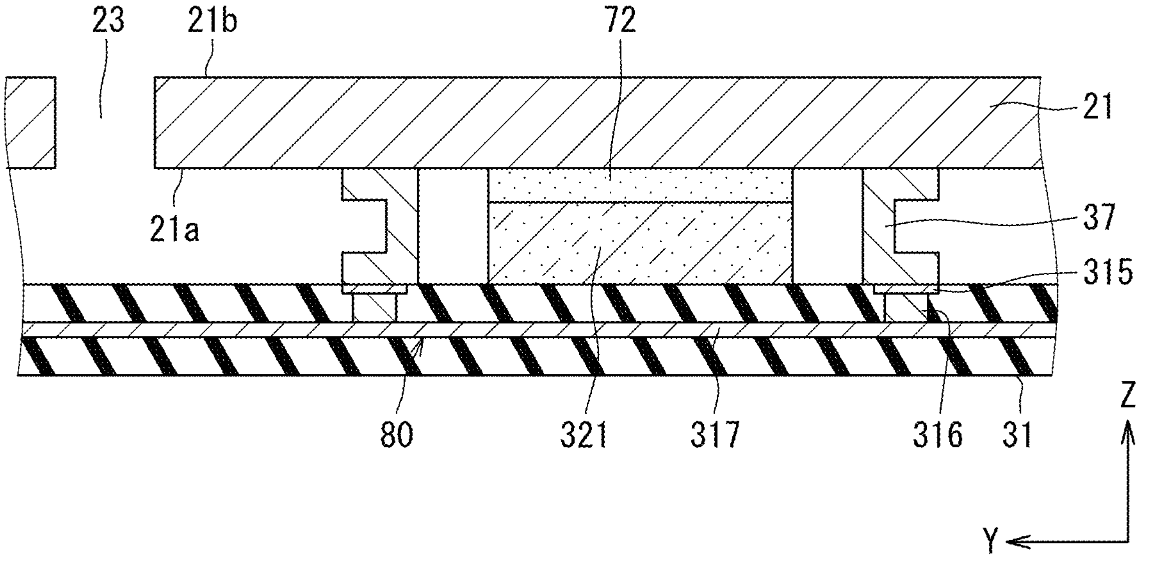
FIG. 41 is a sectional view illustrating a structure around an electronic component in an electronic device according to a sixth embodiment.

FIG. 41 is a plan view illustrating a periphery of an electronic component 321 in an electronic device 10 according to a sixth embodiment. FIG. 41 corresponds to FIG. 38. As illustrated in FIG. 41, a shield wall 37 is mounted on a surface of a printed circuit board 31 instead of the shield cover 36, the surface facing a cooling plate 21. The shield wall 37 surrounds an electronic component 32 disposed in a central region, such as the electronic component 321, in plan view. The shield wall 37 surrounds the electronic component 32 that generates noise and/or is affected by noise. The shield wall 37 has a tubular shape, for example. The shield wall 37 is connected at its lower end to a land 315 by solder bonding, for example. The shield wall 37 is electrically connected at its upper end to the cooling plate 21. The gasket 71 described above may be interposed to electrically connect the shield wall 37 to the cooling plate 21. Other configurations are similar to those described in the preceding embodiment.

Summary of Sixth Embodiment

According to the present embodiment, an electromagnetic shield body 80 includes the cooling plate 21, the shield wall 37, the land 315, a via conductor 316, and a ground layer 317. A through-hole 23 is provided outside the shield wall 37 in plan view. Thus, an effect equivalent to that of the configuration described in the preceding embodiment can be achieved.

Although not illustrated, the shield wall 37 may be divided into a plurality of parts in a circumferential direction, and the land 315 may be provided with a gap 3151 corresponding to a gap between the corresponding parts of the shield wall 37. The shield walls divided and adjacent to each other may have a gap therebetween set to equal to or less than ½ wavelength, more preferably equal to or less than ¼ wavelength, of a frequency of noise to be blocked. This configuration enables achieving an effect equivalent to that of the configuration described in the fifth embodiment. That is, the surface layer wiring 319 connected to the electronic component 321 can be pulled out of the electromagnetic shield body 80 through a part immediately below the gap of the shield wall 37. While influence of noise is suppressed between circuit boards 30, 40, a degree of freedom in wiring can be improved.

OTHER EMBODIMENTS

The disclosure in this description, drawings, and the like is not limited to the embodiments illustrated. The disclosure includes the embodiments illustrated and variations conceived by those skilled in the art based on the embodiments. For example, the disclosure is not limited to combinations of parts and/or elements shown in the embodiments. The disclosure can be implemented by various combinations. The disclosure can have additional parts that can be added to the embodiments. The disclosure includes configurations in which parts and/or elements of the embodiments are eliminated. The disclosure includes replacement or combination of parts and/or elements between one embodiment and another embodiment. The disclosed technical scopes are not limited to the description of the embodiments. Some of the disclosed technical scopes are indicated by the description of the scope of claims, and should be further understood to include meanings equivalent to the description of the scope of claims and all modifications within the scope.

The disclosure in the description, the drawings, and the like is not limited by the description of the scope of claims. The disclosure in the description, the drawings, and the like includes the technical idea described in the scope of claims, and further covers a wider variety of technical ideas than the technical ideas described in the scope of claims. Thus, various technical ideas can be extracted from the disclosure of the description, the drawings, and the like without being restricted by the description of the scope of claims.

When an element or a layer is referred to as being "on", "coupled", "connected", or "joined", it may be directly on, coupled, connected, or joined to another element or layer, and interposed elements or layers may be further present. In contrast, when an element is referred to as being "directly on", "directly coupled to", "directly connected to" or "directly joined to" another element or layer, no interposed element or layer is present. Other words used to describe a relationship between elements should be interpreted in a similar fashion (e.g., "between" versus "directly between", "adjacent" versus "directly adjacent", etc.). When used in this description, the term "and/or" includes any and all combinations of one or more of associated listed items. That is, description of A and/or B means at least one of A and B.

Spatially relative terms "inner", "outer", "back", "below", "low", "above", "high", and the like are used herein to facilitate description of a relationship of one element or a feature to another element or feature as illustrated. The spatially relative terms can be intended to include a different orientation of the device in use or operation in addition to the orientation illustrated in each drawing. For example, when the device in the drawing is turned over, an element described as "below" or "immediately below" another element or feature is oriented "above" the other element or feature. Thus, the term "below" can include both orientations of above and below. The device may be oriented to another direction (rotated 90 degrees or rotated to another orientation) and a spatially relative descriptor used herein interpreted accordingly.

Although an example is described in which the SoC serves as each of the electronic components 321, 421 including processors, the present disclosure is not limited to the example. As described above, a microcomputer may be used, or an MPU, a GPU, a DFP, or the like may be used. The MPU is an abbreviation for Micro-Processing Unit. The GPU is an abbreviation for Graphics Processing Unit. The DFP is an abbreviation for Data Flow Processor. The electronic components 32, 42 disposed in the regions R1, R4 may include an ASIC, an FPGA, or the like. The ASIC is an abbreviation for Application Specific Integrated Circuit. The FPGA is an abbreviation for Field-Programmable Gate Array.

The control program may be stored in a computer-readable non-transitory tangible storage medium as an instruction executed by a computer. As a storage medium of the control program, the flash memory or ROM described above may be used, or an HDD, an SSD, or the like may be used. The HDD is an abbreviation for Hard-disk Drive. The SSD is an abbreviation for Solid State Drive.

What is claimed is:

1. An electronic device comprising:

a cooling plate having one surface, a back surface opposite to the one surface in a predetermined direction, and a through-hole that is open in the one surface and the back surface;

a first circuit board disposed on the one surface to have at least one first electronic component to oppose the one surface;

a second circuit board disposed on the back surface to have at least one second electronic component to oppose the back surface;

a connector that electrically connects the first circuit board to the second circuit board through the through-hole;

a shield wall disposed adjacent to the one surface to surround the at least one first electronic component in a plan view relative to the predetermined direction; and a shield lid disposed adjacent to the one surface, wherein the first circuit board includes a ground conductor provided to surround the at least one first electronic component in the plan view to provide a reference potential, the ground conductor being electrically connected to the cooling plate through the shield wall, the through-hole is located outside the shield wall in the plan view, the shield lid is provided to enclose the ground conductor in the plan view, and electrically connected to the cooling plate through the ground conductor and the shield wall, and the at least one first electronic component is located inside an electromagnetic shield body including the cooling plate, the shield wall, the ground conductor, and the shield lid.

2. The electronic device according to claim 1, further comprising:

a back plate that presses the first circuit board against the cooling plate, wherein the back plate is disposed crossing the shield wall in the plan view, and is fixed to the cooling plate outside the shield wall.

3. The electronic device according to claim 1, wherein the shield lid is a ground layer disposed at a position farther from the one surface than a surface of the first circuit board, the surface being equipped with the at least one first electronic component.

4. The electronic device according to claim 3, wherein the ground conductor includes a land provided in a ring shape surrounding the at least one first electronic component, and a plurality of via conductors electrically connecting the land to the ground layer.

5. The electronic device according to claim 1, wherein the shield wall is provided integrally and continuously with the cooling plate.

6. The electronic device according to claim 1, wherein the first circuit board includes an SoC as the at least one first electronic component.

7. The electronic device according to claim 1, wherein the cooling plate includes a flow path through which a refrigerant flows in a region defined by the shield wall in the plan view.

8. The electronic device according to claim 1, wherein the shield wall is a first shield wall, the shield lid is a first shield lid, the ground conductor is a first ground conductor, the electronic device further comprising:

a second shield wall disposed adjacent to the back surface to surround the at least one second electronic component in the plan view; and a second shield lid disposed adjacent to the back surface, wherein the second circuit board includes a second ground conductor configured to provide a reference potential, surrounding the at least one second electronic component in the plan view, and is electrically connected to the cooling plate through the second shield wall, the through-hole is provided outside the second shield wall in the plan view, the second shield lid is provided enclosing the second ground conductor in the plan view, and is electrically connected to the cooling plate through the second ground conductor and the second shield wall, and the at least one second electronic component is disposed inside a second electromagnetic shield body including the cooling plate, the second shield wall, the second ground conductor, and the second shield lid.

9. An electronic device comprising:

a cooling plate having one surface, a back surface opposite to the one surface in a predetermined direction, and a through-hole that is open in the one surface and the back surface;

a first circuit board disposed on the one surface to have at least one first electronic component to oppose the one surface;

a second circuit board disposed on the back surface to have at least one second electronic component to oppose the back surface;

a connector that electrically connects the first circuit board to the second circuit board through the through-hole;

a shield base disposed adjacent to the one surface; and a shield cover mounted on the first circuit board to cover the at least one first electronic component, wherein the first circuit board includes a ground conductor configured to provide a reference potential, surrounding the at least one first electronic component in a plan view relative to the predetermined direction, and is electrically connected to the shield base, the shield base is provided enclosing the ground conductor in the plan view, the shield cover is electrically connected to the shield base through the ground conductor, and the at least one first electronic component is disposed inside an electromagnetic shield body including the shield base, the ground conductor, and the shield cover.

10. The electronic device according to claim 9, further comprising a heat conducting member that transfers heat generated by the at least one first electronic component.

11. The electronic device according to claim 10, wherein the shield cover includes a top wall disposed between an upper surface of the at least one first electronic component and the one surface of the cooling plate, and the heat conducting member is interposed between the top wall and the cooling plate.

12. The electronic device according to claim 11, wherein the heat conducting member is interposed between the at least one first electronic component and the top wall.

13. The electronic device according to claim 12, wherein the shield cover has a communication hole in the top wall, the communication hole having a diameter equal to or less than ½ wavelength of a frequency of noise to be blocked, and the heat conducting member includes a first heat conductor interposed between the top wall and the cooling plate, a second heat conductor interposed between the at least one first electronic component and the top wall, and a communication part disposed in the communication hole and connected to each of the first heat conductor and the second heat conductor.

14. The electronic device according to claim 10, wherein the shield cover includes a top wall disposed between an upper surface of the at least one first electronic component and the one surface of the cooling plate, and the heat conducting member is interposed between the first electronic component and the top wall.

15. The electronic device according to claim 9, wherein the shield cover includes a top wall disposed between an upper surface of the at least one first electronic component and the one surface of the cooling plate, and a side wall connected to the top wall and including a lower end electrically connected to the first circuit board, a lower end of the side wall has an opening having a diameter equal to or less than ½ wavelength of a frequency of noise to be blocked, and the first circuit board includes a surface layer wiring electrically connected to the at least one first electronic component and extended outward from the electromagnetic shield body through a part immediately below the opening.

16. The electronic device according to claim 9, further comprising: a back plate that presses the first circuit board against the cooling plate, wherein the back plate is disposed crossing the shield cover in the plan view, and is fixed to the cooling plate at a position without overlapping the shield cover.

17. The electronic device according to claim 9, wherein the shield base is a ground layer disposed at a position farther from the one surface than a surface of the first circuit board, the surface being equipped with the at least one first electronic component.

18. The electronic device according to claim 17, wherein the ground conductor includes a land provided in a ring shape surrounding the at least one first electronic component, and a plurality of via conductors electrically connecting the land to the ground layer.

19. The electronic device according to claim 9, wherein the first circuit board includes an SoC as the at least one first electronic component.

* * * * *